US010322467B2

(12) United States Patent
Hyakumura

(10) Patent No.: US 10,322,467 B2
(45) Date of Patent: Jun. 18, 2019

(54) POSITION DETECTING DEVICE AND LASER PROCESSING DEVICE

(71) Applicant: Tokyo Seimitsu Co., Ltd., Tokyo (JP)

(72) Inventor: Kazushi Hyakumura, Hachioji (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 15/662,229

(22) Filed: Jul. 27, 2017

(65) Prior Publication Data

US 2017/0320165 A1 Nov. 9, 2017

Related U.S. Application Data

(63) Continuation of application No. PCT/JP2016/052003, filed on Jan. 25, 2016.

(30) Foreign Application Priority Data

Jan. 28, 2015 (JP) .................................. 2015-014325
Jan. 28, 2015 (JP) .................................. 2015-014327

(51) Int. Cl.
B23K 26/046 (2014.01)
B23K 26/00 (2014.01)
(Continued)

(52) U.S. Cl.
CPC ........ *B23K 26/046* (2013.01); *B23K 26/0006* (2013.01); *B23K 26/032* (2013.01);
(Continued)

(58) Field of Classification Search
CPC .. B23K 26/046; B23K 26/53; B23K 26/0006; B23K 26/0342; B23K 26/0648; G01B 11/00; G01B 11/0608
(Continued)

(56) References Cited

U.S. PATENT DOCUMENTS 4,847,479 A * 7/1989 Clark .................... H01S 5/0687
250/201.1
2001/0026357 A1* 10/2001 Ota ........................ G03F 9/7049
355/53
(Continued)

FOREIGN PATENT DOCUMENTS

EP 1477860 A1 11/2004
JP 04-236307 A 8/1992
(Continued)

OTHER PUBLICATIONS

Anonymous, Third Party Observation, PCT/JP2016/052003, May 26, 2017, 8 pgs.
(Continued)

Primary Examiner — Nahida Sultana
(74) Attorney, Agent, or Firm — Morgan, Lewis & Bockius LLP

(57) ABSTRACT

A height position of a surface of a wafer can be detected accurately and stably without being affected by variation in a thin film formed on the surface of the wafer. An AF (autofocus) device irradiates the surface of the wafer W with an AF laser beam, detects reflection light thereof for each wavelength with a detection optical system. An AF signal processing unit outputs a displacement signal indicating displacement of the surface of the wafer to a control unit on the basis of a detection result of the detection optical system. Moreover, the AF device includes a focus optical system disposed in an irradiation optical path which is an optical path from the light source unit to a light converging lens. The focus optical system adjusts a light converging point of the AF laser beam in a wafer thickness direction.

9 Claims, 33 Drawing Sheets

(51) Int. Cl.

| | |
|---|---|
| *G01B 11/06* | (2006.01) |
| *B23K 26/53* | (2014.01) |
| *G01B 11/00* | (2006.01) |
| *B23K 26/03* | (2006.01) |
| *B23K 26/06* | (2014.01) |
| *H01L 21/67* | (2006.01) |
| *B23K 26/0622* | (2014.01) |
| *B23K 101/40* | (2006.01) |
| *B23K 103/00* | (2006.01) |
| *H01L 21/78* | (2006.01) |

(52) U.S. Cl.
CPC ...... *B23K 26/0622* (2015.10); *B23K 26/0648* (2013.01); *B23K 26/53* (2015.10); *G01B 11/00* (2013.01); *G01B 11/0608* (2013.01); *H01L 21/67092* (2013.01); *H01L 21/67259* (2013.01); *B23K 2101/40* (2018.08); *B23K 2103/56* (2018.08); *H01L 21/78* (2013.01)

(58) Field of Classification Search
USPC .............................. 264/400; 425/150, 174.4
See application file for complete search history.

(56) References Cited

U.S. PATENT DOCUMENTS

| | | | |
|---|---|---|---|
| 2002/0074518 A1* | 6/2002 | Jun .................... | G01B 11/0608 250/492.1 |
| 2004/0130690 A1 | 7/2004 | Koren et al. | |
| 2004/0238731 A1 | 12/2004 | Nishiyama et al. | |
| 2005/0128452 A1 | 6/2005 | Matsumoto | |
| 2008/0055588 A1 | 3/2008 | Nomaru et al. | |
| 2008/0170243 A1 | 7/2008 | Nomaru | |
| 2009/0277889 A1 | 11/2009 | Kobayashi et al. | |
| 2010/0044358 A1 | 2/2010 | Furuta et al. | |
| 2010/0276403 A1* | 11/2010 | Reitemeyer .......... | B23K 26/046 219/121.67 |
| 2011/0000898 A1* | 1/2011 | Rumsby ............... | B23K 26/032 219/121.72 |
| 2011/0133365 A1* | 6/2011 | Ushimaru ............. | B26F 1/24 264/400 |
| 2013/0200052 A1* | 8/2013 | Wittwer ............... | B23K 26/046 219/121.75 |
| 2013/0234368 A1* | 9/2013 | Rhee .................... | G03F 7/70383 264/400 |
| 2015/0276388 A1* | 10/2015 | Akita .................... | G01B 11/24 356/364 |

FOREIGN PATENT DOCUMENTS

| | | |
|---|---|---|
| JP | 10336379 A | 12/1998 |
| JP | H11-054421 A | 2/1999 |
| JP | 2003-140050 A | 5/2003 |
| JP | 2004-282017 A | 10/2004 |
| JP | 2005-302791 A | 10/2005 |
| JP | 2008-058077 A | 3/2008 |
| JP | 2008-058230 A | 3/2008 |
| JP | 2008-170366 A | 7/2008 |
| JP | 2009-152288 A | 7/2009 |
| JP | 2009-269074 A | 11/2009 |
| JP | 2010-046703 A | 3/2010 |
| JP | 2010-052014 A | 3/2010 |
| JP | 2011-110591 A | 6/2011 |

OTHER PUBLICATIONS

Anonymous, Additional Comments Submitted with Third Party Observation, PCT/JP2016/052003, May 26, 2017, 5 pgs.
Applicant's Comments on Third Party Observation, PCT/JP2016/052003, 3 pgs.
Tokyo Seimitsu Co., Ltd., International Search Report and Written Opinion, PCT/JP2016/052003, dated Apr. 12, 2016, 8 pgs.
Tokyo-Seimitsu Co., Ltd., Notification of Reasons for Rejection, JP2017-108308, dated Jun. 14, 2017, 8 pgs.
Tokyo Seimitsu Co., Ltd., Notification for the Opinion of Examination, TW105102443, dated Mar. 14, 2018, 11 gs.

\* cited by examiner

POSITION DETECTING DEVICE AND LASER PROCESSING DEVICE

CROSS-REFERENCE TO RELATED APPLICATIONS

This application is a Continuation of PCT International Application No. PCT/JP2016/052003 filed on Jan. 25, 2016, which claims priority under 35 U.S.C. § 119(a) to Japanese Patent Application Nos. 2015-014325 and 2015-014327 filed on Jan. 28, 2015. Each of the above application(s) is hereby expressly incorporated by reference, in its entirety, into the present application.

BACKGROUND OF THE INVENTION

Field of the Invention

The present invention relates to a laser dicing device which divides a wafer on which semiconductor devices, electronic components and the like are formed into individual chips.

Description of the Related Art

Conventionally, when a wafer on whose surface semiconductor devices, electronic components and the like are formed is divided into individual chips, a dicing device has been used. The dicing device forms grinding grooves in the wafer with a thin grinding stone having a thickness of approximately 30 µm and formed of fine diamond abrasive grains to cut the wafer.

In the dicing device, a thin grinding stone (hereinafter referred to as a dicing blade) is rotated at a high speed of 30000 to 60000 rpm, for example, to grind a wafer, and the wafer is completely cut (full-cut) or incompletely cut (half-cut of semi full-cut).

However, in the case of grinding or machining with this dicing blade, since the wafer is a material with high brittleness, the machining is performed in a fragile mode (fragile regime), which generates chipping on a front surface or a rear surface of the wafer. This chipping has been a factor of lowering performances of the divided chips.

Considering the problem as above, it has been proposed a technology which emits a laser beam whose light converging point is matched with an inside of the wafer to form modified regions due to multiphoton absorption inside the wafer and divides the wafer into individual chips, instead of dicing with the conventional dicing blade (see PTL 1, for example). In such technology, in order to form the modified regions inside the wafer at a certain depth from the front surface or the rear surface (laser beam irradiation surface) of the wafer, a position of the light converging point of the laser beam needs to be controlled with high accuracy by detecting a height position (position in a thickness direction) of the laser beam irradiation surface of the wafer with an autofocus mechanism.

In the technology disclosed in PTL 1, in order to uniformly form modified regions (affected layer) at a predetermined depth inside the wafer, the dicing is performed while emitting a detection laser beam (AF laser beam) to the laser beam irradiation surface of the wafer, detecting the height position of the laser beam irradiation surface of the wafer on the basis of its reflection light, and controlling a position of the light converging point of a processing laser beam (laser beam for processing) in accordance with the height position of the laser beam irradiation surface of the wafer.

Moreover, in the technology disclosed in PTL 1, light converging point position displacement means for displacing the light converging point position of the detection laser beam is provided, and the device is configured such that a distance between the light converging point position of the detection laser beam and the light converging point position of the processing laser beam can be adjusted when the modified region is to be formed at a deep position from the laser beam irradiation surface of the wafer. Therefore, since an irradiation area (spot area) of the detection laser beam emitted to the laser beam irradiation surface of the wafer can be made small, the height position of the laser beam irradiation surface of the wafer can be accurately detected without lowering a light amount per unit area of the reflection light which is the detection laser beam reflected by the laser beam irradiation surface of the wafer.

CITATION LIST

Patent Literature

PTL 1: Japanese Patent Application Laid-Open No. 2009-269074

SUMMARY OF THE INVENTION

In the technology as described above, light with a wavelength in an infrared region of 1 µm or more is mainly used for the processing laser beam for forming the modified regions inside the wafer, and light with a wavelength in a visible region is mainly used for observation light used in an observation optical system for observing a processing area. Thus, a wavelength region between the wavelength region of the processing laser beam and the wavelength region of the observation light, that is, light with the wavelength of approximately 0.6 to 1 µm is used for the detection laser beam for detecting the height position of the laser beam irradiation surface of the wafer.

Moreover, in the technology as described above, machining is generally performed by emitting the laser beam from a rear surface side opposite to the front surface (device surface) of the wafer, but various thin films (an oxide film or a nitride film, for example) are formed on the rear surface of the wafer in the machining process in some cases. Since the thin films are not formed intentionally, a film thickness of the thin films varies by each wafer. In addition, in some cases, the film thickness of the thin films largely varies by each place on the rear surface in one wafer. Thus, a reflectance of the detection laser beam may be lowered by the variation by each wafer or the variation by each place on the rear surface of one wafer, which leads to a problem that the autofocus mechanism does not function normally due to the variations. That is, the variation by each wafer and the variation by each place of a thin film formed on the rear surface of one wafer give an influence on an operation of the autofocus mechanism, which leads to a problem that detection of the height position of the wafer surface cannot be performed rapidly and stably with accuracy.

Here, similar problem may occur not only when the rear surface of the wafer W is irradiated with the laser beam, but also when the front surface (device surface) of the wafer W is irradiated with the laser beam irradiation.

The present invention has been made in view of such circumstances and aims to provide a laser dicing device which can perform detection of the height position of the laser beam irradiation surface of the wafer accurately and stably without being affected by the variation in the thin film formed on the laser beam irradiation surface of the wafer.

In order to achieve the aforementioned object, a laser dicing device according to a first aspect of the present invention includes: a table configured to hold a wafer; a processing laser light source configured to emit a processing laser beam for forming a modified region inside the wafer held by the table; a light converging lens configured to converge the processing laser beam emitted from the processing laser light source inside of the wafer; light converging lens driving means configured to displace a light converging point of the processing laser beam converged by the light converging lens in a wafer thickness direction by moving the light converging lens in an optical axis direction of the processing laser beam; height position detecting means configured to detect a height position of a laser beam irradiation surface of the wafer held by the table; and control means configured to control the light converging lens driving means based on a detection signal from the height position detecting means, wherein the height position detecting means includes: detection laser beam output means configured to output a plurality of detection laser beams with different wavelengths; optical path branching means disposed in an irradiation optical path which is an optical path from the detection laser beam output means to the light converging lens, the optical path branching means configured to branch a part of reflection light of the plurality of detection laser beams converged by the light converging lens and emitted to and reflected by the laser beam irradiation surface of the wafer; light detecting means configured to detect the reflection light of the plurality of detection laser beams branched by the optical path branching means for each wavelength; displacement signal generating means configured to output a displacement signal indicating displacement of the laser beam irradiation surface of the wafer to the control means based on light amounts of the plurality of detection laser beams detected by the light detecting means for each wavelength; and a light converging point adjustment optical system configured to adjust a light converging point of the detection laser beam in the wafer thickness direction.

A laser dicing device according to a second aspect of the present invention is configured such that, in the first aspect, the light converging point adjustment optical system is disposed on the irradiation optical path and between the optical path branching means and the light converging lens.

A laser dicing device according to a third aspect of the present invention is configured such that, in the first aspect, the light converging point adjustment optical system is disposed in a detection optical path which is an optical path from the optical path branching means to the light detecting means.

A laser dicing device according to a fourth aspect of the present invention is configured such that, in any one of aspects from the first aspect to the third aspect, the detection laser beam output means has a plurality of detection laser light sources configured to respectively output a plurality of detection laser beams, and light synthesizing means configured to synthesize the plurality of detection laser beams respectively output from the plurality of detection laser light sources, and the light detecting means has wavelength dividing means configured to divide the reflection light of the plurality of detection laser beams branched by the optical path branching means for each wavelength, and a plurality of detectors configured to respectively receive the reflection light of the plurality of detection laser beams divided by the wavelength dividing means for each wavelength.

A laser dicing device according to a fifth aspect of the present invention is configured such that, in any one of aspects from the first aspect to the third aspect, the detection laser beam output means is time-division output means configured to output the plurality of detection laser beams for each wavelength in a time-division manner, and the light detecting means is time-division detecting means configured to detect the reflection light of the plurality of detection laser beams for each wavelength in the time-division manner in synchronization with the time-division output means.

A laser dicing device according to a sixth aspect of the present invention is configured such that, in any one of aspects from the first aspect to the fifth aspect, the displacement signal generating means obtains a displacement signal based on a light amount of the detection laser beam with a wavelength at which a highest light amount is detected, among the light amounts of the plurality of detection laser beams detected by the light detecting means for each wavelength.

A laser dicing device according to a seventh aspect of the present invention is configured such that, in any one of aspects from the first aspect to the fifth aspect, the displacement signal generating means obtains a displacement signal by performing weighted addition of the light amounts of the plurality of detection laser beams detected by the light detecting means for each wavelength, in accordance with a standard determined in advance.

A laser dicing device according to an eighth aspect of the present invention is configured such that, in any one of aspects from the first aspect to the seventh aspect, the light converging point adjustment optical system has at least a positive lens and a negative lens in order from a light converging lens side, and adjusts the light converging point of the detection laser beam in a wafer thickness direction by moving the negative lens along the irradiation optical path.

A laser dicing device according to a ninth aspect of the present invention is configured such that, in any one of aspects from the first aspect to the eighth aspect, the light converging point adjustment optical system includes color aberration correcting means configured to correct color aberration in each wavelength of the reflection light of the plurality of detection laser beams.

According to the present invention, the height position of a surface of the wafer can be detected accurately and stably without being affected by variation in a thin film formed on the laser beam irradiation surface of the wafer. As a result, the modified regions can be formed with accuracy at a predetermined processing depth from the surface of the wafer.

DETAILED DESCRIPTION OF THE EMBODIMENTS

Hereinafter, embodiments of the present invention are described by referring to the attached drawings.

First Embodiment

First, a first embodiment of the present invention is described.

Figure 1:
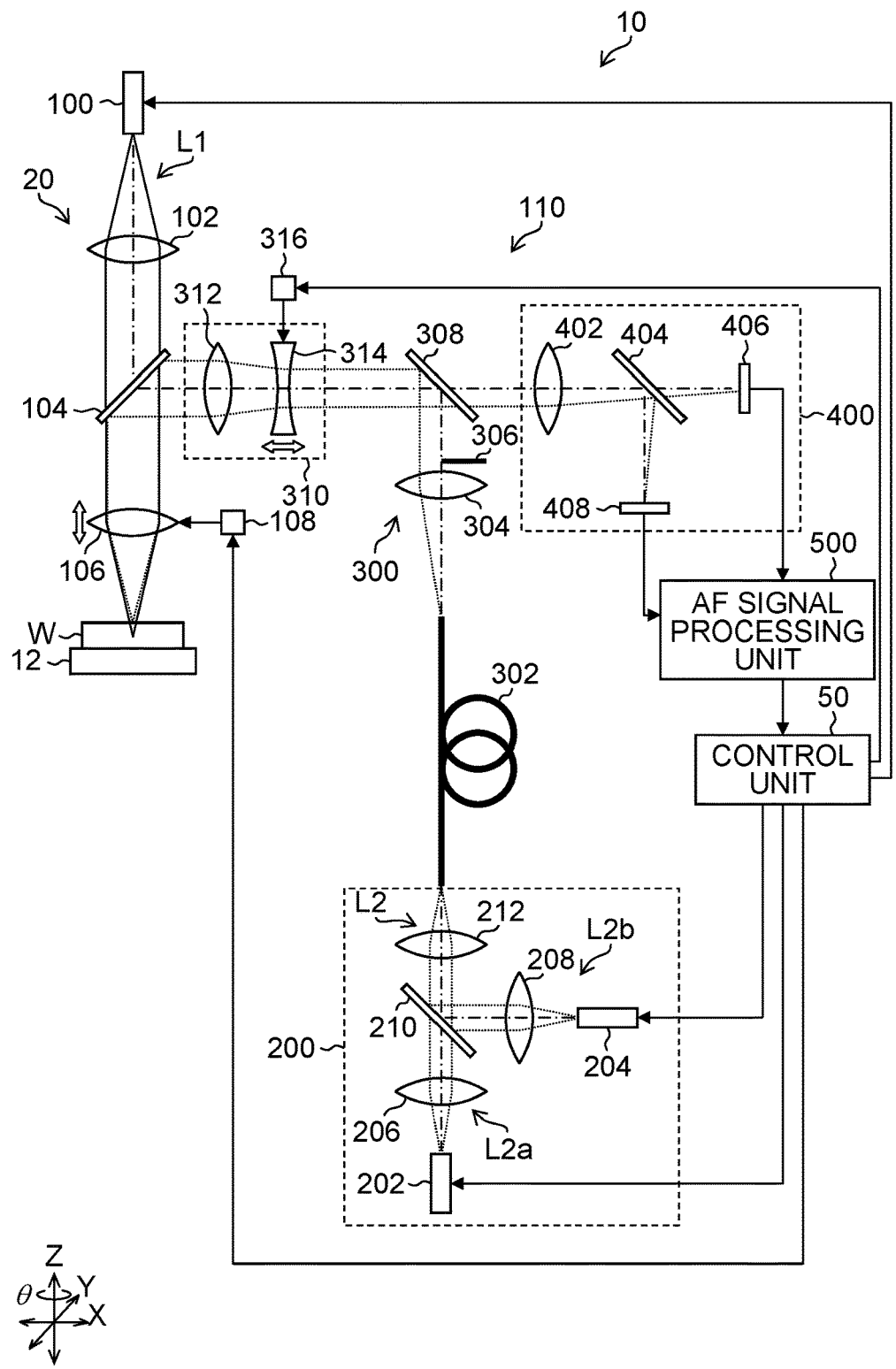
FIG. 1 is a block diagram illustrating an outline of a laser dicing device according to a first embodiment.

FIG. 1 is a block diagram illustrating an outline of a laser dicing device according to a first embodiment. As illustrated in FIG. 1, the laser dicing device 10 includes a stage 12, a laser head 20, a control unit 50 and the like.

The stage 12 is configured to be movable in XYZθ directions and suctions and holds a wafer W. The wafer W is placed on the stage 12 so that a rear surface on a side opposite to a front surface (device surface) becomes a surface (laser beam irradiation surface) to be irradiated with a laser beam. Here, the front surface of the wafer W may be the laser beam irradiation surface. The same applies to the other embodiments which will be described later.

The laser head 20 irradiates the wafer W with a processing laser beam L1 for forming a modified region inside the wafer W.

The control unit 50 includes a CPU (Central Processing Unit), a memory, an input/output circuit portion and the like and controls an operation of each part of the laser dicing device 10.

The laser dicing device 10 includes wafer conveying means (wafer conveyor), an operation panel, a Television monitor (TV monitor), a display lamp and the like, not shown, in addition to them.

On the operation panel, switches for operating the operation of each part of the laser dicing device 10 and a display device are mounted. The TV monitor displays a wafer image taken by a CCD (Charge Coupled Device) camera, not shown, or program contents, various messages and the like.

The display lamp displays an operating state of the laser dicing device 10 such as during processing, processing finished, emergency stop and the like.

Subsequently, detailed configuration of the laser head 20 is described.

As illustrated in FIG. 1, the laser head 20 includes a processing laser light source 100, a collimate lens 102, a dichroic mirror 104, a light converging lens 106, an AF device (autofocus device) 110 and the like.

The processing laser light source 100 emits a processing laser beam L1 for forming a modified region inside the wafer W. The processing laser light source 100 emits a laser beam having a pulse width of 1 μs or less and a peak power density at a light converging point of $1 \times 10^8$ (W/cm$^2$) or more, for example.

The processing laser beam L1 emitted from the processing laser light source 100 is collimated by the collimate lens 102 and transmitted by the dichroic mirror 104 and then, converged inside of the wafer W by the light converging lens (light condensing lens) 106. A Z-direction position (position in a wafer thickness direction) of the light converging point of the processing laser beam L1 is adjusted by slightly moving the light converging lens 106 with a first actuator 108 in the Z-direction (an optical axis direction of the processing laser beam L1). The first actuator 108 is an example of light converging lens driving means (converging lens actuator). Though details will be described later, driving of the first actuator 108 is controlled by the control unit 50 so that a distance between the light converging lens 106 and the laser beam irradiation surface of the wafer W is constant.

Figure 2A:
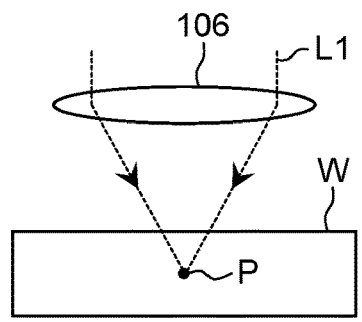
FIG. 2A is a conceptual diagram for explaining a modified region formed in a vicinity of a light converging point inside a wafer.
Figure 2B:
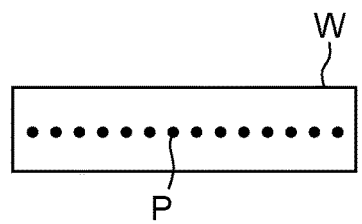
FIG. 2B is a conceptual diagram for explaining modified regions formed in the vicinity of the light converging point inside a wafer.
Figure 2C:
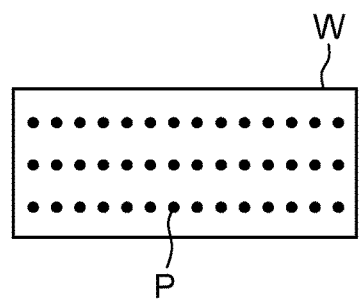
FIG. 2C is a conceptual diagram for explaining modified regions formed in the vicinity of the light converging point inside a wafer.

FIGS. 2A to 2C are conceptual diagrams for explaining the modified region formed in the vicinity of the light converging point inside the wafer. FIG. 2A illustrates a state in which the processing laser beam L1 incident inside the wafer W forms a modified region P at the light converging point, and FIG. 2B illustrates a state in which the wafer W is moved in a horizontal direction under the intermittent pulse processing laser beam L1 and discontinuous modified regions P, P, . . . are formed side by side. FIG. 2C illustrates a state in which the modified regions P are formed in multi layers inside the wafer W.

As illustrated in FIG. 2A, when the light converging point of the processing laser beam L1 incident from the laser beam irradiation surface of the wafer W is set inside of the wafer W in the thickness direction, the processing laser beam L1 having been transmitted through the laser beam irradiation surface of the wafer W has its energy concentrated at the light converging point inside the wafer W, and modified regions such as crack regions, melting regions, refraction-index change regions and the like by multiphoton absorption are formed in the vicinity of the light converging point inside the wafer W. As illustrated in FIG. 2B, by irradiating the wafer W with the intermittent pulse processing laser beam L1 so as to form a plurality of the modified regions P, P, along a dicing street, a balance of an intermolecular force is lost in the wafer W, and the wafer W naturally cleaves at the modified regions P, P, . . . as starting points or is cleaved by applying a slight external force.

Moreover, in the case of the wafer W with a large thickness, cleavage does not occur when the number of layers of the modified region P is one and thus, as illustrated in FIG. 2C, the light converging point of the processing laser beam L1 is moved in the thickness direction of the wafer W, and the modified regions P are formed in multiple layers so as to be cleaved.

In the examples illustrated in FIGS. 2B and 2C, the state is illustrated in which the discontinuous modified regions P, P, . . . are formed by the intermittent pulse processing laser beam L1, but continuous modified regions P may be formed with a continuous wave of the processing laser beam L1. When the discontinuous modified regions P are formed, they are not cleaved easily as compared with the case where the continuous modified region P is formed and thus, whether the continuous wave of the processing laser beam L1 is used or the intermittent wave is used is selected as appropriate depending on the situation such as a thickness of the wafer W, safety during conveyance and the like.

The AF device 110 irradiates the wafer W with an AF laser beam (detection laser beam) L2, receives the reflection light of the AF laser beam L2 reflected by the laser beam irradiation surface of the wafer W and detects the height position (Z-direction position) of the laser beam irradiation surface of the wafer W on the basis of the received reflection light. The AF device 110 is an example of the height position detecting means (height position detector).

The AF device 110 includes a light source unit 200 for outputting the AF laser beam L2, an irradiation optical system 300 for guiding the AF laser beam L2 output from the light source unit 200 to the light converging lens 106, a detection optical system 400 for detecting the reflection light which is the AF laser beam L2 converged by the light converging lens 106 and then reflected by the laser beam irradiation surface of the wafer W, and an AF signal processing unit 500 for generating an AF signal indicating the height position of the laser beam irradiation surface of the wafer W by using the reflection light of the AF laser beam L2 detected by the detection optical system 400.

The light source unit 200 includes a first light source 202, a second light source 204, collimate lenses 206, 208, a dichroic mirror 210, a light converging lens 212 and the like. The light source unit 200 is an example of the detection laser beam output means (detection laser beam output unit).

The first light source 202 and the second light source 204 are constituted by an LD (Laser Diode) light source, an SLD (Super Luminescent Diode) light source or the like, for example. The first light source 202 and the second light source 204 emit AF laser beams (detection laser beams) L2a and L2b having wavelengths different from each other, respectively. The AF laser beams L2a and L2b have wavelengths different from that of the processing laser beam L1 and capable of being reflected by the laser beam irradiation surface of the wafer W. That is, the AF laser beam L2a is a laser beam (red laser beam) having a wavelength of a first wavelength region (620 to 750 nm, for example), while the AF laser beam L2b is a laser beam (blue laser beam) having a wavelength of a second wavelength region (450 to 495 nm, for example) different from the first wavelength region. The first light source 202 and the second light source 204 are examples of a plurality of detection laser light sources.

The AF laser beams L2a and L2b emitted from the first light source 202 and the second light source 204 are collimated by the collimate lenses 206 and 208 and guided to the dichroic mirror 210, respectively.

The dichroic mirror 210 transmits the AF laser beam L2a, one of the AF laser beams L2a and L2b incident through the collimate lenses 206 and 208 and reflects the other AF laser beam L2b so as to guide the both light beams to the same optical path. A synthesized beam of the AF laser beams L2a and L2b led by the dichroic mirror 210 to the same optical path is converged by the light converging lens 212 and output as light source light (AF laser beam L2) from the light source unit 200. The dichroic mirror 210 is an example of light synthesizing means (light synthesizing unit).

The irradiation optical system 300 includes an optical fiber 302, a collimate lens 304, a knife edge 306, a half mirror 308, a focus optical system 310, a dichroic mirror 104 and the like.

The AF laser beam L2 (synthesized beam of the AF laser beams L2a and L2b) output from the light source unit 200 enters into an incident end of the optical fiber 302, goes through the optical fiber 302 and is emitted from an emitting end of the optical fiber 302. Moreover, this AF laser beam L2 is collimated by the collimate lens 304 and a part thereof is shielded by the knife edge 306. Then, the light having travelled without being shielded by the knife edge 306 is reflected by the half mirror 308, goes through the focus optical system 310, is reflected by the dichroic mirror 104 and is guided to the same optical path as the processing laser beam L1. Moreover, this AF laser beam L2 is converged by the light converging lens 106 and is emitted to the wafer W.

The reflection light of the AF laser beam L2 reflected by the laser beam irradiation surface of the wafer W is refracted by the light converging lens 106, reflected by the dichroic mirror 104, goes through the focus optical system 310, is transmitted by the half mirror 308 and is guided to the detection optical system 400 provided on an optical path branching from the optical path of the irradiation optical system 300.

The half mirror 308 is an example of the optical path branching means (optical path branching unit) and is disposed on the optical path (irradiation optical path) of the irradiation optical system 300. The half mirror 308 branches a part of the reflection light of the AF laser beam L2 reflected by the laser beam irradiation surface of the wafer W to the optical path (detection optical path) of the detection optical system 400 from the optical path of the irradiation optical system 300.

The detection optical system 400 includes an image forming lens 402, a dichroic mirror 404, a first detector 406, a second detector 408 and the like. The detection optical system 400 is an example of the light detecting means (light detector). The reflection light of the AF laser beam L2 incident to the detection optical system 400 is guided to the dichroic mirror 404 through the image forming lens 402.

The dichroic mirror 404 is wavelength dividing means (wavelength dividing unit) for dividing the reflection light of the AF laser beam L2 to light with a specific wavelength and light with a wavelength other than (different from) the specific wavelength. That is, in the reflection light of the AF laser beam L2, the light with a first wavelength region corresponding to the wavelength of the AF laser beam L2a emitted from the first light source 202 is transmitted by the dichroic mirror 404 and is received by the first detector 406. On the other hand, light with a second wavelength region corresponding to the wavelength of the AF laser beam L2b emitted from the second light source 204 is reflected by the dichroic mirror 404 and is received by the second detector 408.

The first detector 406 and the second detector 408 are made of bisected photodiode having bisected light receiving elements (photoelectric conversion elements) and receive converged light images of the light in division with the respective wavelength regions and output output signals (electric signals) according to respective light amounts to the AF signal processing unit 500.

The first detector 406 and the second detector 408 are arranged at positions, taking into consideration of color aberration with respect to the respective wavelength regions and are adjusted so as to indicate the same focusing position.

The AF signal processing unit 500 generates an AF signal (autofocus signal) as a displacement signal (detection signal) indicating displacement (defocus distance) in the Z-direction from the reference position of the laser beam irradiation surface of the wafer W on the basis of the output signal output from each light receiving element of at least one of the first detector 406 and the second detector 408, and outputs the generated AF signal to the control unit 50. The AF signal processing unit 500 is an example of the displacement signal generating means (displacement signal generating unit).

Here, a detection principle of the displacement of the laser beam irradiation surface of the wafer W is described.

Figure 3A:
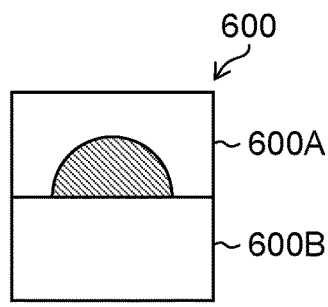
FIG. 3A is a view illustrating a state of a converged light image formed on a light receiving surface of a bisected photodiode.
Figure 3B:
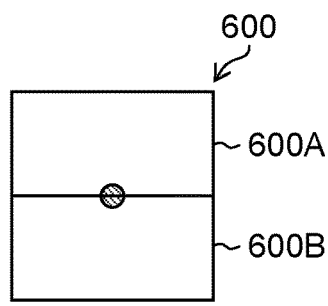
FIG. 3B is a view illustrating a state of the converged light image formed on the light receiving surface of the bisected photodiode.
Figure 3C:
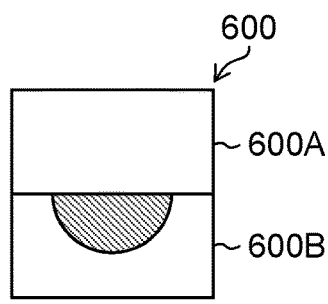
FIG. 3C is a view illustrating a state of the converged light image formed on the light receiving surface of the bisected photodiode.

FIGS. 3A to 3C are views illustrating a state of the converged light image formed on the light receiving surface of the bisected photodiode 600 constituting the detector (corresponding to the first detector 406 and the second detector 408). FIGS. 3A to 3C illustrate a state of the converged light image formed on the light receiving surface of the bisected photodiode 600 when the laser beam irradiation surface of the wafer W is at positions indicated by h1, h2, and h3, respectively, in FIG. 4.

First, when the laser beam irradiation surface of the wafer W is at the position of the h2 (see FIG. 4), that is, when the laser beam irradiation surface of the wafer W matches the light converging point of the AF laser beam L2, as illustrated in FIG. 3B, a sharp image (true circle) is formed at a center on the light receiving surface of the bisected photodiode 600. At this time, the light amounts received by light receiving elements 600A and 600B of the bisected photodiode 600 are equal, and it can be understood that the laser beam irradiation surface of the wafer W is at a focusing position.

On the other hand, when the laser beam irradiation surface of the wafer W is at the position of h1 (see FIG. 4), that is, when the laser beam irradiation surface of the wafer W is at a position closer to the light converging lens 106 than the light converging point of the AF laser beam L2, as illustrated in FIG. 3A, a semi-circular converged light image is formed on the light receiving surface of the bisected photodiode 600 on the light receiving element 600A side. The size (blur amount) of the converged light image is changed in accordance with a distance between the wafer W and the light converging lens 106.

Moreover, when the laser beam irradiation surface of the wafer W is at the position of h3 (see FIG. 4), that is, when the laser beam irradiation surface of the wafer W is at a position far away from the light converging lens 106 than the light converging point of the AF laser beam L2, as illustrated in FIG. 3C, a semi-circular converged light image is formed on the light receiving surface of the bisected photodiode 600 on the light receiving element 600B side. The size (blur amount) of the converged light image is changed in accordance with a distance between the wafer W and the light converging lens 106.

As described above, the light amounts received by the light receiving elements 600A and 600B of the bisected photodiode 600 are changed in accordance with displacement of the laser beam irradiation surface of the wafer W. Therefore, displacement of the laser beam irradiation surface of the wafer W can be detected by using such properties.

Figure 5:
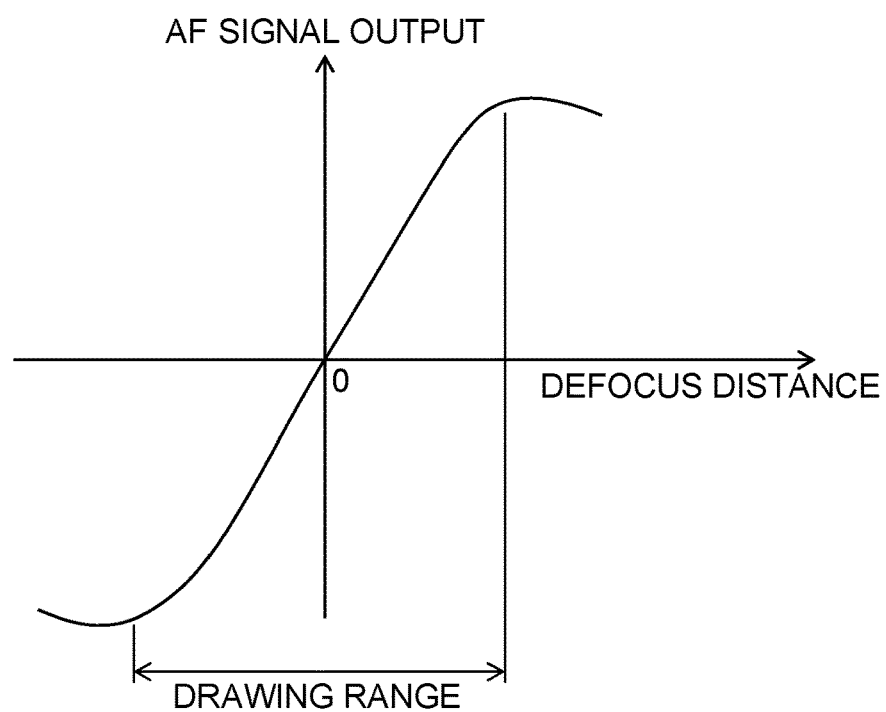
FIG. 5 is a graph illustrating an output characteristic of an AF signal.

FIG. 5 is a graph illustrating an output characteristic of the AF signal, in which a lateral axis indicates displacement (defocus distance) in the Z-direction (wafer thickness direction) from the reference position of the laser beam irradiation surface of the wafer W, while a vertical axis indicates an output value of the AF signal. It is assumed that adjustment is made in advance such that the light converging point of the AF laser beam L2 matches the reference position (origin) of the laser beam irradiation surface of the wafer W.

As illustrated in FIG. 5, the output characteristic of the AF signal is an S-shaped curve having the reference position (origin) of the laser beam irradiation surface of the wafer W as a zero cross point. Moreover, when a position of the laser beam irradiation surface of the wafer W is within a range indicated by an arrow in the figure, that is, within a measurement range (drawing range) capable of detecting displacement of the laser beam irradiation surface of the wafer W, a relationship between the displacement of the laser beam irradiation surface of the wafer W and the output of the AF signal makes a monotonically increasing curve (or a monotonically decreasing curve) passing through the origin and indicates a substantially linear change in most of it. That is, it can be understood that, if the output of the AF signal is zero, the laser beam irradiation surface of the wafer W is at the focusing position matching the light converging point of the AF laser beam L2, while if the output of the AF signal is not zero, a displacement direction and a displacement amount of the laser beam irradiation surface of the wafer W can be obtained.

The AF signal having the output characteristic as above is generated in the AF signal processing unit 500 as wafer displacement information indicating displacement in the Z-direction from the reference position of the laser beam irradiation surface of the wafer W and is output to the control unit 50.

Here, the AF signal processing unit 500 in this embodiment generates an AF signal E by using the output signal output from one of the first detector 411 and the second detector 413 which receives light with a larger total light receiving amount.

Specifically, assuming that the output signals output from the light receiving elements 600A and 600B of the bisected photodiode 600 constituting the first detector 406 are A1 and B1, respectively, while the output signals output from the light receiving elements 600A and 600B of the bisected photodiode 600 constituting the second detector 408 are A2 and B2, respectively, when a sum (A1+B1) of the output signals in the first detector 406 is equal to or larger than the sum (A2+B2) of the output signals in the second detector 408, the AF signal E is acquired in accordance with the following formula (1):

$$E=(A1-B1)/(A1+B1) \quad (1)$$

On the other hand, when the sum (A1+B1) of the output signals in the first detector 406 is less than the sum (A2+B2) of the output signals in the second detector 408, the AF signal E is acquired in accordance with the following formula (2):

$$E=(A2-B2)/(A2+B2) \quad (2)$$

That is, in the AF signal processing unit 500 in this embodiment, the detector to be used for acquiring the AF signal E is switched to one of the first detector 406 and the second detector 408 which receives light with a larger total light receiving amount. As a result, since the AF signal E is generated by always using the light with wavelength whose reflectance is higher, even if the reflectance of the AF laser beam L2 emitted to the laser beam irradiation surface of the wafer W is changed in accordance with the wavelength, the height position of the laser beam irradiation surface of the wafer W can be detected accurately and stably without being affected by variation in the thin film formed on the laser beam irradiation surface of the wafer W.

The control unit 50 controls driving of the first actuator 108 so that the distance between the light converging lens 106 and the laser beam irradiation surface of the wafer W is constant on the basis of the AF signal output from the AF signal processing unit 500. As a result, the light converging lens 106 is slightly moved in the Z-direction (wafer thickness direction) so as to follow displacement of the laser beam irradiation surface of the wafer W, and the light converging point of the processing laser beam L1 comes to be located at a certain distance (depth) from the laser beam irradiation surface of the wafer W. Therefore, a modified region can be formed at a desired position inside the wafer W. The control unit 50 is an example of the control means.

In the AF device 110 configured as above, the focus optical system 310 is disposed in the optical path of the irradiation optical system 300. Specifically, the focus optical system 310 is disposed in the optical path between the dichroic mirror 104 and the half mirror 308.

The focus optical system 310 is an example of a light converging point adjustment optical system and adjusts the light converging point of the AF laser beam L2 in the Z-direction (wafer thickness direction) independently from the light converging point of the processing laser beam L1. This focus optical system 310 is formed by a plurality of lenses including a moving lens configured to be movable at least along the optical path of the irradiation optical system 300. In this example, the focus optical system 310 includes a fixed lens (positive lens) 312 provided immovably along the optical path of the irradiation optical system 300 and a moving lens (negative lens) 314 provided to be movable along the optical path of the irradiation optical system 300 in this order from an object side (wafer W side).

A second actuator 316 moves the moving lens 314 along the optical path of the irradiation optical system 300. When the moving lens 314 moves along the optical path of the irradiation optical system 300, the Z-direction position of the light converging point of the AF laser beam L2 is changed in accordance with a moving direction and a moving amount of the moving lens 314 in a state where the Z-direction position of the light converging point of the processing laser beam L1 is fixed. That is, a relative distance between the light converging point of the processing laser beam L1 and the light converging point of the AF laser beam L2 is changed.

The control unit 50 controls driving of the second actuator 316 so that the light converging point of the AF laser beam L2 matches the laser beam irradiation surface of the wafer W (specifically, so that the output of the AF signal becomes zero) on the basis of the AF signal output from the AF signal processing unit 500.

As in this embodiment, in the configuration in which the AF laser beam L2 is guided by the dichroic mirror 104 to the same optical path as the processing laser beam L1, when a relative distance between the light converging lens 106 and the wafer W is changed in order to change a processing depth of the modified region, the light converging point of the AF laser beam L2 also changes its Z-direction position with respect to the wafer W together with the light converging point of the processing laser beam L1.

Figure 6A:
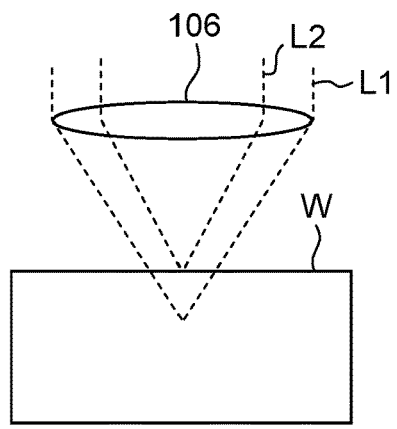
FIG. 6A is a view illustrating a state in which the light converging point of the AF laser beam changes in a wafer thickness direction.
Figure 6B:
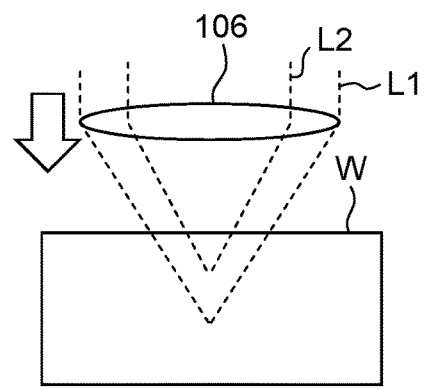
FIG. 6B is a view illustrating a state in which the light converging point of the AF laser beam changes in the wafer thickness direction.

For example, as illustrated in 6A, when the modified region is to be formed at a shallow position from the laser beam irradiation surface of the wafer W, assume that the light converging point of the AF laser beam L2 matches the laser beam irradiation surface of the wafer W. In this case, as illustrated in FIG. 6B, when the relative distance between the light converging lens 106 and the wafer W is changed in order to form the modified region at a deep position from the laser beam irradiation surface of the wafer W, the light converging point of the AF laser beam L2 is largely deviated in the Z-direction (wafer thickness direction) from the laser beam irradiation surface of the wafer W. Then, if the distance between the light converging point of the AF laser beam L2 and the laser beam irradiation surface of the wafer W exceeds a measurement range (drawing range), displacement of the laser beam irradiation surface of the wafer W cannot be detected any more. Particularly since a lens with high NA (numerical aperture) is used for the light converging lens 106, the measurement range capable of detecting the displacement of the laser beam irradiation surface of the wafer W is limited to the vicinity of the light converging point (focusing position) of the AF laser beam L2 and thus, the aforementioned problem becomes more remarkable.

In order to handle such problem, in the AF device 110 of this embodiment, the focus optical system 310 is provided on the optical path of the irradiation optical system 300 so that the position of the light converging point of the AF laser beam L2 can be changed without changing the position of the light converging point of the processing laser beam L1. As a result, even if the relative distance between the light converging lens 106 and the wafer W is changed in order to change the processing depth of the modified region from the state illustrated in FIG. 6A to the state illustrated in FIG. 6B, by moving the moving lens 314 of the focus optical system 310 along the optical path of the irradiation optical system 300 as above, the light converging point of the AF laser beam L2 can be matched with the laser beam irradiation surface of the wafer W in the state where the Z-direction position of the light converging point of the processing laser beam L1 is fixed as in the state illustrated in FIG. 6C.

Therefore, even if the processing depth of the modified region is changed, an interval between the light converging point of the processing laser beam L1 and the light converging point of the AF laser beam L2 can be adjusted. Thus, the light converging point of the AF laser beam L2 can be matched with the laser beam irradiation surface of the wafer W, and the Z-direction position (height position) of the wafer W can be accurately detected without lowering of the light amount per unit area of the reflection light of the AF laser beam L2 reflected by the laser beam irradiation surface of the wafer W.

Figure 7:
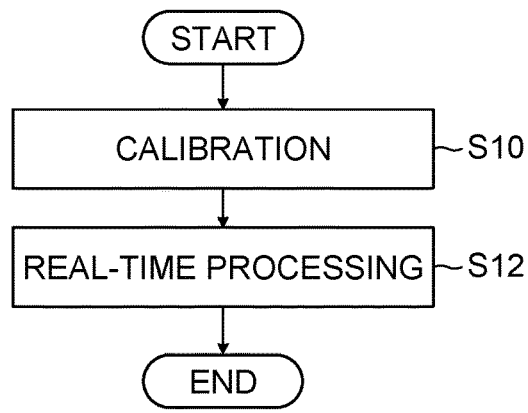
FIG. 7 is a flowchart illustrating a flow of a dicing method using a laser dicing device of the first embodiment.

Subsequently, a dicing method using the laser dicing device 10 of this embodiment is described. FIG. 7 is a flowchart illustrating a flow of a dicing method using the laser dicing device 10 of this embodiment.

As illustrated in FIG. 7, the laser dicing device 10 performs a calibration operation for measuring the output characteristic of the AF signal (Step S10) prior to a real-time processing operation which will be described later.

After the calibration operation is completed, the laser dicing device 10 performs the real-time processing operation for forming the modified region inside the wafer W while adjusting the Z-direction position of the light converging point of the processing laser beam L1 so as to follow displacement of the laser beam irradiation surface of the wafer W (Step S12).

Figure 8:
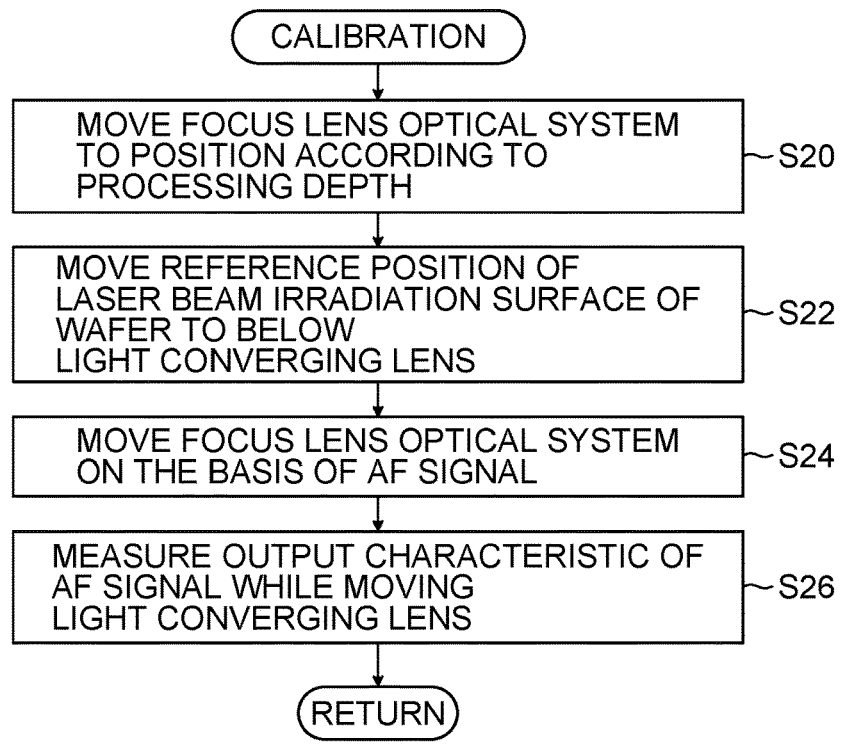
FIG. 8 is a flowchart illustrating a detailed flow of a calibration operation illustrated in FIG. 7.

FIG. 8 is a flowchart illustrating a detailed flow of the calibration operation illustrated in FIG. 7.

First, the control unit 50 controls driving of the second actuator 316 and moves the moving lens 314 of the focus optical system 310 to a position according to a processing depth of the modified region (Step S20). A correspondence relationship between the processing depth of the modified region and the position of the moving lens 314 of the focus optical system 310 is held in a memory portion (not shown) of the control unit 50.

Subsequently, the control unit 50 controls movement of the stage 12 and moves the reference position of the laser beam irradiation surface of the wafer W to immediately below the light converging lens 106 (Step S22). The reference position of the laser beam irradiation surface of the wafer W is a position to be a reference of displacement in the Z-direction of the laser beam irradiation surface of the wafer W, and at which the light converging point of the AF laser beam L2 is to be matched. Therefore, it is preferable that the reference position is located on a portion with smaller steps (smooth surface) of the laser beam irradiation surface of the wafer W. For example, a predetermined position at a center part excluding an outer peripheral part of the wafer W is set to the reference position.

Figure 6C:
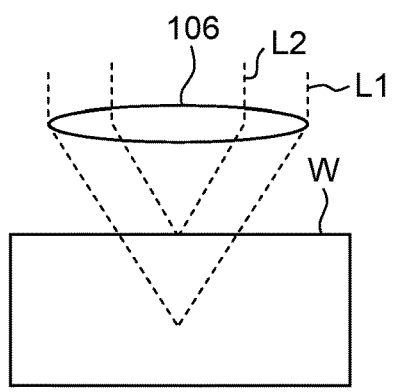
FIG. 6C is a view illustrating a state in which the light converging point of the AF laser beam changes in the wafer thickness direction.

Subsequently, the control unit 50 controls driving of the second actuator 316 and moves the moving lens 314 of the focus optical system 310 along the optical path of the irradiation optical system 300 so that the AF signal output from the AF signal processing unit 500 becomes zero (Step S24). As a result, as illustrated in FIG. 6B, even if there is deviation between the light converging point of the AF laser beam L2 and the reference position of the laser beam irradiation surface of the wafer W, as illustrated in FIG. 6C, the light converging point is adjusted so that the light converging point of the AF laser beam L2 matches the reference position of the laser beam irradiation surface of the wafer W. The control unit 50 rewrites the position of the moving lens 314 of the focus optical system 310 held in the memory portion (not shown) to a position (corrected position) of the moving lens 314 after the light converging point adjustment.

At this time, in the AF signal processing unit 500, the AF signal is generated on the basis of the output signal output from the light receiving elements 600A and 600B of the bisected photodiode 600 constituting the detector with the larger total light receiving amount in the first detector 406 and the second detector 408. Thus, the height position of the laser beam irradiation surface of the wafer W can be detected stably and accurately without being affected by variation in the thin film formed on the laser beam irradiation surface of the wafer W (variation in each of the wafer W or a place).

Subsequently, the control unit 50 controls driving of the first actuator 108, measures the output characteristic of the AF signal output from the AF signal processing unit 500 while moving the light converging lens 106 over the entire movable range along the Z-direction, and holds the output characteristic as a lookup table in the memory portion (not shown) (Step S26).

When a plurality of layers of the modified regions is to be formed inside the wafer W, the process from Step S20 to Step S26 is executed for each processing depth of the modified region.

By means of the processes described above, in the real-time processing operation at Step S12 in FIG. 7, the control unit 50 can easily acquire displacement (defocus distance) in the Z-direction from the reference position of the laser beam irradiation surface of the wafer W based on the output value of the AF signal output from the AF signal processing unit 500 by referring to the lookup table held in the memory portion (not shown) and thus, processing efficiency (throughput) in the real-time processing operation can be improved.

Figure 9:
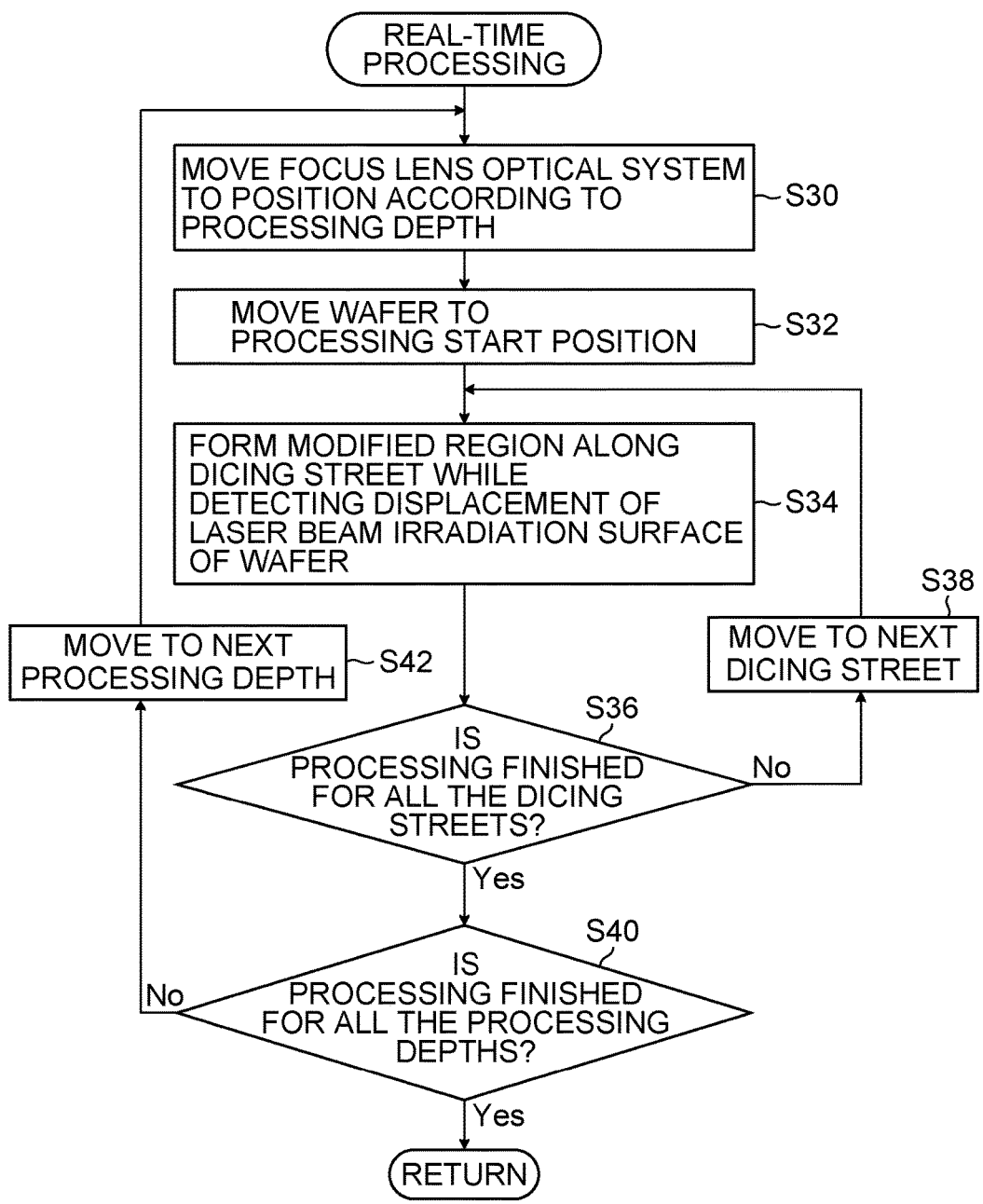
FIG. 9 is a flowchart illustrating a detailed flow of a real-time processing operation illustrated in FIG. 7.

FIG. 9 is a flowchart illustrating a detailed flow of the real-time processing operation illustrated in FIG. 7.

First, the control unit 50 controls driving of the second actuator 316 similarly at Step S20 in FIG. 8 and moves the moving lens 314 of the focus optical system 310 to a position according to the processing depth of the modified region (Step S30). At this time, the control unit 50 moves it to the position (corrected position) of the moving lens 314 held in the memory portion (not shown). As a result, the light converging point of the AF laser beam L2 matches the reference position of the laser beam irradiation surface of the wafer W, and the AF device 110 can detect displacement in the Z-direction based on the reference position of the laser beam irradiation surface of the wafer W.

Subsequently, the control unit 50 controls movement of the stage 12 and moves the wafer W which is suctioned and held on the stage 12 to a predetermined processing start position (Step S32).

Subsequently, the control unit 50 turns ON the processing laser light source 100 and then, forms modified regions inside the wafer W along the dicing street by the processing laser beam L1 emitted from the processing laser light source 100 while moving the wafer W in the horizontal direction (XY direction) (Step S34).

At this time, the control unit 50 turns ON the first light source 202 and the second light source 204 substantially at the same time or at timing prior to that when the processing laser light source 100 is turned ON. As a result, the processing laser beam L1 and the AF laser beam L2 (synthesized beam of the two AF laser beams L2a and L2b with wavelengths different from each other) are converged by the light converging lens 106 toward the wafer W. Then, the reflection light of the AF laser beam L2 emitted to and reflected by the laser beam irradiation surface of the wafer W is divided by the dichroic mirror 404 into lights with wavelengths different from each other, and the divided lights are respectively received by the first detector 406 and the second detector 408. The AF signal processing unit 500 generates the AF signal indicating displacement in the Z-direction from the reference position of the laser beam irradiation surface of the wafer W on the basis of the output signal output from the detector with the larger total light receiving amount between the first detector 406 and the second detector 408, and outputs the generated AF signal to the control unit 50.

Then, the control unit 50 forms the modified region inside the wafer W while adjusting the Z-direction position of the light converging point of the processing laser beam L1 by controlling driving of the first actuator 108 on the basis of the AF signal output from the AF signal processing unit 500.

Subsequently, the control unit 50 determines whether formation of the modified regions has been finished for all the dicing streets of the wafer W (Step S36). When formation of the modified regions for all the dicing streets has not been finished (in the case of No), it moves to the next dicing street (Step S38) and repeats processes from Step S34 to step S36 for the dicing street. On the other hand, when formation of the modified regions for all the dicing streets has been finished (in the case of Yes), the next Step S40 is performed.

Subsequently, the control unit 50 determines whether formation of the modified regions has been finished for all the processing depths (Step S40). When formation of the modified regions has not been finished for all the processing depths, the processing is moved to the next processing depth (Step S42), and the processes from Step S30 to Step S40 is repeated. On the other hand, when formation of the modified regions has been finished for all the processing depths, the real-time processing operation is finished.

As described above, by forming the modified regions at a desired position inside the wafer, the wafer W can be divided into a plurality of chips using the modified regions as starting points.

Figure 10:
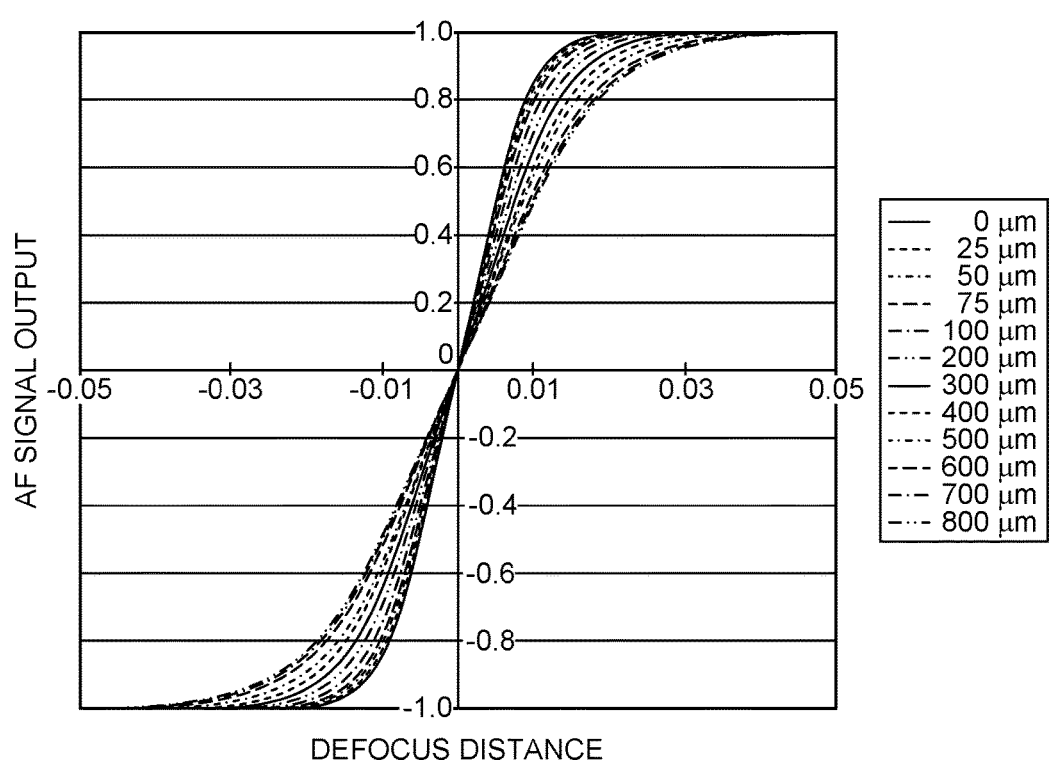
FIG. 10 is a view illustrating an example of the output characteristic of the AF signal in the first embodiment.

FIG. 10 is a view illustrating an example of an output characteristic of the AF signal in the first embodiment and illustrates the output characteristic when the processing depth of the modified region is changed within a range of 0 to 800 µm.

In this embodiment, since the Z-direction position of the light converging point of the AF laser beam L2 is adjusted so as to match the reference position of the laser beam irradiation surface of the wafer W in accordance with the processing depth of the modified region, the output characteristics of the AF signals corresponding to respective processing depths are substantially uniform and show S-shaped curves with the reference position (origin) of the laser beam irradiation surface of the wafer W as a zero cross point as illustrated in FIG. 10. Therefore, by performing the real-time processing operation by using the AF signal having such output characteristics, displacement of the laser beam irradiation surface of the wafer W can be detected stably and with high accuracy without being affected by a change in the processing depth of the modified region.

As described above, in this embodiment, since the height position of the laser beam irradiation surface of the wafer W is detected by using the two AF laser beams L2a and L2b with wavelengths different from each other, the height position of the laser beam irradiation surface of the wafer W can be detected stably and with accuracy without being affected by variation in the thin film formed on the laser beam irradiation surface of the wafer W.

Moreover, in this embodiment, on the optical path of the irradiation optical system 300 for guiding the AF laser beam L2 to the light converging lens 106, between the dichroic mirror 104 and the half mirror 308, the focus optical system 310 is provided as a light converging point adjustment optical system for adjusting the light converging point of the AF laser beam L2 in the Z-direction (wafer thickness direction). Thus, even if the relative distance between the light converging lens 106 and the wafer W is changed with a change in the processing depth of the modified region, the light converging point of the AF laser beam L2 can be adjusted so as to match the laser beam irradiation surface of the wafer W and thus, the modified region can be formed with accuracy at a predetermined processing depth from the laser beam irradiation surface of the wafer.

Moreover, in this embodiment, it has been found as the result of keen examination by the inventor that there is correlation between an optical distance between the light converging lens 106 and the focus optical system 310, the focus drawing range, and a focus sensitivity, and this optical distance needs to be held in a certain range in order to obtain a favorable result. Specifically, when an optical distance D between an exit pupil of the light converging lens 106 and the fixed lens (positive lens) 312 of the focus optical system 310 is too long, variation in the output characteristics of the AF signal for each processing depth becomes large and thus, the optical distance D is preferably 120 mm or less.

Figure 11:
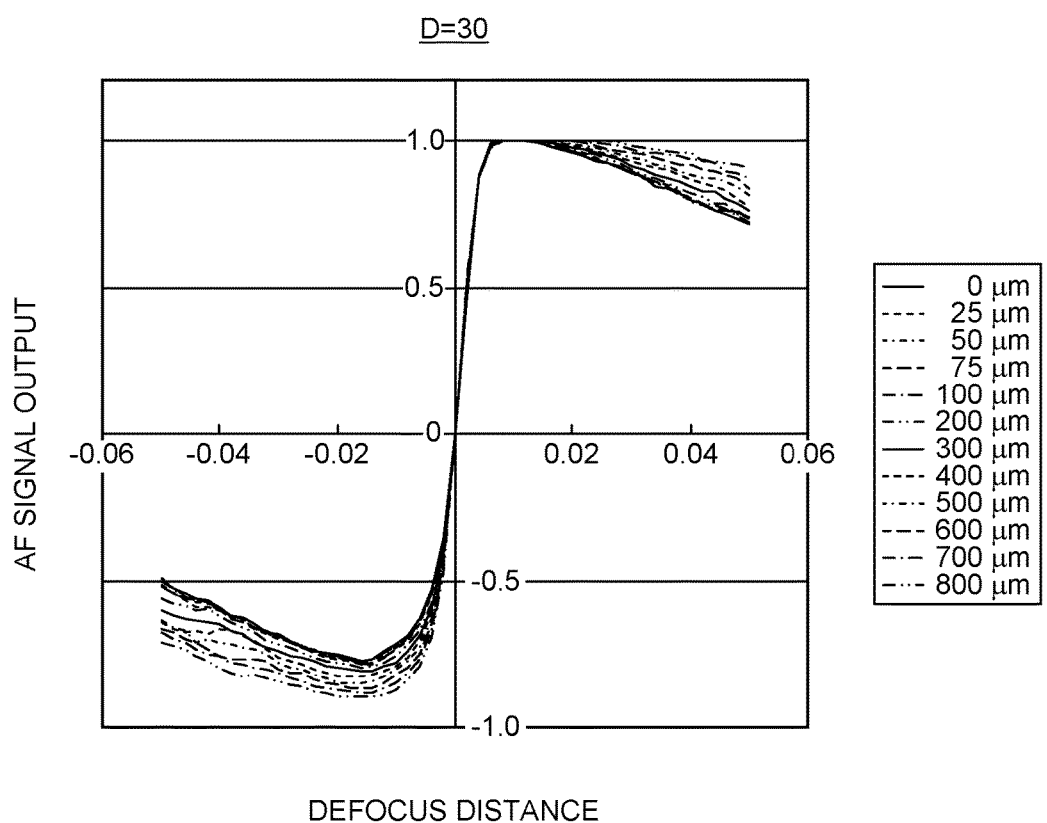
FIG. 11 is a view illustrating an evaluation result by simulation (output characteristic of the AF signal for each processing depth).
Figure 12:
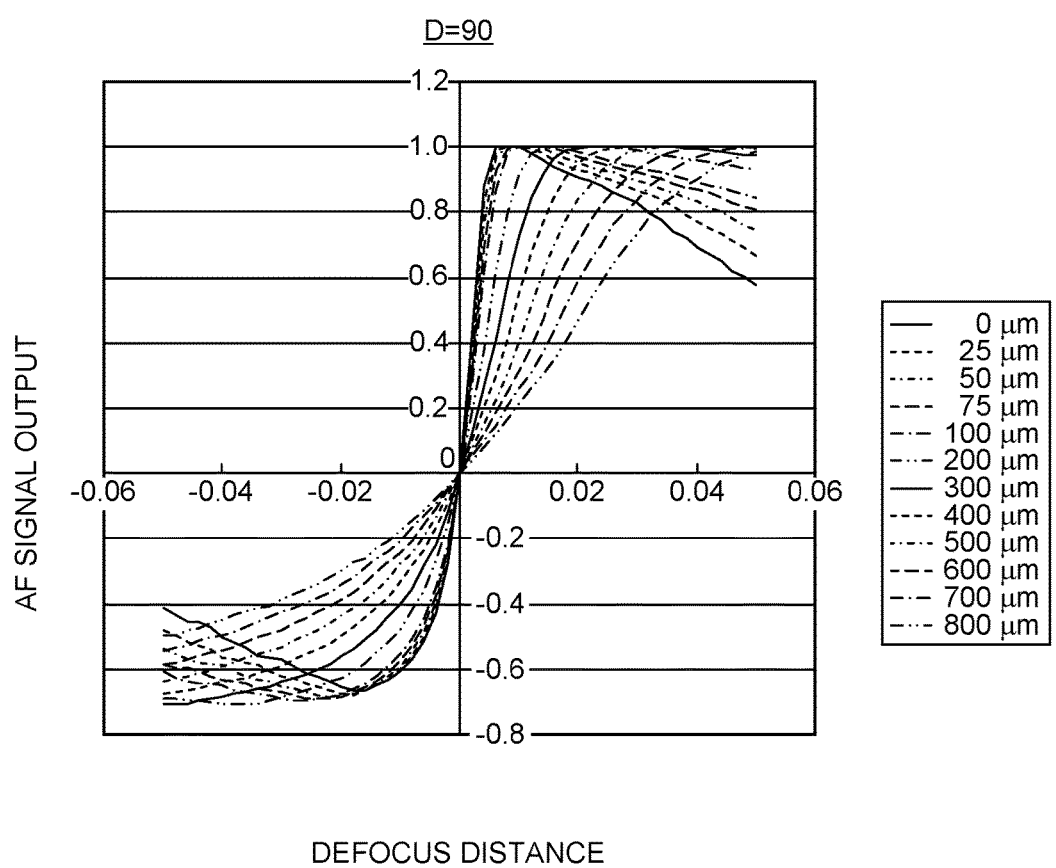
FIG. 12 is a view illustrating the evaluation result by simulation (output characteristic of the AF signal for each processing depth).

Here, simulation was performed by using a model substantially equivalent to the laser dicing device 10 of this embodiment described above, and a change of the output characteristics (AF characteristics) of the AF signal for each processing depth when the optical distance D is changed was evaluated, and the result is described by referring to FIGS. 11 and 12.

FIGS. 11 and 12 illustrate the output characteristics of the AF signal for each processing depth when the optical distance D is set to a predetermined value, respectively. It is assumed that a unit of D is mm (hereinafter, the same applies to the following).

FIG. 11 is a case of D=30, and FIG. 12 is a case of D=90. As illustrated in these figures, as the optical distance D becomes larger, the focus drawing range (focus setting range) becomes wider, but inclination (inclination of a substantially linear portion showing a proportional relationship centered on a focusing position (that is, a defocus distance=0)) of a curve of the output characteristic of the AF signal becomes gentle, and the focus sensitivity tends to lower. Moreover, variation in the output characteristics of the AF signal for each processing depth becomes large.

Therefore, the optical distance D between the exit pupil of the light converging lens 106 and the fixed lens 312 of the focus optical system 310 is preferably 120 mm or less. Thereby, it is possible to obtain high focus sensitivity, a wide focus drawing range, and stable AF characteristics regardless of the processing depth.

Moreover, in this embodiment, the focus optical system 310 includes the fixed lens (positive lens) 312 and the moving lens (negative lens) 314. A focal distance of the fixed lens 312 is preferably 20 mm or more and 80 mm or less. If the focal distance of the fixed lens 312 is too long, the movement amount of the moving lens 314 becomes too large. Moreover, if the focal distance of the fixed lens 312 is too short, variation in the output characteristic of the AF signal for each processing depth becomes large. Therefore, considering these points, the focal distance of the fixed lens 312 is preferably within the aforementioned range, and the moving amount of the moving lens 314 can be reduced, and variation in the output characteristic of the AF signal for each processing depth can be made small.

Moreover, in this embodiment, a difference between the focal distance (absolute value) of the fixed lens 312 and the focal distance (absolute value) of the moving lens 314 is preferably 2 mm or more and 15 mm or less. If the difference in the focal distance between the fixed lens 312 and the moving lens 314 is smaller than 2 mm, the distance between the fixed lens 312 and the moving lens 314 becomes too short when the light converging point of the AF laser beam L2 is adjusted to the laser beam irradiation surface of the wafer W. This makes it difficult to configure the focus optical system 310. On the other hand, if this difference in the focal distance is too large, the focal distance of the moving lens 314 becomes small, which is not desirable from a viewpoint of aberration. Considering these points, the difference between the focal distance (absolute value) of the fixed lens 312 and the focal distance (absolute value) of the moving lens 314 is preferably 2 mm or more and 15 mm or less, whereby the focus optical system 310 can be constituted easily, and occurrence of aberration can be suppressed.

Moreover, in this embodiment, a diameter (spot diameter) N of the converged light image (pinhole image) of the AF laser beam L2 converged by the light converging lens 106 and emitted to the laser beam irradiation surface of the wafer W is preferably 5 μm or more and 50 μm or less.

Figure 13:
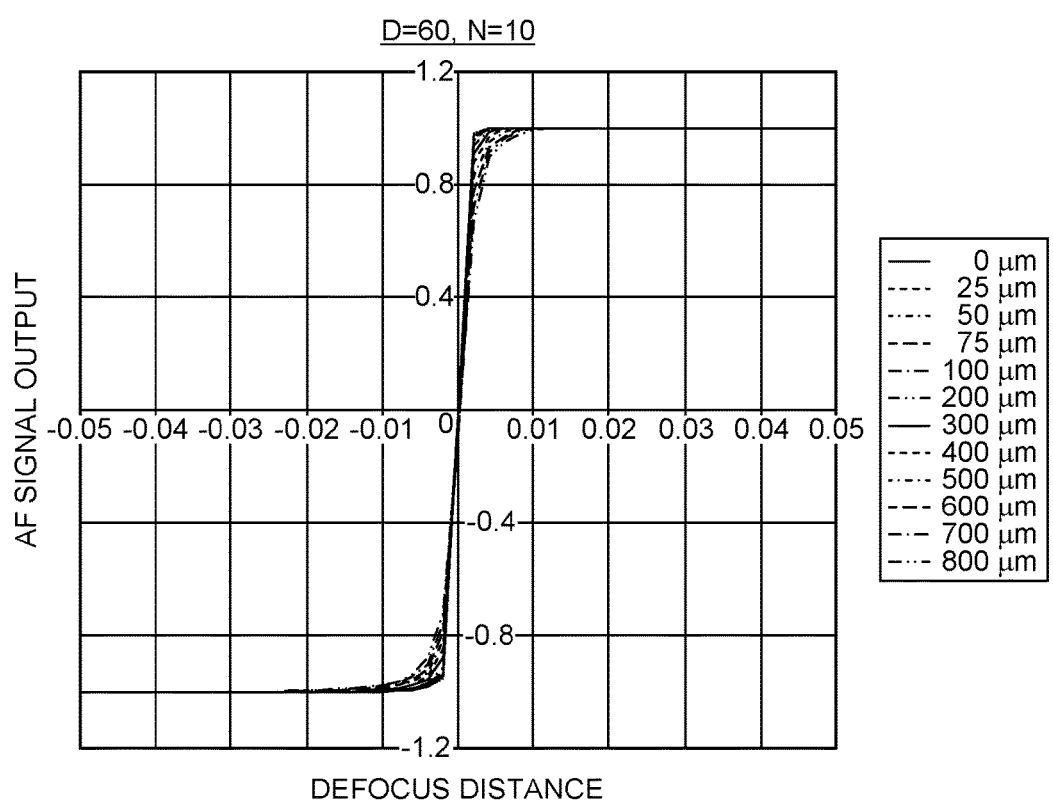
FIG. 13 is a view illustrating the evaluation result by simulation (output characteristic of the AF signal for each processing depth).
Figure 14:
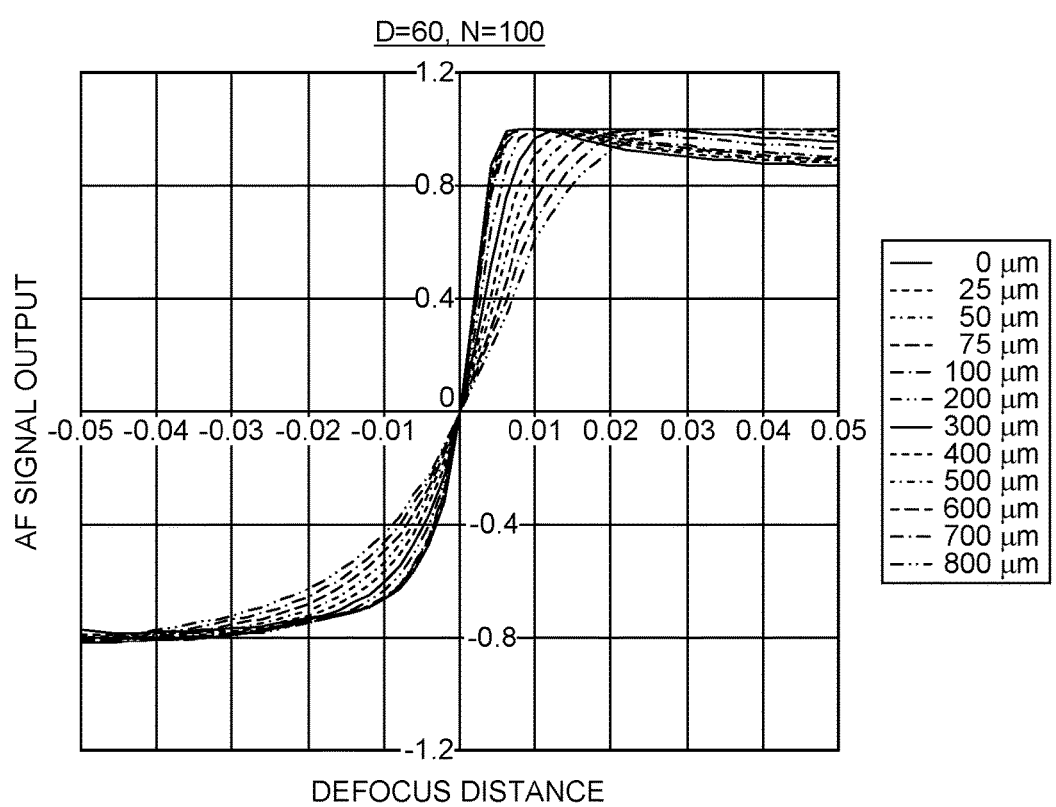
FIG. 14 is a view illustrating the evaluation result by simulation (output characteristic of the AF signal for each processing depth).
Figure 15:
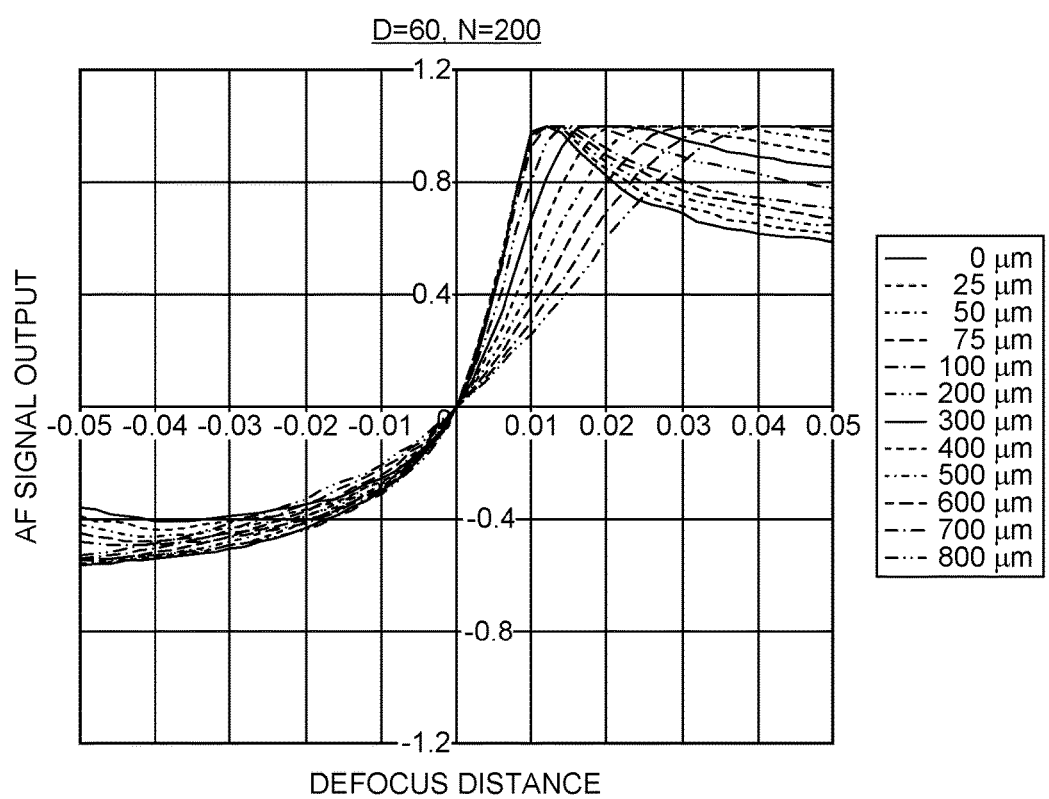
FIG. 15 is a view illustrating the evaluation result by simulation (output characteristic of the AF signal for each processing depth).

Here, simulation was performed by using a model substantially equivalent to the laser dicing device 10 of this embodiment described above, and a change of the AF characteristics for each processing depth when the spot diameter N was changed was evaluated, and the result is described by referring to FIGS. 13 to 15.

FIGS. 13 to 15 illustrate the output characteristics of the AF signal for each processing depth when the spot diameter N was set to a predetermined value, respectively. It is assumed that a unit of N is μm. The optical distance D was set to 60 mm.

FIG. 13 is a view illustrating the output characteristic of the AF signal in the case of N=10. As illustrated in FIG. 13, in the case of N=10, the curve of the output characteristic of the AF signal rapidly changes in the vicinity of the focusing position (defocus distance=0) and shows a substantially constant value other than the focusing position.

FIG. 14 is a view illustrating the output characteristic of the AF signal in the case of N=100. As illustrated in FIG. 14, in the case of N=100, the change of the curve of the output characteristic of the AF signal in the vicinity of the focusing position is gentler than the case of N=10 (see FIG. 13). From this fact, it can be understood that the spot diameter N should be made larger in order to enlarge the focus drawing range.

FIG. 15 is a view illustrating the output characteristic of the AF signal in the case of N=200. As illustrated in FIG. 15, in the case of N=200, amplitude of the curve of the output characteristic of the AF signal decreases, and a phenomenon that an inflection point is generated in the curve occurs. Moreover, the deeper the processing depth of the modified region is, the gentler the inclination (inclination of the substantially linear portion showing a proportional relationship centered on the focusing position) of the curve of the output characteristic of the AF signal becomes, which leads to a problem of lowering of the focus sensitivity.

As can be understood from these results, the spot diameter N is preferably 5 μm or more and 50 μm or less, and it is possible to obtain high focus sensitivity, a wide focus drawing range, and stable AF characteristics regardless of the processing depth.

In this embodiment as described above, by setting the optical distance between the exit pupil of the light converging lens 106 and the focus optical system 310 and the diameter (spot diameter) of the converged light image of the AF laser beam L2 by the light converging lens 106 in desired ranges, it is possible to obtain high focus sensitivity, a wide focus drawing range, and stable AF characteristics regardless of the processing depth. Therefore, the height position of the laser beam irradiation surface of the wafer W can be detected rapidly, accurately, and stably regardless of the processing depth of the modified region. As a result, even if there is variation in the laser beam irradiation surface of the wafer W, the modified region can be formed with accuracy at a predetermined processing depth from the laser beam irradiation surface of the wafer W.

In this embodiment, the output signal output from one of the first detector 411 and the second detector 413 which receives light with the larger total light receiving amount between is used. However, the embodiment should not be limited to this, and the AF signal may be obtained by performing weighted addition of the light amounts respectively received by the first detector 406 and the second detector 408, in accordance with a standard determined in advance. For example, assuming that the light amount received by the first detector 406 is S1 and the light amount received by the second detector 408 is S2, results obtained by multiplying weighting factors α and β (where α, β>0) with S1 and S2, respectively, and adding the results of the multiplication may be used as the AF signal. Moreover, the results obtained by respectively squaring S1 and S2 and adding the squares (second powers) may be used as the AF signal. Or other weighting methods may be used.

Figure 16:
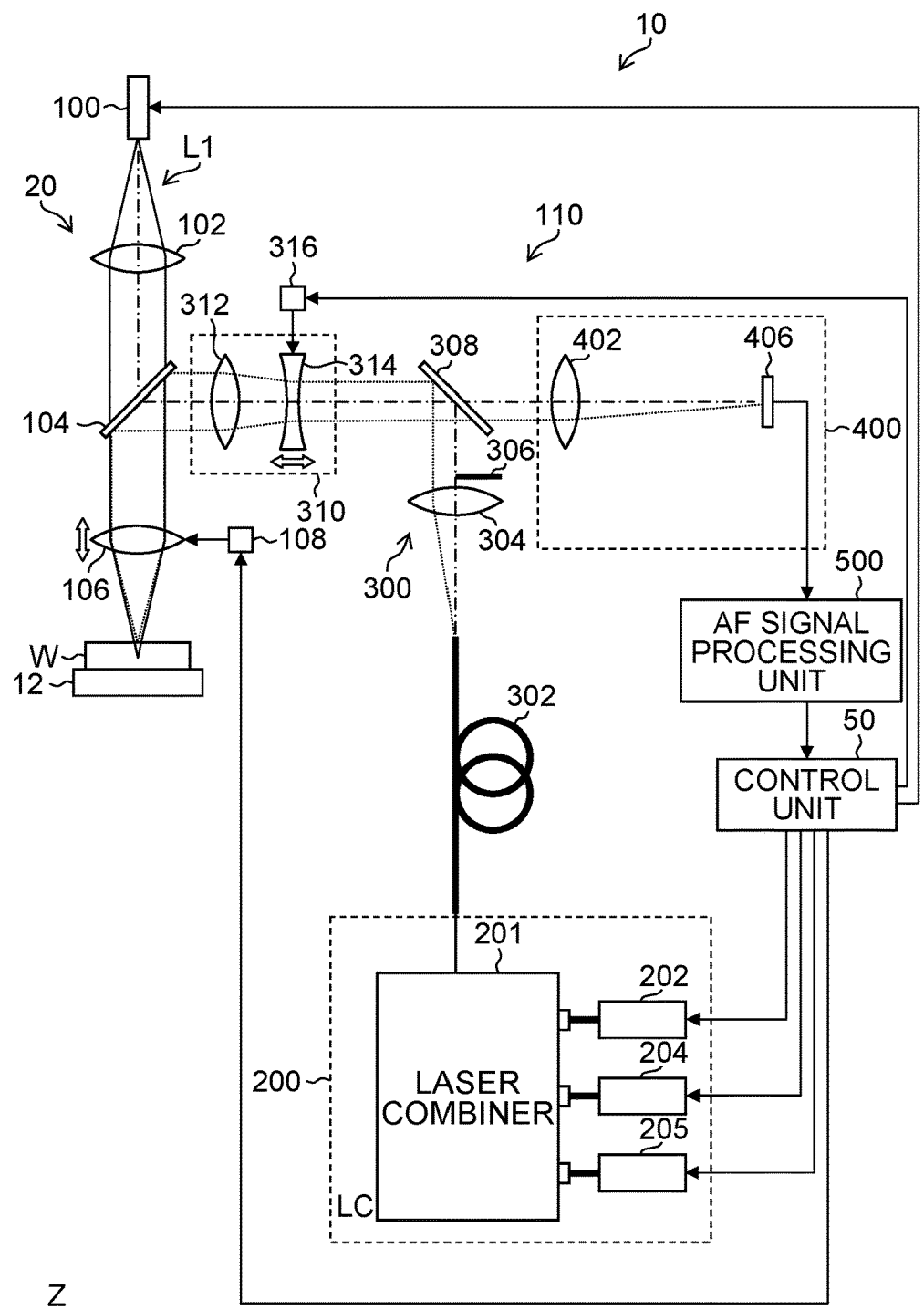
FIG. 16 is a block diagram illustrating an example employing the AF laser beams with three wavelengths in the laser dicing device according to the first embodiment.

Moreover, in this embodiment, since the two AF laser beams L2a and L2b with wavelengths different from each other are used, the first detector 406 and the second detector 408 are arranged at positions by taking into consideration of color aberration with respect to the respective wavelength regions. However, the embodiment should not be limited to this. The focus optical system 310 may include a bonded lens as color aberration correcting means (color aberration correcting unit), for example. In this case, since the focus optical system 310 functions as the color aberration correcting means, as in the example illustrated in FIG. 16, the dichroic mirror 404 and the second detector 408 are not needed any more in the detection optical system 400, and device configuration of the AF device 110 can be simplified.

Moreover, in this embodiment, the case where the height position of the laser beam irradiation surface of the wafer W is detected by using the two AF laser beams L2a and L2b with wavelengths different from each other is described. However, the embodiment should not be limited to this. Three or more AF laser beams with wavelengths different from each other may be used. For example, as illustrated by the light source unit 200 in FIG. 16, pigtail type LDs (Laser Diode: 202, 204, 205) which emit laser beams with three different types of wavelengths are combined to one fiber through a laser combiner 201. Then, the laser beams output from the LDs 202, 204, and 205 are output through the laser combiner 201 so that it is possible to select a wavelength of the laser beam to be output or to output mixture of the laser beams.

Moreover, in this embodiment, the example in which the first detector 406 and the second detector 408 are constituted by the bisected photodiode is illustrated. However, the embodiment should not be limited to this. Those capable of measuring a light amount balance (a quadrisected photodiode, a two-dimensional imaging element and the like) may be used.

Moreover, in this embodiment, the optical fiber 302 is used, but if there is no problem in layout of devices or units, a light source image may be directly formed at a front-side focal position of the collimate lens 304, and the optical fiber 302 may be omitted.

Second Embodiment

Subsequently, a second embodiment of the present invention is described. Hereinafter, description is omitted for portions in common with the first embodiment, and mainly feature portions of this embodiment are described.

Figure 17:
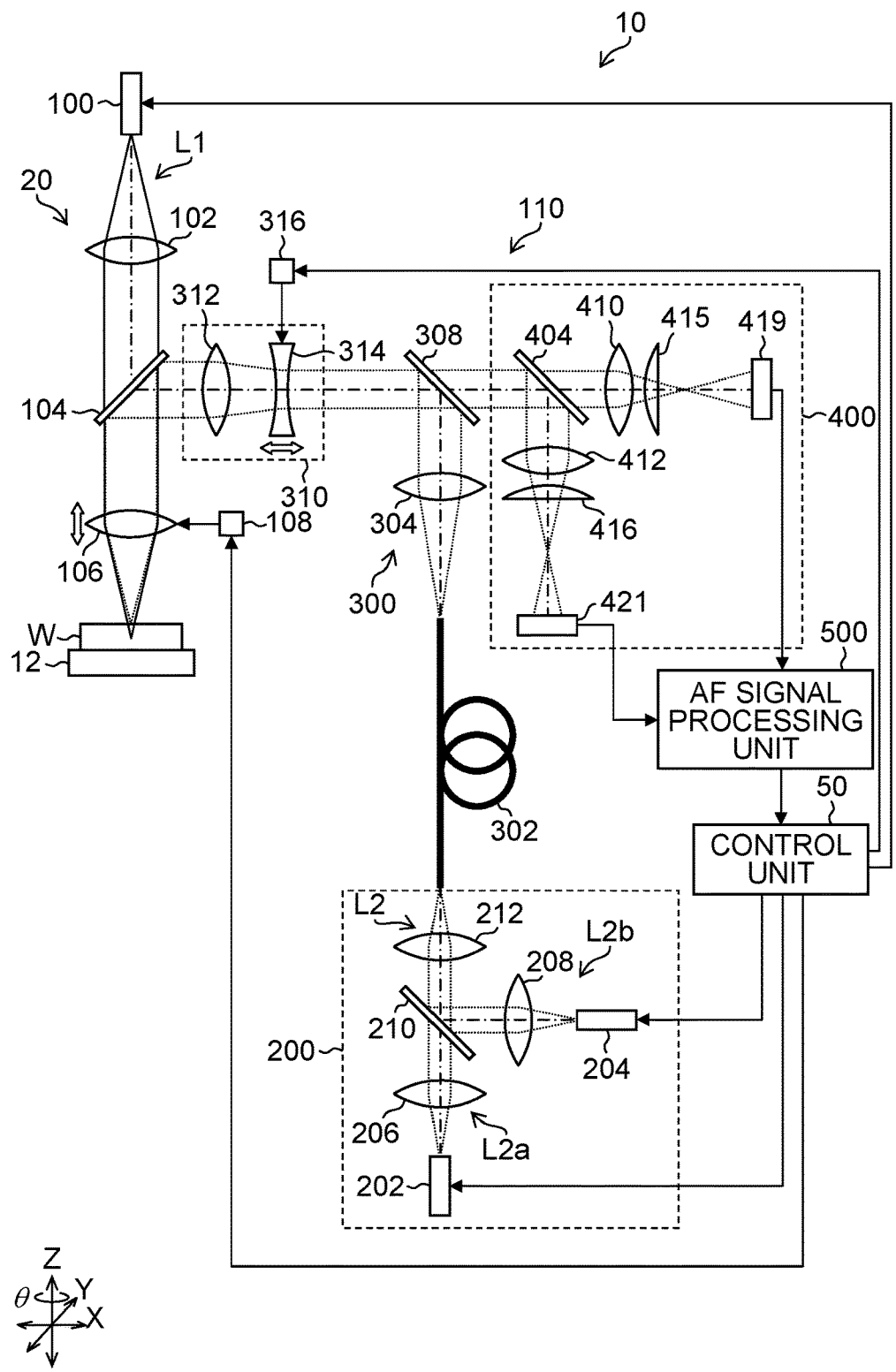
FIG. 17 is a block diagram illustrating an outline of a laser dicing device according to a second embodiment.

FIG. 17 is a block diagram illustrating an outline of a laser dicing device according to the second embodiment. In FIG. 17, constituent elements in common or similar to those in FIG. 1 are given the same reference numerals, and description thereof is omitted.

The second embodiment uses an astigmatism method as a method for detecting a height position of a laser beam irradiation surface of a wafer W.

As illustrated in FIG. 17, the AF laser beam L2 output from the light source unit 200 of the AF device 110 goes through the optical fiber 302, is collimated by the collimate lens 304 and is reflected by the half mirror 308 without having a part of the AF laser beam L2 shielded. Moreover, this AF laser beam L2 is converged by the light converging lens 106 through the focus optical system 310 and the dichroic mirror 104 and is emitted to the wafer W. The reflection light of the AF laser beam L2 reflected by the laser beam irradiation surface of the wafer W travels in the same optical path as the AF laser beam L2 in an opposite direction, is transmitted by the half mirror 308 arranged on the optical path, and is guided to the detection optical system 400 provided in an optical path branching from the optical path of the irradiation optical system 300.

The detection optical system 400 includes the dichroic mirror 404, image forming lenses 410 and 412, cylindrical lenses 414 and 416, a first detector 418, a second detector 420 and the like.

The dichroic mirror 404 divides the reflection light of the AF laser beam L2 guided to the detection optical system 400 into light with a specific wavelength and light with a wavelength other than the specific wavelength, similarly to the first embodiment. That is, in the reflection light of the AF laser beam L2, the light with a first wavelength region corresponding to the wavelength of the AF laser beam L2a emitted from the first light source 202 is transmitted by the dichroic mirror 404, and is received by the first detector 418 through the image forming lens 410 and the cylindrical lens 414. On the other hand, light with a second wavelength region corresponding to the wavelength of the AF laser beam L2b emitted from the second light source 204 is reflected by the dichroic mirror 404 and is received by the second detector 420 through the image forming lens 412 and the cylindrical lens 416. The cylindrical lenses 414 and 416 are astigmatism imparting means (astigmatism imparting unit) for imparting astigmatism to the light divided by the dichroic mirror 404 for each wavelength region, respectively.

The first detector 418 and the second detector 420 are made of quadrisected photodiodes having quadrisected light receiving elements, receive converged light images of light in division with the respective wavelength regions and output output signals according to the respective light amounts to the AF signal processing unit 500.

Since a detection principle of displacement of the laser beam irradiation surface of the wafer W by the astigmatism method is well known (see Japanese Patent Application Laid-Open No. 2009-152288, for example), detailed description is omitted here, but briefly explaining, the converged light image of the reflection light of the AF laser beam L2 formed on a light receiving surface of the quadrisected photodiode constituting the detector (corresponding to the first detector 418 and the second detector 420) becomes a true circle when the laser beam irradiation surface of the wafer W matches the light converging point of the AF laser beam L2. On the other hand, if the laser beam irradiation surface of the wafer W deviates from the light converging point of the AF laser beam L2, the converged light image becomes an oval extended in a vertical direction or in a lateral direction in accordance with the displacement direction of the laser beam irradiation surface of the wafer W, and the size of the converged light image depends on the displacement amount of the laser beam irradiation surface of the wafer W. Therefore, the displacement of the laser beam irradiation surface of the wafer W can be detected by using such properties.

Figure 18:
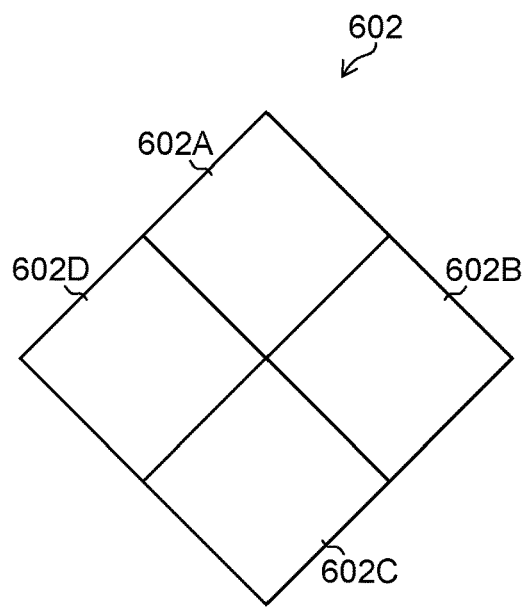
FIG. 18 is a view illustrating a light receiving surface of a quadrisected photodiode.

FIG. 18 is a view illustrating the light receiving surface of the quadrisected photodiode. As illustrated in this figure, the quadrisected photodiode 602 has four light receiving elements (photoelectric conversion elements) 602A to 602D, and each of the light receiving elements 602A to 602D receives and divides the converged light image of the reflection light of the AF laser beam L2 and outputs output signals according to respective light amounts to the AF signal processing unit 500.

Assuming that the output signals output from the light receiving elements 602A to 602D of the quadrisected photodiode 602 constituting the first detector 418 are A1 to D1, respectively, and the output signals output from the light receiving elements 602A to 602D of the quadrisected photodiode 602 constituting the second detector 420 are A2 to D2, respectively, when a sum (A1+B1+C1+D1) of the output signals in the first detector 418 is equal to or larger than a sum (A2+B2+C2+D2) of the output signals in the second detector 420, the AF signal processing unit 500 acquires the AF signal E in accordance with the following formula (3):

$$E=\{(A1+C1)-(B1+D1)\}/\{(A1+C1)+(B1+D1)\} \qquad (3)$$

On the other hand, when the sum (A1+B1+C1+D1) of the output signals in the first detector 418 is less than the sum (A2+B2+C2+D2) of the output signals in the second detector 420, the AF signal E is acquired in accordance with the following formula (4):

$$E=\{(A2+C2)-(B2+D2)\}/\{(A2+C2)+(B2+D2)\} \qquad (4)$$

According to such configuration, since the control unit 50 can control driving of the first actuator 108 or the second actuator 316 on the basis of the AF signal output from the AF signal processing unit 500 similarly to the first embodiment described above, the light converging point of the processing laser beam L1 can be controlled with high accuracy so as to follow displacement of the laser beam irradiation surface of the wafer W without being affected by a change of the processing depth of the modified region, and the modified region can be formed with high accuracy at a desired position inside the wafer W.

The first detector 418 and the second detector 420 are not limited to the quadrisected photodiodes. The first detector 418 and the second detector 420 only need to be those capable of measuring a light amount balance. A two-dimensional imaging element or the like may be used as the first detector 418 and the second detector 420, for example.

Figure 19:
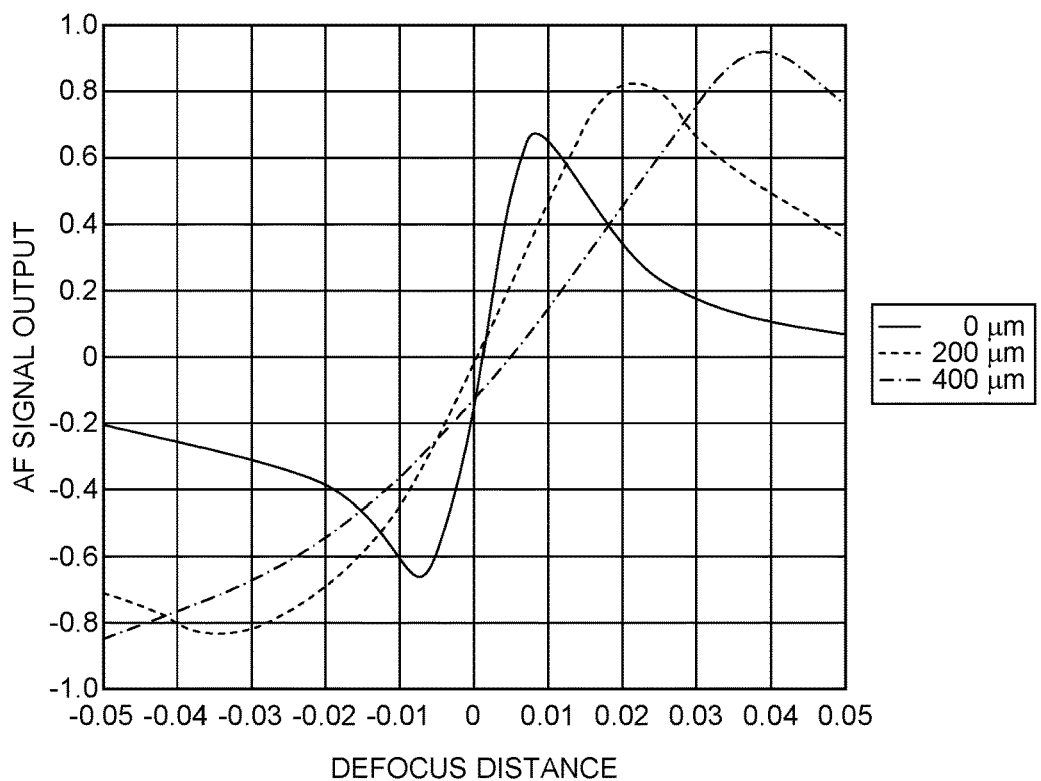
FIG. 19 is a view illustrating an output characteristic of an AF signal in the second embodiment.

FIG. 19 is a view illustrating the output characteristics of the AF signal in the second embodiment. As illustrated in FIG. 19, variation for each processing depth is larger in the second embodiment as compared with the output characteristics of the AF signal in the first embodiment (see FIG. 10), but the focus drawing range is relatively wide, inclination (inclination of the substantially linear portion showing a proportional relationship centered on the focusing position) of the curve of the output characteristic of the AF signal is large, and focus sensitivity is high. Therefore, the configuration enables to stably detect the height position of the laser beam irradiation surface of the wafer W.

As described above, in the second embodiment, too, the effect similar to the first embodiment is obtained. Moreover, in the second embodiment, an optical distance between the exit pupil of the light converging lens 106 and the fixed lens 312 of the focus optical system 310 is preferably 50 mm or less. By setting this optical distance within the aforementioned range, it is possible to obtain high AF sensitivity, a wide drawing range, and stable AF characteristics regardless of the processing depth.

Third Embodiment

Subsequently, a third embodiment of the present invention is described. Hereinafter, description is omitted for portions in common with the first embodiment, and mainly feature portions of this embodiment are described.

Figure 20:
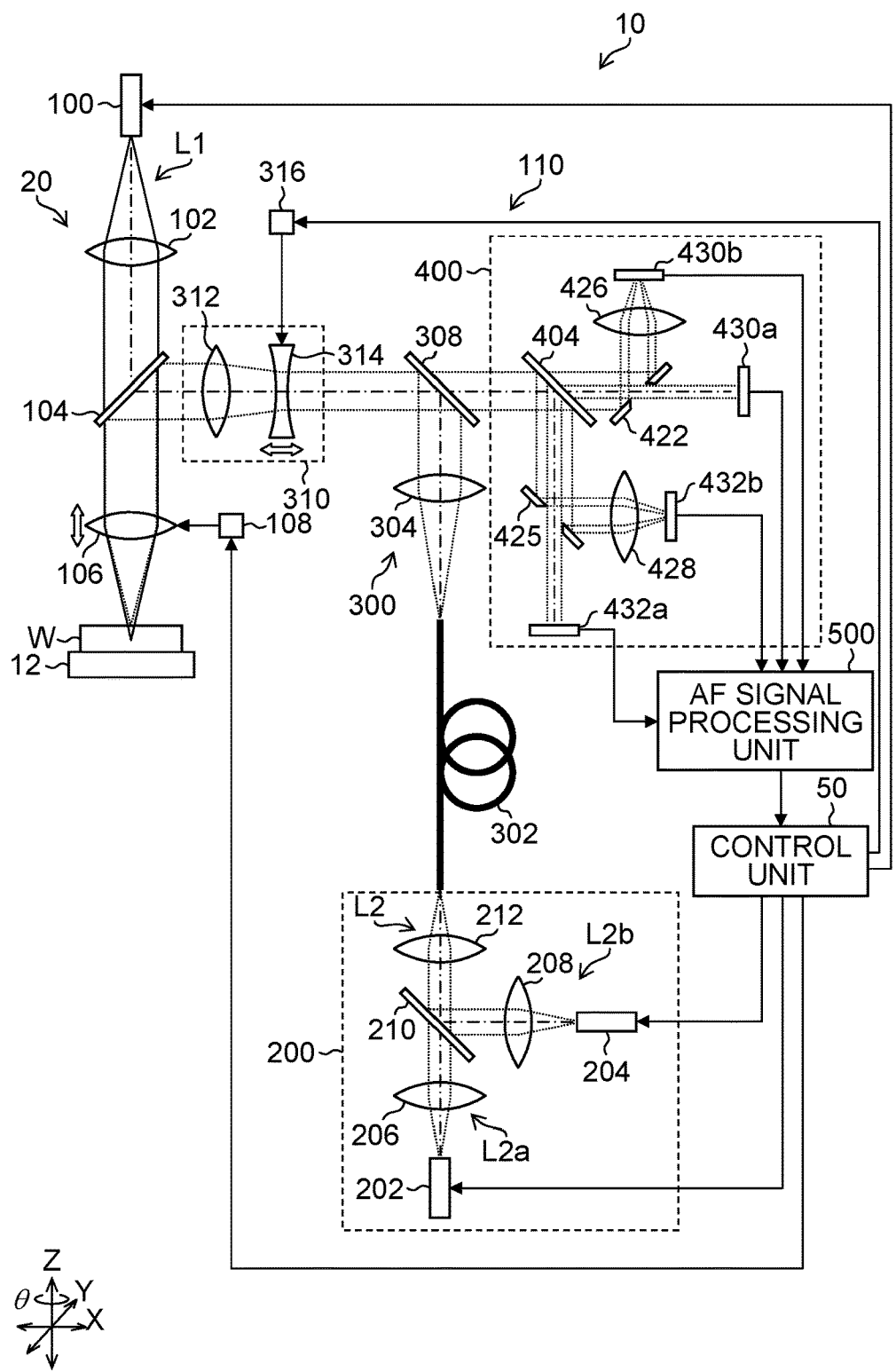
FIG. 20 is a block diagram illustrating an outline of a laser dicing device according to a third embodiment.

FIG. 20 is a block diagram illustrating an outline of a laser dicing device according to the third embodiment. In FIG. 20, constituent elements in common or similar to those in FIG. 1 are given the same reference numerals, and description thereof is omitted.

The third embodiment uses a central intensity method as a method for detecting the height position of the laser beam irradiation surface of the wafer W. The central intensity method is a method in which a part of the reflection light is received by either one of the two detectors, while the whole of or a part of the reflection light is received by the other detector, and the height position of the laser beam irradiation surface of the wafer W is detected by using the light receiving amounts in the respective detectors.

As illustrated in FIG. 20, the AF laser beam L2 output from the light source unit 200 of the AF device 110 is guided to the light converging lens 106 through the optical path of the irradiation optical system 300 having a configuration similar to that of the second embodiment, is converged by the light converging lens 106 and is emitted to the wafer W. The reflection light of the AF laser beam L2 reflected by the laser beam irradiation surface of the wafer W travels in the optical path of the irradiation optical system 300 in the opposite direction, is transmitted by the half mirror 308 arranged on the optical path, and is guided to the detection optical system 400 provided in the optical path branching from the optical path of the irradiation optical system 300.

The detection optical system 400 includes the dichroic mirror 404, holed mirrors 422 and 425, image forming lenses 426 and 428, first detectors 430a and 430b, second detectors 432a and 432b and the like.

The dichroic mirror 404 divides the reflection light of the AF laser beam L2 guided to the detection optical system 400 into light with a specific wavelength and light with a wavelength other than the specific wavelength, similarly to the first embodiment. That is, in the reflection light of the AF laser beam L2, the light with the first wavelength region corresponding to the wavelength of the AF laser beam L2a emitted from the first light source 202 is transmitted by the dichroic mirror 404. Then, a part of the light passes through an opening portion formed at a center part of the holed mirror 422 and is received by the first detector 430a, while the remaining light is reflected by a reflection surface of a peripheral part of the holed mirror 422, is converged by the image forming lens 426, and is received by the first detector 430b. On the other hand, light with a second wavelength region corresponding to the wavelength of the AF laser beam L2b emitted from the second light source 204 is reflected by the dichroic mirror 404 and a part of the light passes through an opening portion formed at a center part of the holed mirror 425 and is received by the second detector 432a, while the remaining light is reflected by a reflection surface of a peripheral part of the holed mirror 425, is converged by the image forming lens 428 and is received by the second detector 432b.

The first detectors 430a and 430b and the second detectors 432a and 432b output output signals according to received light amounts to the AF signal processing unit 500.

The AF signal processing unit 500 generates the AF signal indicating displacement (defocus distance) in the Z-direction from the reference position of the laser beam irradiation surface of the wafer W on the basis of the output signal output from at least either one of the first detectors 430a and 430b and the second detectors 432a and 432b, and outputs the AF signal to the control unit 50.

Here, the detection principle of the displacement of the laser beam irradiation surface of the wafer W is described. Since the detection principle using the first detectors 430a and 430b and the detection principle using the second detectors 432a and 432b are similar, the detection principle using the first detectors 430a and 430b representing them is described.

In the reflection light having been transmitted by the dichroic mirror 404, a part of the light passes through the opening portion of the holed mirror 422 and is received by the first detector 430a, while the remaining light is reflected by the reflection surface of the peripheral part of the holed mirror 422, is converged by the image forming lens 426, and is received by the first detector 430b. Thus, a sum of the light amounts (total light receiving amount) of the reflection light received by the first detectors 430a and 430b is constant at all times regardless of the height position of the laser beam irradiation surface of the wafer W, and the sum of outputs of the first detectors 430a and 430b becomes constant. On the other hand, the reflection light received by the first detector 430a has a light receiving region which is limited to the center part by the opening portion of the holed mirror 422 and thus, the light receiving amount is changed by the distance from the light converging lens 106 to the laser beam irradiation surface of the wafer W, that is, by the height position (Z-direction position) of the laser beam irradiation surface of the wafer W. Thus, the output of the first detector 430a is changed by the height position of the laser beam irradiation surface of the wafer W irradiated with the AF laser beam L2. Therefore, displacement of the laser beam irradiation surface of the wafer W can be detected by using such properties.

In the AF signal processing unit 500, assuming that the output signals output from the first detectors 430a and 430b are Pa and Pb, respectively, and the output signals output from the second detectors 432a and 432b are Qa and Qb, respectively, if the sum (Pa+Pb) of the output signals in the first detectors 430a and 430b is equal to or larger than the sum (Qa+Qb) of the output signals in the second detectors 432a and 432b, the AF signal E is acquired in accordance with the following formula (5):

$$E=(Pa+Pb)/Pa \quad (5)$$

On the other hand, if the sum (Pa+Pb) of the output signals in the first detectors 430a and 430b is less than the sum (Qa+Qb) of the output signals in the second detectors 432a and 432b, the AF signal E is acquired in accordance with the following formula (6):

$$E=(Qa+Qb)/Qa \quad (6)$$

That is, the AF signal processing unit 500 uses a detector for acquiring the AF signal E by switching to the detector with the larger total light receiving amount in the first detectors 430a and 430b and the second detectors 432a and 432b. As a result, since the AF signal E is generated by using the light with the wavelength with high reflectance at all times, even if the reflectance of the AF laser beam L2 emitted to the laser beam irradiation surface of the wafer W is changed by the wavelength, it is possible to detect the height position of the laser beam irradiation surface of the wafer W accurately and stably without being affected by the variation in the thin film formed on the laser beam irradiation surface of the wafer W.

According to the configuration described above, since the control unit 50 can control driving of the first actuator 108 and the second actuator 316 similarly to the aforementioned first embodiment on the basis of the AF signal output from the AF signal processing unit 500, the light converging point of the processing laser beam L1 can be controlled with high accuracy so as to follow displacement of the laser beam irradiation surface of the wafer W without being affected by the change in the processing depth of the modified region, and the modified region can be formed with high accuracy at a desired position inside the wafer W.

Figure 21:
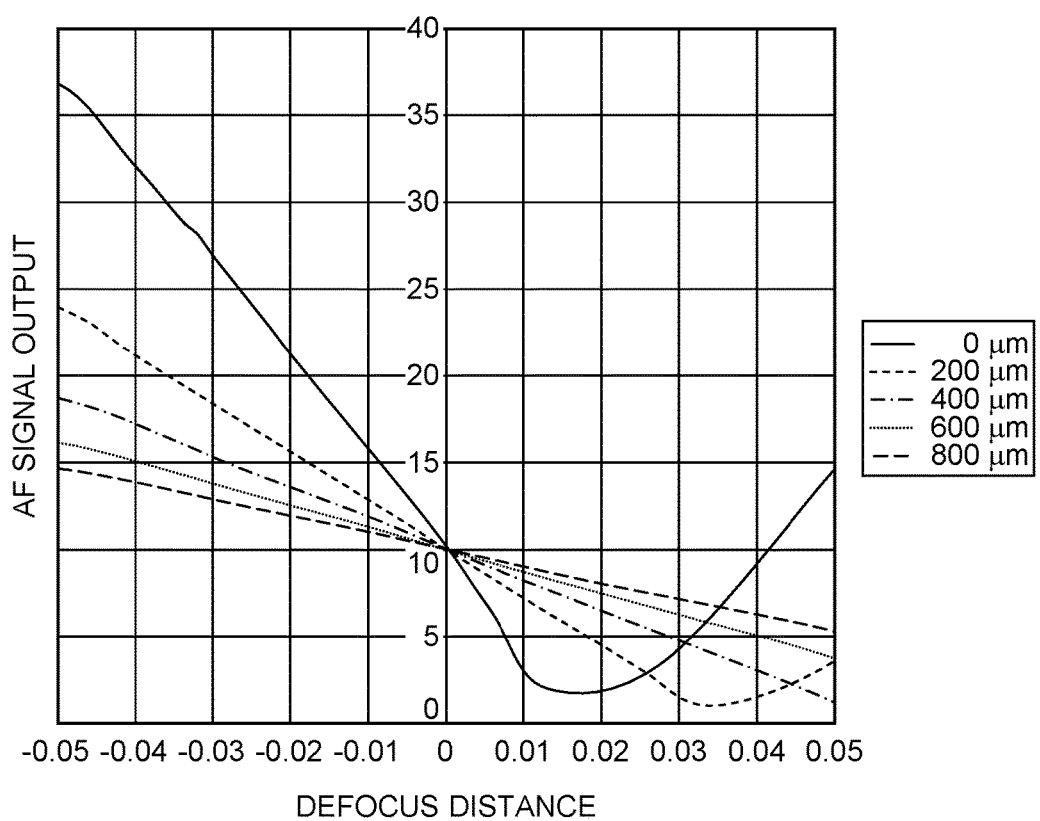
FIG. 21 is a view illustrating an output characteristic of an AF signal in the third embodiment.

FIG. 21 is a view illustrating the output characteristics of the AF signal in the third embodiment. As illustrated in FIG. 21, variation for each processing depth is larger in the third embodiment as compared with the output characteristics of the AF signal in the first embodiment (see FIG. 10), but the focus drawing range in which the defocus distance is in a negative direction (direction from the light converging point of the AF laser beam L2 toward the light converging lens 106) is wide. Even if a laser beam incident surface of the wafer W deviates from the light converging point of the AF laser beam L2, the configuration enables to stably detect the height position of the laser beam irradiation surface of the wafer W.

As described above, in the third embodiment, too, the effect similar to that of the first embodiment is obtained. Moreover, in the third embodiment, it is preferable that an optical distance between the exit pupil of the light converging lens 106 and the holed mirrors 422 and 425 (light receiving region regulating means or unit) is 20 mm or more and 150 mm or less and the optical distance between the exit pupil of the light converging lens 106 and the fixed lens 312 of the focus optical system 310 is 120 mm or less. By setting these optical distances within the aforementioned range, it is possible to obtain high AF sensitivity, a wide drawing range, and stable AF characteristics regardless of the processing depth.

In the third embodiment, the holed mirrors 422 and 425 which are light receiving region regulating means are used, but the light receiving region regulating means should not be limited to the holed mirrors. A split mirror may be used, for example. In this case, the reflection light of the AF laser beam L2 divided for each wavelength in the dichroic mirror 404 is split into two paths by the split mirror, and each of the divided reflection lights is detected by the first detectors 430a and 430b and the second detectors 432a and 432b, respectively. As a result, the AF signal can be acquired similarly to the case where the holed mirrors 422 and 425 are used, and the height position of the laser beam irradiation surface of the wafer W can be detected.

Figure 22:
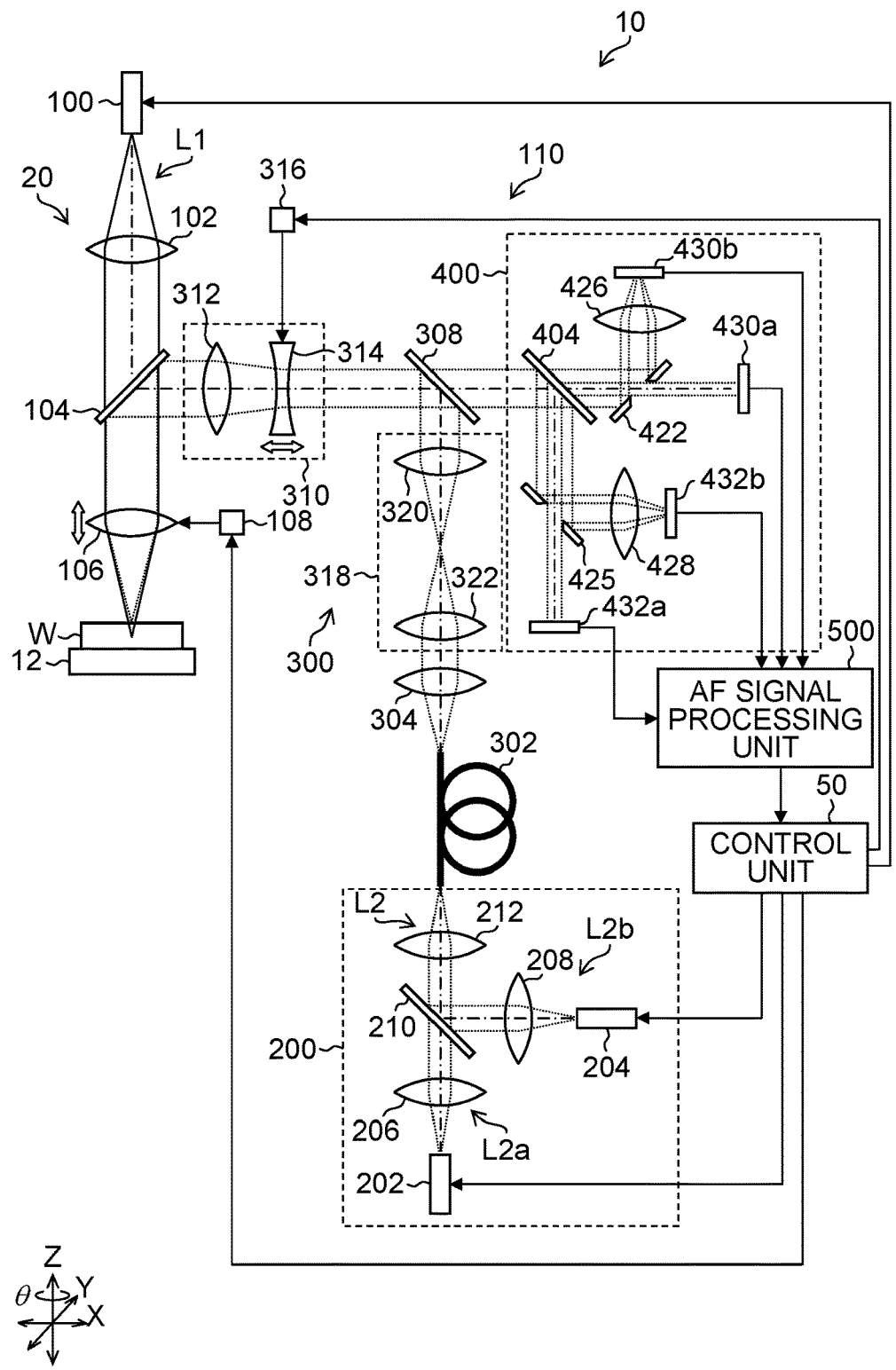
FIG. 22 is a block diagram of an essential part illustrating another configuration example of the laser dicing device according to the third embodiment.

Moreover, in the third embodiment, a configuration as illustrated in FIG. 22 may be also employed. That is, in the optical path of the irradiation optical system 300 for guiding the AF laser beam L2 to the light converging lens 106a, a 4f optical system 318 may be arranged between the half mirror 308 and the collimate lens 304. The 4f optical system 318 includes a first relay lens 320 and a second relay lens 322. According to the configuration as above, a plane conjugated with the exit pupil of the light converging lens 106 can be arranged at a position physically away (separated) from the light converging lens 106 and thus, a degree of arrangement freedom of the collimate lens 304 and the like arranged in the irradiation optical system 300 can be improved.

Moreover, in the third embodiment, as the configuration of the detection optical system 400 for detecting the AF laser beam L2, the configuration using the first detectors 430a and 430b and the second detectors 432a and 432b is described as an example. However, the configuration is not necessarily limited to such configuration. As the configuration of the detection optical system 400 for detecting the AF laser beam L2, a configuration as illustrated in FIG. 23, for example, can be also employed.

Figure 23:
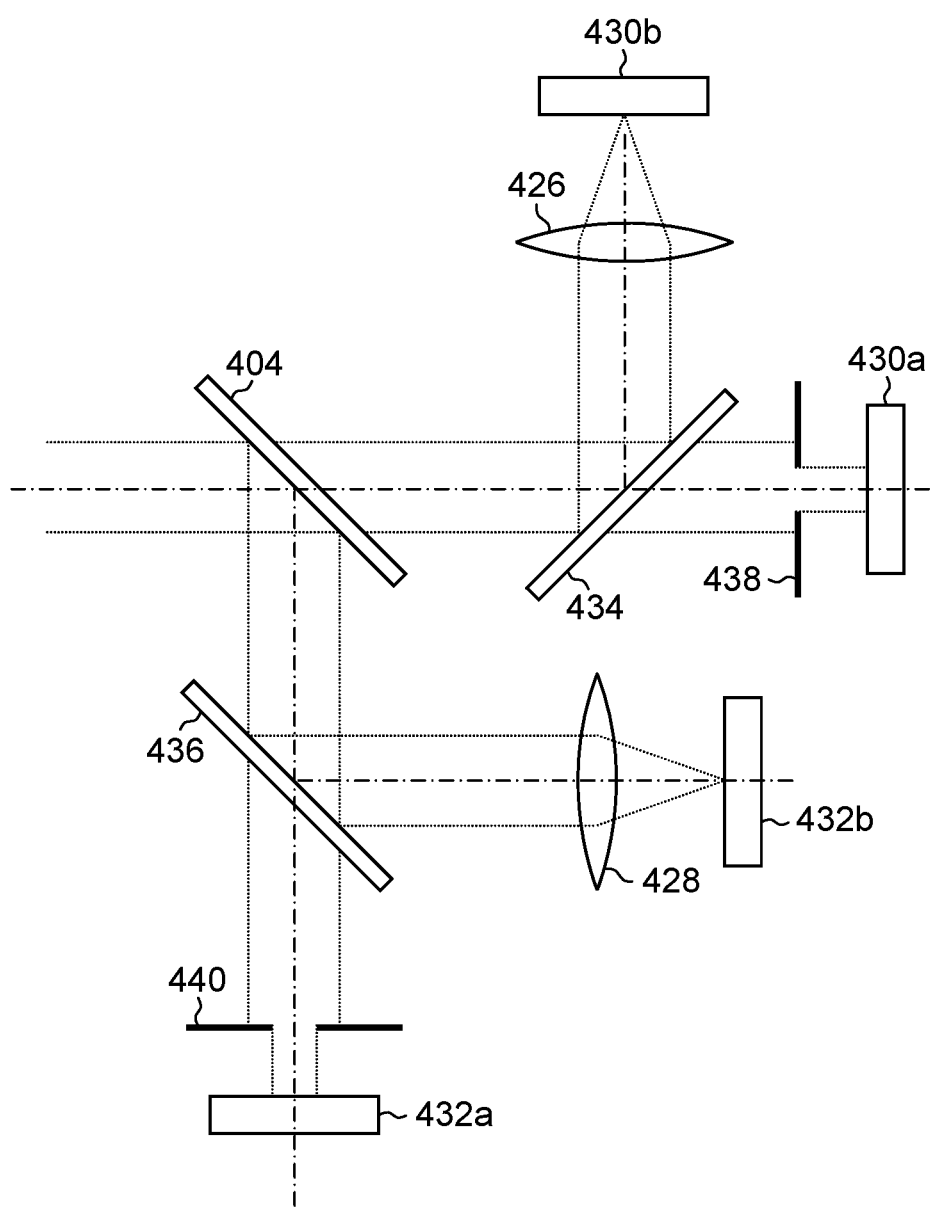
FIG. 23 is a block diagram illustrating still another configuration example of the laser dicing device according to the third embodiment.

FIG. 23 is a block diagram illustrating an essential part of another configuration example of the dicing device according to the third embodiment. In the configuration example illustrated in FIG. 23, half mirrors 434 and 436 and masks 438 and 440 are provided instead of the holed mirrors 422 and 425 illustrated in FIG. 20.

According to this configuration example, in the reflection light of the AF laser beam L2 guided by the dichroic mirror 404, a part of the light with the first wavelength region having been transmitted by the dichroic mirror 404 is transmitted by the half mirror 434 and is received by the first detector 430a through the mask 438 having a central opening on the optical path, while the remaining light is reflected by the half mirror 434 and is received by the first detector 430b totally (in 100%) using the image forming lens 426. On the other hand, a part of the light with the second wavelength region reflected by the dichroic mirror 404 is transmitted by the half mirror 436 and is received by the second detector 432a through the mask 440 having a central opening on the optical path, while the remaining light is reflected by the half mirror 436 and is received by the second detector 432b totally (in 100%) using the image forming lens 428. Though the light amounts of the reflection lights received by the first detector 430b and the second detector 432b are constant, the light amounts of the reflection lights received by the first detector 430a and the second detector 423a are changed depending on the height position of the laser beam irradiation surface of the wafer W. The height position of the laser beam irradiation surface of the wafer W can be detected similarly to the third embodiment by using such properties.

That is, in the AF signal processing unit 500, assuming that the output signals output from the first detectors 430a and 430b are Pa and Pb, and the output signals output from the second detectors 432a and 432b are Qa and Qb, respectively, if the output signal Pb in the first detector 430b is equal to or larger than the output signal Qb in the second detector 432b, the AF signal E is acquired in accordance with the following formula (7):

$$E=Pb/Pa \qquad (7)$$

On the other hand, when the output signal Pb in the first detector 430b is less than the output signal Qb in the second detector 432b, the AF signal E is acquired in accordance with the following formula (8):

$$E=Qb/Qa \qquad (8)$$

According to such configuration, similarly to the aforementioned first embodiment, the control unit 50 can control the light converging point of the processing laser beam L1 with high accuracy so as to follow the displacement of the laser beam irradiation surface of the wafer W without being affected by the change in the processing depth of the modified region by controlling the driving of the first actuator 108 or the second actuator 316 on the basis of the AF signal output from the AF signal processing unit 500 and can form the modified region at a desired position inside the wafer W with high accuracy.

Fourth Embodiment

Subsequently, a fourth embodiment of the present invention is described. Hereinafter, description is omitted for portions in common with the first embodiment, and feature portions of this embodiment are mainly described.

Figure 24:
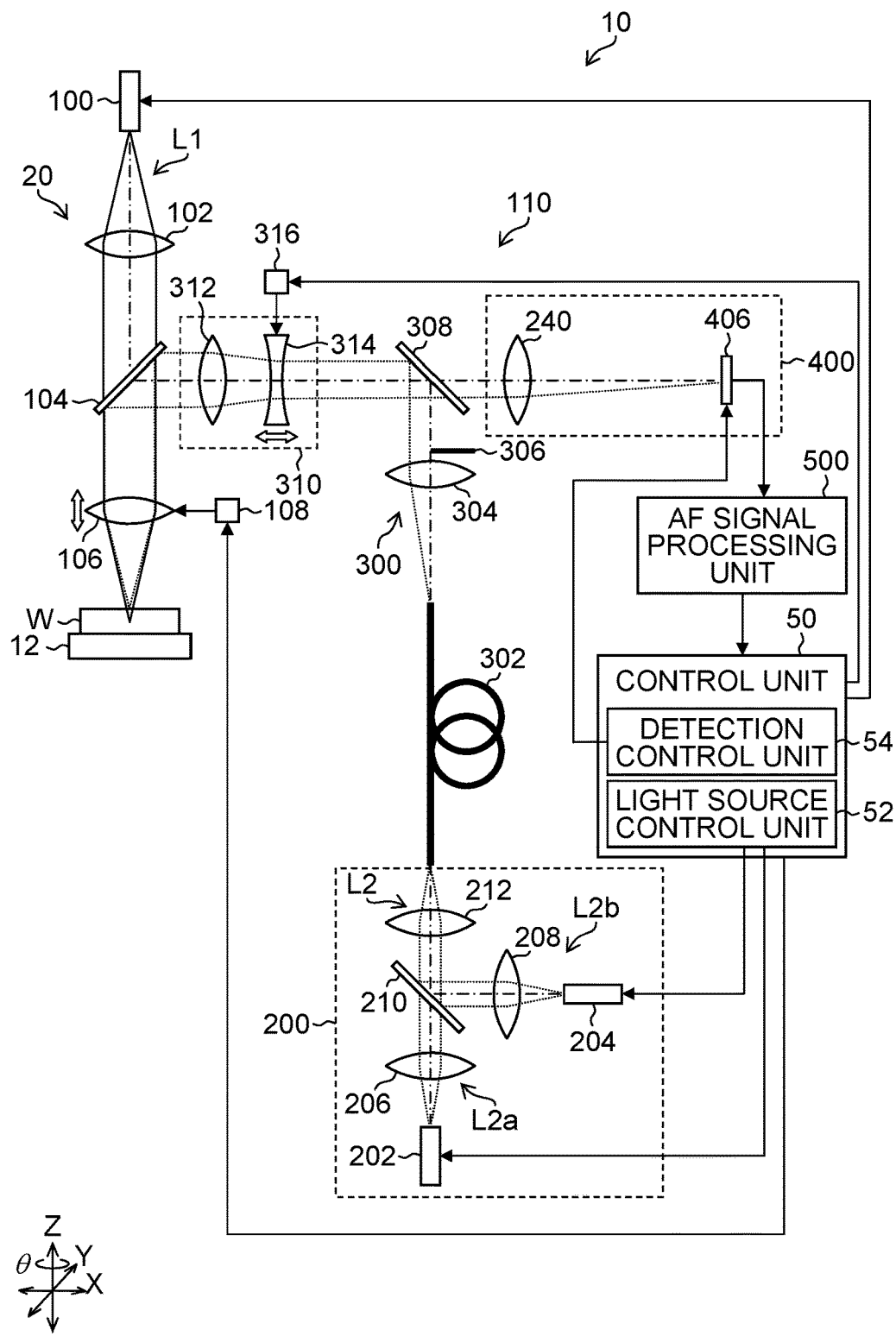
FIG. 24 is a block diagram illustrating an outline of a laser dicing device according to a fourth embodiment.

FIG. 24 is a block diagram illustrating an outline of a laser dicing device according to the fourth embodiment. In FIG. 24, constituent elements in common or similar to those in FIG. 1 are given the same reference numerals, and description thereof is omitted.

In the first embodiment, the AF device 110 detects the reflection lights of the two AF laser beams L2a and L2b with different wavelengths at the same time by using the two detectors 406 and 408, but in the fourth embodiment, the two AF laser beams L2a and L2b with different wavelengths are emitted alternately in terms of time (temporally) so that the reflection lights of the AF laser beams L2a and L2b reflected by the laser beam incident surface of the wafer W are detected alternately in a time-division manner for each wavelength region.

That is, the AF device 110 is configured to switch ON/OFF of the first light source 202 and the second light source 204 in the light source unit 200 in the time-division manner so that the reflection lights of the AF laser beams L2a and L2b can be detected in a time-division manner by the one detector 406 for each wavelength region in synchronization with the switching timing of the first light source 202 and the second light source 204. The light source unit 200 is an example of time-division output means (time-division output unit). Moreover, the detector 406 is one example of time-division detecting means (time-division detector).

The control unit 50 includes a light source control unit 52 and a detection control unit 54. The light source control unit 52 controls switching between ON/OFF of the first light source 202 and the second light source 204. The detection control unit 54 controls a detection operation (light receiving operation) of the detector 406 in synchronization with the switching timing in the light source control unit 52.

By means of the configuration as described above, in the fourth embodiment, too, since the output signals corresponding to the light amounts of the reflection lights of the AF laser beams L2a and L2b are alternately output from the detector 406 in a time-division manner, the effect similar to that of the first embodiment can be obtained. Further, in the fourth embodiment, since a plurality of detectors does not have to be provided in order to detect the plurality of AF laser beams with different wavelengths, the device configuration can be simplified.

Fifth Embodiment

Subsequently, a fifth embodiment of the present invention is described.

Figure 25:
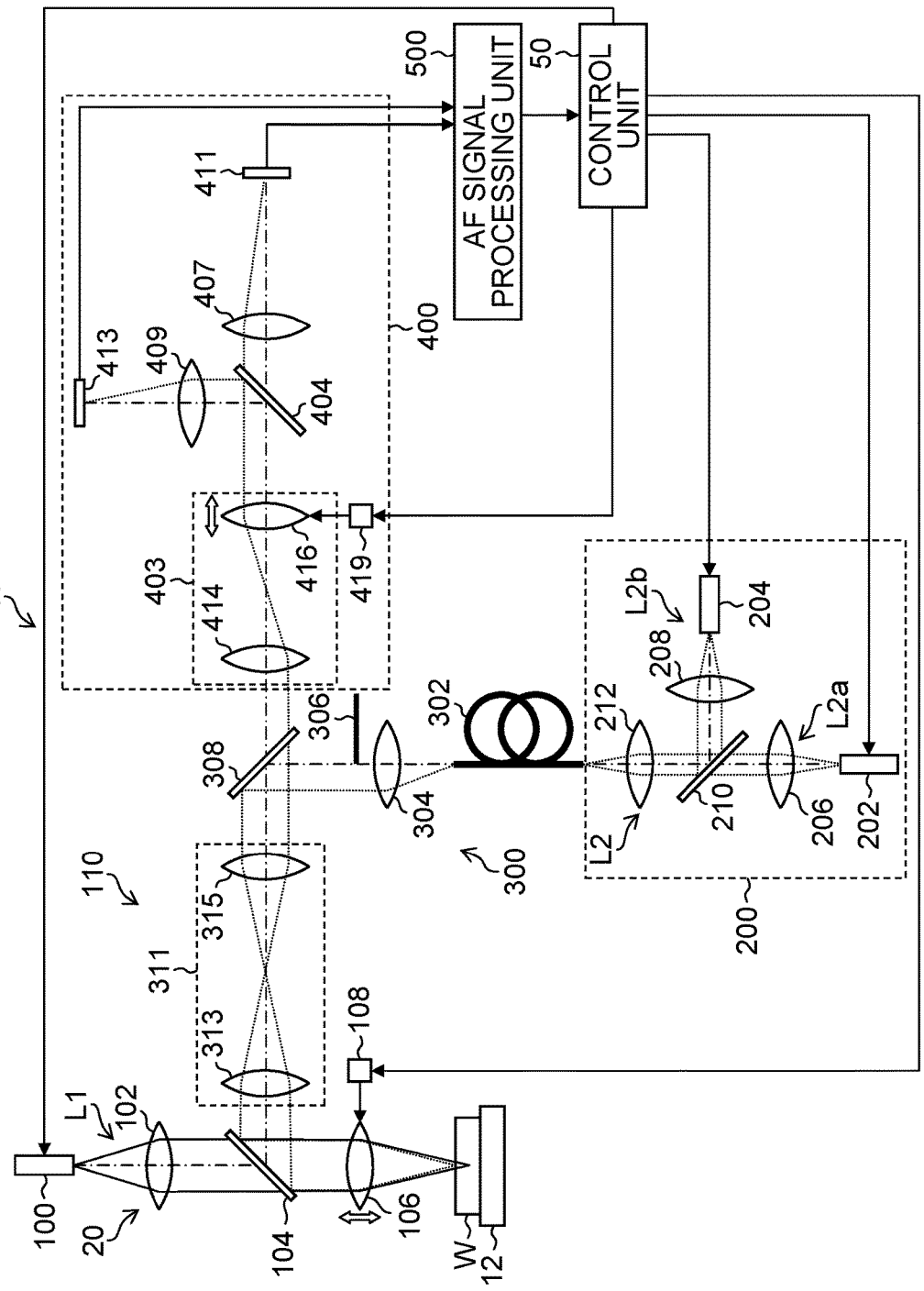
FIG. 25 is a block diagram illustrating an outline of a laser dicing device according to a fifth embodiment.

FIG. 25 is a block diagram illustrating an outline of a laser dicing device according to the fifth embodiment. As illustrated in FIG. 25, the laser dicing device 10 includes the stage 12, the laser head 20, the control unit 50 and the like.

The stage 12 is configured movably in the XYZθ directions and suctions and holds the wafer W. The wafer W is placed on the stage 12 so that the rear surface on the side opposite to the front surface (device surface) becomes the laser beam irradiation surface. The front surface of the wafer W may be the laser beam irradiation surface. The same applies to the other embodiments which will be described later.

The laser head 20 irradiates the wafer W with the processing laser beam L1 for forming a modified region inside the wafer W.

The control unit 50 includes the CPU (Central Processing Unit), the memory, the input/output circuit portion and the like and controls an operation of each part of the laser dicing device 10.

The laser dicing device 10 includes wafer conveying means, an operation panel, a TV monitor, a display lamp and the like, not shown, in addition to them.

On the operation panel, switches for operating the operation of each part of the laser dicing device 10 and the display device are mounted. The TV monitor displays a wafer image taken by the CCD (Charge Coupled Device) camera, not shown, or program contents, various messages and the like.

The display lamp displays the operating state of the laser dicing device 10 such as during processing, processing finished, emergency stop and the like.

Subsequently, a detailed configuration of the laser head 20 is described.

As illustrated in FIG. 25, the laser head 20 includes the processing laser light source 100, the collimate lens 102, the dichroic mirror 104, the light converging lens 106, the AF device (autofocus device) 110 and the like.

The processing laser light source 100 emits the processing laser beam L1 for forming the modified region inside the wafer W. The processing laser light source 100 emits a laser beam having a pulse width of 1 µs or less and a peak power density at a light converging point of $1\times10^8$ (W/cm$^2$) or more, for example.

The processing laser beam L1 emitted from the processing laser light source 100 is collimated by the collimate lens 102 and transmitted by the dichroic mirror 104 and then, converged inside of the wafer W by the light converging lens 106. The Z-direction position (position in the wafer thickness direction) of the light converging point of the processing laser beam L1 is adjusted by slightly moving the light converging lens 106 by a first actuator 108 in the Z-direction (an optical axis direction of the processing laser beam L1). The first actuator 108 is an example of the light converging lens driving means. Though details will be described later, the first actuator 108 has its driving controlled by the control unit 50 so that the distance between the light converging lens 106 and the laser beam irradiation surface of the wafer W is constant.

The formation of the modified region by using the processing laser beam L1 can be performed similarly to the example described by using FIGS. 2A to 2C. That is, as illustrated in FIG. 2A, when the light converging point of the processing laser beam L1 incident from the laser beam irradiation surface of the wafer W is set inside of the wafer W in the thickness direction, the processing laser beam L1 having been transmitted through the laser beam irradiation surface of the wafer W has its energy concentrated at the light converging point inside the wafer W, and the modified regions such as a crack region, a melting region, a refraction-index change region and the like by multiphoton absorption are formed in the vicinity of the light converging point inside the wafer W. As illustrated in FIG. 2B, by irradiating the wafer W with the intermittent pulse processing laser beam L1 so as to form the plurality of the modified regions P, P, along the dicing street, a balance of an intermolecular force is lost in the wafer W, and the wafer W naturally cleaves at the modified regions P, P, . . . as starting points or is cleaved by applying a slight external force.

Moreover, in the case of the wafer W with a large thickness, cleavage does not occur when the number of layers of the modified region P is one and thus, as illustrated in FIG. 2C, the light converging point of the processing laser beam L1 is moved in the thickness direction of the wafer W, and the modified regions P are formed in multiple layers so as to be cleaved.

In the example illustrated in FIGS. 2B and 2C, the state is illustrated in which the discontinuous modified regions P, P, . . . are formed by the intermittent pulse processing laser beam L1, but continuous modified regions P may be formed with a continuous wave of the processing laser beam L1. When the discontinuous modified regions P are formed, they are not cleaved easily as compared with the case where the continuous modified region P is formed and thus, whether the continuous wave of the processing laser beam L1 is used or the intermittent wave is used is selected as appropriate depending on the situation such as a thickness of the wafer W, safety during conveyance and the like.

The AF device 110 irradiates the wafer W with an AF laser beam (detection laser beam) L2, receives the reflection light of the AF laser beam L2 reflected by the laser beam irradiation surface of the wafer W and detects the height position (Z-direction position) of the laser beam irradiation surface of the wafer W on the basis of the received reflection light. The AF device 110 is an example of the height position detecting means.

The AF device 110 includes the light source unit 200 for outputting the AF laser beam L2, the irradiation optical system 300 for guiding the AF laser beam L2 output from the light source unit 200 to the light converging lens 106, the detection optical system 400 for detecting the reflection light which is the AF laser beam L2 converged by the light converging lens 106 and then reflected by the laser beam irradiation surface of the wafer W, and the AF signal processing unit 500 for generating an AF signal indicating the height position of the laser beam irradiation surface of the wafer W by using the reflection light of the AF laser beam L2 detected by the detection optical system 400.

The light source unit 200 includes the first light source 202, the second light source 204, the collimate lenses 206, 208, the dichroic mirror 210, the light converging lens 212 and the like. The light source unit 200 is an example of the detection laser beam output means.

The first light source 202 and the second light source 204 are constituted by an LD (Laser Diode) light source, an SLD (Super Luminescent Diode) light source or the like, for example. The first light source 202 and the second light source 204 emit the AF laser beams (detection laser beams) L2a and L2b having wavelengths different from each other, respectively. The AF laser beams L2a and L2b have wavelengths different from that of the processing laser beam L1 and capable of being reflected by the laser beam irradiation surface of the wafer W. That is, the AF laser beam L2a is a laser beam (red laser beam) having a wavelength of a first wavelength region (620 to 750 nm, for example), while the AF laser beam L2b is a laser beam (blue laser beam) having a wavelength of a second wavelength region (450 to 495 nm, for example) different from the first wavelength region. The first light source 202 and the second light source 204 are examples of a plurality of detection laser light sources.

The AF laser beams L2a and L2b emitted from the first light source 202 and the second light source 204 are collimated by the collimate lenses 206 and 208 and guided to the dichroic mirror 210, respectively.

The dichroic mirror 210 transmits the AF laser beam L2a, one of the AF laser beams L2a and L2b incident through the collimate lenses 206 and 208 and reflects the other AF laser beam L2b so as to guide the both light beams to the same optical path. A synthesized beam of the AF laser beams L2a and L2b led by the dichroic mirror 210 to the same optical path is converged by the light converging lens 212 and is output as light source light (AF laser beam L2) from the light source unit 200. The dichroic mirror 210 is an example of light synthesizing means.

The irradiation optical system 300 includes the optical fiber 302, the collimate lens 304, the knife edge 306, the half mirror 308, a 4f optical system 311, the dichroic mirror 104 and the like.

The AF laser beam L2 (synthesized beam of the AF laser beams L2a and L2b) output from the light source unit 200 enters into the incident end of the optical fiber 302, goes through the optical fiber 302 and is emitted from the emitting end of the optical fiber 302. Moreover, this AF laser beam L2 is collimated by the collimate lens 304 and a part thereof is shielded by the knife edge 306. Then, the light having travelled without being shielded by the knife edge 306 is reflected by the half mirror 308, goes through the 4f optical system 311, is reflected by the dichroic mirror 104 and is guided to the same optical path together with the processing laser beam L1. Moreover, this AF laser beam L2 is converged by the light converging lens 106 and is emitted to the wafer W.

The reflection light of the AF laser beam L2 reflected by the laser beam irradiation surface of the wafer W is refracted by the light converging lens 106, reflected by the dichroic mirror 104, goes through the 4f optical system 311, is transmitted by the half mirror 308 and is guided to the detection optical system 400 provided on an optical path branching from the optical path of the irradiation optical system 300.

The half mirror 308 is an example of the optical path branching means and is disposed on the optical path (irradiation optical path) of the irradiation optical system 300. The half mirror 308 branches a part of the reflection light of the AF laser beam L2 reflected by the laser beam irradiation surface of the wafer W to the optical path (detection optical path) of the detection optical system 400 from the optical path of the irradiation optical system 300.

The detection optical system 400 includes a focus optical system 403, the dichroic mirror 404, image forming lenses 407 and 409, a first detector 411, a second detector 413 and the like. The detection optical system 400 is an example of the light detecting means. The reflection light of the AF laser beam L2 incident to the detection optical system 400 is guided to the dichroic mirror 404 through the focus optical system 403.

The dichroic mirror 404 is wavelength dividing means for dividing the reflection light of the AF laser beam L2 to light with a specific wavelength and light with a wavelength other than the specific wavelength. That is, in the reflection light of the AF laser beam L2, the light with a first wavelength region corresponding to the wavelength of the AF laser beam L2a emitted from the first light source 202 is transmitted by the dichroic mirror 404, goes through the image forming lens 407 and is received by the first detector 411. On the other hand, light with a second wavelength region corresponding to the wavelength of the AF laser beam L2b emitted from the second light source 204 is reflected by the dichroic mirror 404, goes through the image forming lens 409 and is received by the second detector 413.

The first detector 411 and the second detector 413 are made of a bisected photodiode having bisected light receiving elements (photoelectric conversion elements) and receive converged light images of the light in division with the respective wavelength regions and output output signals (electric signals) according to respective light amounts to the AF signal processing unit 500.

The first detector 411 and the second detector 413 are arranged at positions, taking into consideration of color aberration with respect to the respective wavelength regions and are adjusted so as to indicate the same focusing position.

The AF signal processing unit 500 generates an AF signal (autofocus signal) as a displacement signal (detection signal) indicating displacement (defocus distance) in the Z-direction from the reference position of the laser beam irradiation surface of the wafer W on the basis of the output signal output from each light receiving element of at least one of the detectors of the first detector 411 and the second detector 413 and outputs the generated AF signal to the control unit 50. The AF signal processing unit 500 is an example of the displacement signal generating means.

Figure 4:
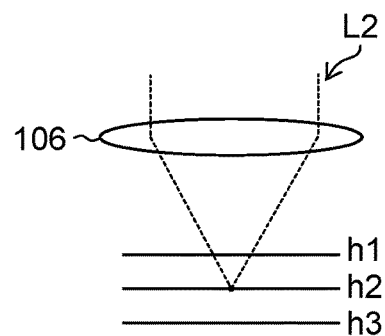
FIG. 4 is a view illustrating a positional relationship between a light converging point of an AF laser beam and a surface of a wafer.

Detection of the displacement of the laser beam irradiation surface of the wafer W can be made similarly to the example described by using FIGS. 3 to 5.

First, when the laser beam irradiation surface of the wafer W is at the position of the h2 (see FIG. 4), that is, when the laser beam irradiation surface of the wafer W matches the light converging point of the AF laser beam L2, as illustrated in FIG. 3B, a sharp image (true circle) is formed at the center on the light receiving surface of the bisected photodiode 600. At this time, the light amounts received by light receiving elements 600A and 600B of the bisected photodiode 600 are equal, and it can be understood that the laser beam irradiation surface of the wafer W is at a focusing position.

On the other hand, when the laser beam irradiation surface of the wafer W is at the position of h1 (see FIG. 4), that is, when the laser beam irradiation surface of the wafer W is at a position closer to the light converging lens 106 than the light converging point of the AF laser beam L2, as illustrated in FIG. 3A, a semi-circular converged light image is formed on the light receiving surface of the bisected photodiode 600 on the light receiving element 600A side. The size (blur amount) of the converged light image is changed in accordance with a distance between the wafer W and the light converging lens 106.

Moreover, when the laser beam irradiation surface of the wafer W is at the position of h3 (see FIG. 4), that is, when the laser beam irradiation surface of the wafer W is at a position far away from the light converging lens 106 than the light converging point of the AF laser beam L2, as illustrated in FIG. 3C, a semi-circular converged light image is formed on the light receiving surface of the bisected photodiode 600 on the light receiving element 600B side. The size (blur amount) of the converged light image is changed in accordance with a distance between the wafer W and the light converging lens 106.

As described above, the light amounts received by the light receiving elements 600A and 600B of the bisected photodiode 600 are changed in accordance with displacement of the laser beam irradiation surface of the wafer W. Therefore, displacement of the laser beam irradiation surface of the wafer W can be detected by using such properties.

FIG. 5 is a graph illustrating an output characteristic of the AF signal, in which the lateral axis indicates displacement (defocus distance) in the Z-direction (wafer thickness direction) from the reference position of the laser beam irradiation surface of the wafer W, while the vertical axis indicates an output value of the AF signal. It is assumed that adjustment is made in advance such that the light converging point of the AF laser beam L2 matches the reference position (origin) of the laser beam irradiation surface of the wafer W.

As illustrated in FIG. 5, the output characteristic of the AF signal is an S-shaped curve having the reference position (origin) of the laser beam irradiation surface of the wafer W as a zero cross point. Moreover, when a position of the laser beam irradiation surface of the wafer W is within a range indicated by an arrow in the figure, that is, within a measurement range (drawing range) capable of detecting displacement of the laser beam irradiation surface of the wafer W, a relationship between the displacement of the laser beam irradiation surface of the wafer W and the output of the AF signal makes a monotonically increasing curve (or a monotonically decreasing curve) passing through the origin and indicates a substantially linear change in most of it. That is, if the output of the AF signal is zero, it can be understood that the laser beam irradiation surface of the wafer W is at the focusing position matching the light converging point of the AF laser beam L2, while if the output of the AF signal is not zero, a displacement direction and a displacement amount of the laser beam irradiation surface of the wafer W can be obtained.

The AF signal having the output characteristic as above is generated in the AF signal processing unit 500 as the wafer displacement information indicating displacement in the Z-direction from the reference position of the laser beam irradiation surface of the wafer W and is output to the control unit 50.

Here, the AF signal processing unit 500 in this embodiment generates the AF signal E by using the output signal output from one of the first detector 411 and the second detector 413 which receives light with a larger total light receiving amount.

Specifically, assuming that the output signals output from the light receiving elements 600A and 600B of the bisected photodiode 600 constituting the first detector 411 are A1 and B1, respectively, while the output signals output from the light receiving elements 600A and 600B of the bisected photodiode 600 constituting the second detector 413 are A2 and B2, respectively, when a sum (A1+B1) of the output signals in the first detector 411 is equal to or larger than the sum (A2+B2) of the output signals in the second detector 413, the AF signal E is acquired in accordance with the following formula (1):

$$E=(A1-B1)/(A1+B1) \qquad (1)$$

On the other hand, when the sum (A1+B1) of the output signals in the first detector 411 is less than the sum (A2+B2) of the output signals in the second detector 413, the AF signal E is acquired in accordance with the following formula (2):

$$E=(A2-B2)/(A2+B2) \qquad (2)$$

That is, in the AF signal processing unit 500 in this embodiment, the detector to be used for acquiring the AF signal E is switched to one of the first detector 411 and the second detector 413 which receives light with a larger total light receiving amount. As a result, since the AF signal E is generated by using always the light with wavelength whose reflectance is higher, even if the reflectance of the AF laser beam L2 emitted to the laser beam irradiation surface of the wafer W is changed in accordance with the wavelength, the height position of the laser beam irradiation surface of the wafer W can be detected accurately and stably without being affected by variation in the thin film formed on the laser beam irradiation surface of the wafer W.

The control unit 50 controls driving of the first actuator 108 so that the distance between the light converging lens 106 and the laser beam irradiation surface of the wafer W is constant on the basis of the AF signal output from the AF signal processing unit 500. As a result, the light converging lens 106 is slightly moved in the Z-direction (wafer thickness direction) so as to follow displacement of the laser beam irradiation surface of the wafer W, and the light converging point of the processing laser beam L1 comes to be located at a certain distance (depth) from the laser beam irradiation surface of the wafer W. Therefore, a modified region can be formed at a desired position inside the wafer W. The control unit 50 is an example of the control means.

In the AF device 110 configured as above, the focus optical system 403 is disposed in the optical path (detection optical path) of the detection optical system 400. Specifically, the focus optical system 403 is disposed between the half mirror 308 and the dichroic mirror 404.

The focus optical system 403 is an example of a light converging point adjustment optical system and adjusts the light converging point of the AF laser beam L2 in the Z-direction (wafer thickness direction) independently from the light converging point of the processing laser beam L1. This focus optical system 403 is formed by a plurality of lenses including a moving lens configured to be movable at least along the optical path of the detection optical system 400. In this example, the focus optical system 403 includes a fixed lens (positive lens) 414 provided immovably along the optical path of the detection optical system 400 and a moving lens (negative lens) 416 provided to be movable along the optical path of the detection optical system 400 in this order from an object side (wafer W side).

A second actuator 419 moves the moving lens 416 along the optical path of the detection optical system 400. When the moving lens 416 moves along the optical path of the detection optical system 400, the Z-direction position of the light converging point of the AF laser beam L2 is changed in accordance with a moving direction and a moving amount of the moving lens 416 in a state where the Z-direction position of the light converging point of the processing laser beam L1 is fixed. That is, a relative distance between the light converging point of the processing laser beam L1 and the light converging point of the AF laser beam L2 is changed.

The control unit 50 controls driving of the second actuator 419 so that the light converging point of the AF laser beam L2 matches the laser beam irradiation surface of the wafer W (specifically, so that the output of the AF signal becomes zero) on the basis of the AF signal output from the AF signal processing unit 500.

As in this embodiment, in the configuration in which the AF laser beam L2 is guided by the dichroic mirror 104 to the same optical path as the processing laser beam L1, when a relative distance between the light converging lens 106 and the wafer W is changed in order to change a processing depth of the modified region, the light converging point of the AF laser beam L2 also changes its Z-direction position with respect to the wafer W together with the light converging point of the processing laser beam L1.

For example, as illustrated in 6A, when the modified region is to be formed at a shallow position from the laser beam irradiation surface of the wafer W, assume that the light converging point of the AF laser beam L2 matches the laser beam irradiation surface of the wafer W. In this case, as illustrated in FIG. 6B, when the relative distance between the light converging lens 106 and the wafer W is changed in order to form the modified region at a deep position from the laser beam irradiation surface of the wafer W, the light converging point of the AF laser beam L2 is largely deviated in the Z-direction (wafer thickness direction) from the laser beam irradiation surface of the wafer W. Then, if the distance between the light converging point of the AF laser beam L2 and the laser beam irradiation surface of the wafer W exceeds a measurement range (drawing range), displacement of the laser beam irradiation surface of the wafer W cannot be detected any more. Particularly since a lens with high NA is used for the light converging lens 106, the measurement range capable of detecting the displacement of the laser beam irradiation surface of the wafer W is limited to the vicinity of the light converging point (focusing position) of the AF laser beam L2 and thus, the aforementioned problem becomes more remarkable.

In order to handle such problem, in the AF device 110 of this embodiment, the focus optical system 403 is provided on the optical path of the detection optical system 400 so that the position of the light converging point of the AF laser beam L2 can be changed without changing the position of the light converging point of the processing laser beam L1. As a result, even if the relative distance between the light converging lens 106 and the wafer W is changed in order to change the processing depth of the modified region from the state illustrated in FIG. 6A to the state illustrated in FIG. 6B, by moving the moving lens 416 of the focus optical system 403 along the optical path of the detection optical system 400 as above, the light converging point of the AF laser beam L2 can be matched with the laser beam irradiation surface of the wafer W in the state where the Z-direction position of the light converging point of the processing laser beam L1 is fixed as in the state illustrated in FIG. 6C.

Therefore, even if the processing depth of the modified region is changed, an interval between the light converging point of the processing laser beam L1 and the light converging point of the AF laser beam L2 can be adjusted. Thus, the light converging point of the AF laser beam L2 can be matched with the laser beam irradiation surface of the wafer W, and the Z-direction position (height position) of the wafer W can be accurately detected without lowering of the light amount per unit area of the reflection light of the AF laser beam L2 reflected by the laser beam irradiation surface of the wafer W.

Moreover, in this embodiment, as illustrated in FIG. 25, the 4f optical system 311 is disposed between the focus optical system 403 and the light converging lens 106. The 4f optical system 311 includes a first relay lens 313 and a second relay lens 315. The first relay lens 313 is arranged at a position where a distance between the first relay lens 313 and the light converging lens 106 is equal to a focus distance f1 of the first relay lens 313. The second relay lens 315 is arranged at a position where a distance between the second relay lens 315 and the focus optical system 403 is equal to a focus distance f2 of the second relay lens 315. The first relay lens 313 and the first relay lens 315 are arranged such that a distance between the first relay lens 313 and the second relay lens 315 is equal to a sum (f1+f2) of these focus distances.

According to such configuration, since a plane conjugated with the exit pupil of the light converging lens 106 can be arranged at a position physically away (separated) from the light converging lens 106, an optical distance between the light converging lens 106 and the focus optical system 403 can be easily set within a desired range.

Figure 26:
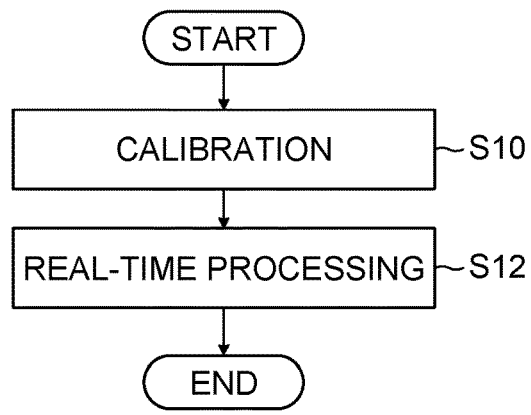
FIG. 26 is a flowchart illustrating a flow of a dicing method using the laser dicing device of the fifth embodiment.

Subsequently, a dicing method using the laser dicing device 10 of this embodiment is described. FIG. 26 is a flowchart illustrating a flow of a dicing method using the laser dicing device 10 of this embodiment.

As illustrated in FIG. 26, the laser dicing device 10 performs the calibration operation for measuring the output characteristic of the AF signal (Step S10) prior to the real-time processing operation which will be described later.

After the calibration operation is completed, the laser dicing device 10 performs the real-time processing operation for forming the modified region inside the wafer W while adjusting the Z-direction position of the light converging point of the processing laser beam L1 so as to follow displacement of the laser beam irradiation surface of the wafer W (Step S12).

Figure 27:
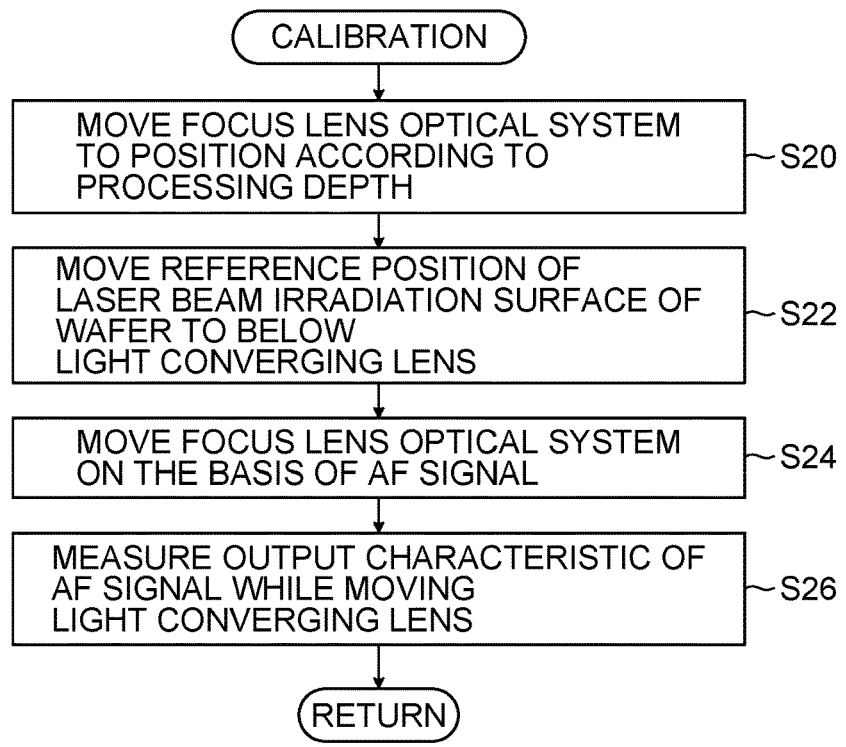
FIG. 27 is a flowchart illustrating a detailed flow of a calibration operation illustrated in FIG. 26.

FIG. 27 is a flowchart illustrating a detailed flow of the calibration operation illustrated in FIG. 26.

First, the control unit 50 controls driving of the second actuator 419 and moves the moving lens 416 of the focus optical system 403 to a position according to a processing depth of the modified region (Step S20). A correspondence relationship between the processing depth of the modified region and the position of the moving lens 416 of the focus optical system 403 is held in a memory portion (not shown) of the control unit 50.

Subsequently, the control unit 50 controls movement of the stage 12 and moves the reference position of the laser beam irradiation surface of the wafer W to immediately below the light converging lens 106 (Step S22). The reference position of the laser beam irradiation surface of the wafer W is a position to be a reference of displacement in the Z-direction of the laser beam irradiation surface of the wafer W, and at which the light converging point of the AF laser beam L2 is to be matched. Therefore, it is preferable that the reference position is located on a portion with smaller steps (smooth surface) of the laser beam irradiation surface of the wafer W. For example, a predetermined position at a center part excluding an outer peripheral part of the wafer W is set to the reference position.

Subsequently, the control unit 50 controls driving of the second actuator 419 and moves the moving lens 416 of the focus optical system 403 along the optical path of the detection optical system 400 so that the AF signal output from the AF signal processing unit 500 becomes zero (Step S24). As a result, as illustrated in FIG. 6B, even if there is deviation between the light converging point of the AF laser beam L2 and the reference position of the laser beam irradiation surface of the wafer W, as illustrated in FIG. 6C, the light converging point is adjusted so that the light converging point of the AF laser beam L2 matches the reference position of the laser beam irradiation surface of the wafer W. The control unit 50 rewrites the position of the moving lens 416 of the focus optical system 403 held in the memory portion (not shown) to a position (corrected position) of the moving lens 416 after the light converging point adjustment.

At this time, in the AF signal processing unit 500, the AF signal is generated on the basis of the output signal output from the light receiving elements 600A and 600B of the bisected photodiode 600 constituting the detector with the larger total light receiving amount in the first detector 411 and the second detector 413. Thus, the height position of the laser beam irradiation surface of the wafer W can be detected stably and accurately without being affected by variation in the thin film formed on the laser beam irradiation surface of the wafer W (variation in each of the wafer W or a place).

Subsequently, the control unit 50 controls driving of the first actuator 108, measures the output characteristic of the AF signal output from the AF signal processing unit 500 while moving the light converging lens 106 over the entire movable range along the Z-direction, and holds the output characteristic as a lookup table in the memory portion (not shown) (Step S26).

When a plurality of layers of the modified regions is to be formed inside the wafer W, the process from Step S20 to Step S26 is executed for each processing depth of the modified region.

By means of the processes described above, in the real-time processing operation at Step S12 in FIG. 26, the control unit 50 can easily acquire displacement (defocus distance) in the Z-direction from the reference position of the laser beam irradiation surface of the wafer W from the output value of the AF signal output from the AF signal processing unit 500 by referring to the lookup table held in the memory portion (not shown) and thus, processing efficiency (throughput) in the real-time processing operation can be improved.

Figure 28:
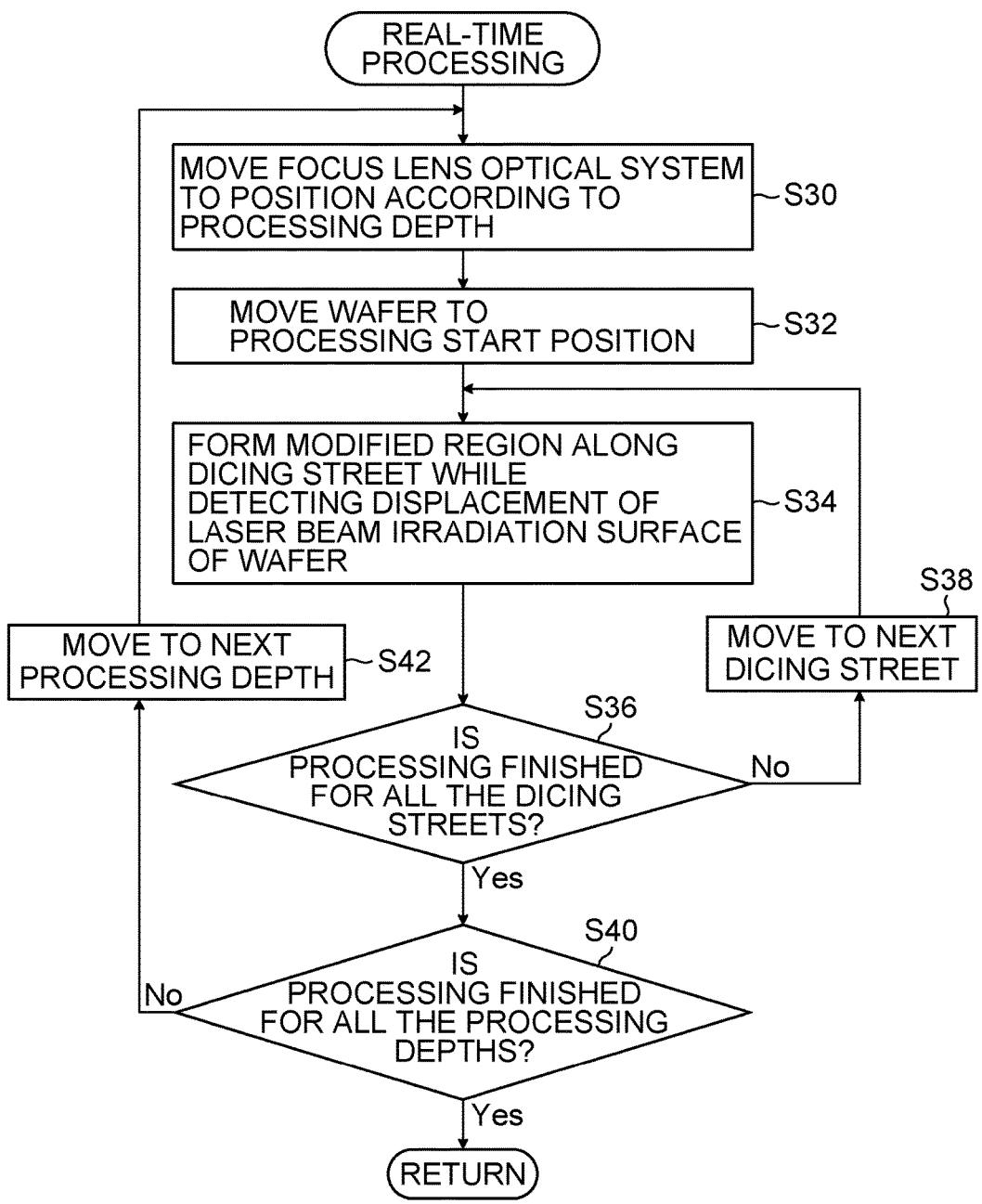
FIG. 28 is a flowchart illustrating a detailed flow of a real-time processing operation illustrated in FIG. 26.

FIG. 28 is a flowchart illustrating a detailed flow of the real-time processing operation illustrated in FIG. 26.

First, the control unit 50 controls driving of the second actuator 419 similarly to Step S20 in FIG. 27 and moves the moving lens 416 of the focus optical system 403 to a position according to the processing depth of the modified region (Step S30). At this time, the control unit 50 moves it to the position (corrected position) of the moving lens 416 held in the memory portion (not shown). As a result, the light converging point of the AF laser beam L2 matches the reference position of the laser beam irradiation surface of the wafer W, and the AF device 110 can detect displacement in the Z-direction based on the reference position of the laser beam irradiation surface of the wafer W.

Subsequently, the control unit 50 controls movement of the stage 12 and moves the wafer W which is suctioned and held on the stage 12 to a predetermined processing start position (Step S32).

Subsequently, the control unit 50 turns ON the processing laser light source 100 and then, forms modified regions inside the wafer W along the dicing street by the processing laser beam L1 emitted from the processing laser light source 100 while moving the wafer W in the horizontal direction (XY direction) (Step S34).

At this time, the control unit 50 turns ON the first light source 202 and the second light source 204 substantially at the same time or at timing prior to that when the processing laser light source 100 is turned ON. As a result, the processing laser beam L1 and the AF laser beam L2 (synthesized beam of the two AF laser beams L2a and L2b with wavelengths different from each other) are converged by the light converging lens 106 toward the wafer W. Then, the reflection light of the AF laser beam L2 emitted to and reflected by the laser beam irradiation surface of the wafer W is divided by the dichroic mirror 404 into lights with wavelengths different from each other, and the divided lights are respectively received by the first detector 411 and the second detector 413. The AF signal processing unit 500 generates the AF signal indicating displacement in the Z-direction from the reference position of the laser beam irradiation surface of the wafer W on the basis of the output signal output from the detector with the larger total light receiving amount between the first detector 411 and the second detector 413, and outputs the generated AF signal to the control unit 50.

Then, the control unit 50 forms the modified region inside the wafer W while adjusting the Z-direction position of the light converging point of the processing laser beam L1 by controlling driving of the first actuator 108 on the basis of the AF signal output from the AF signal processing unit 500.

Subsequently, the control unit 50 determines whether formation of the modified regions has been finished for all the dicing streets of the wafer W (Step S36). When formation of the modified regions for all the dicing streets has not been finished (in the case of No), it moves to the next dicing street (Step S38) and repeats processes from Step S34 to Step S36 for the dicing street. On the other hand, when formation of the modified regions for all the dicing streets has been finished (in the case of Yes), the next Step S40 is performed.

Subsequently, the control unit 50 determines whether formation of the modified regions has been finished for all the processing depths (Step S40). When formation of the modified regions has not been finished for all the processing depths, the processing is moved to the next processing depth (Step S42), and the processes from Step S30 to Step S40 is repeated. On the other hand, when formation of the modified regions has been finished for all the processing depths, the real-time processing operation is finished.

As described above, by forming the modified regions at a desired position inside the wafer, the wafer W can be divided into a plurality of chips using the modified regions as starting points.

Figure 29:
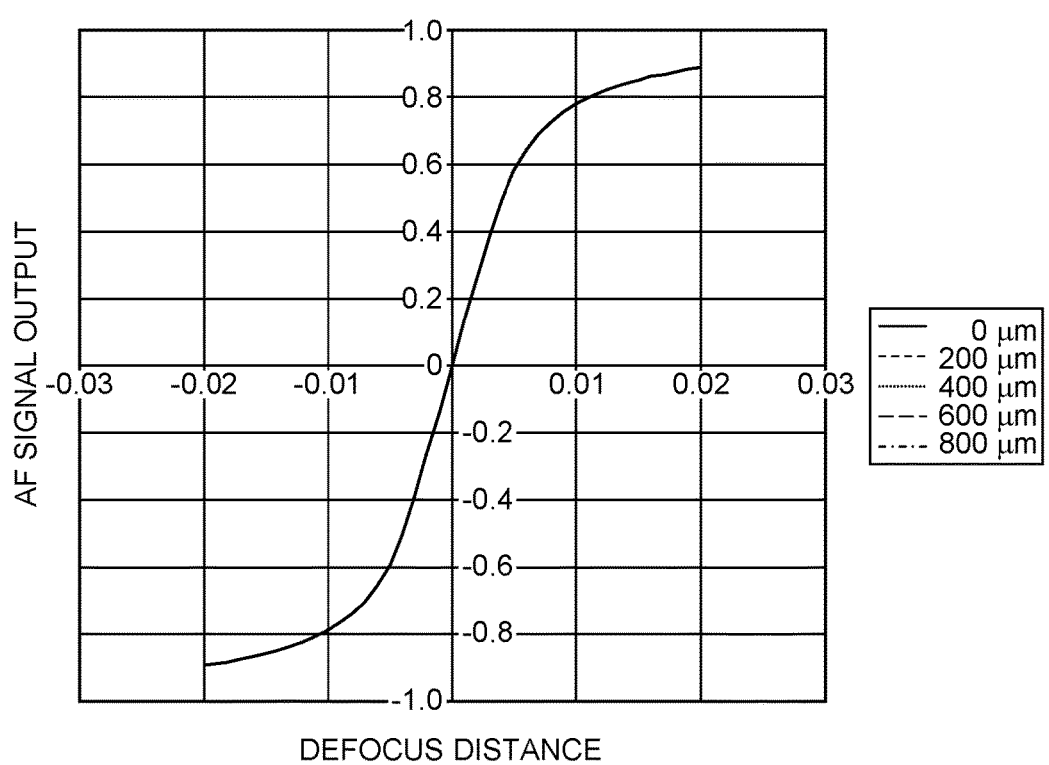
FIG. 29 is a view illustrating an example of an output characteristic of an AF signal in the fifth embodiment.

FIG. 29 is a view illustrating an example of an output characteristic of the AF signal in the fifth embodiment and illustrates the output characteristic when the processing depth of the modified region is changed within a range of 0 to 800 μm.

In this embodiment, since the Z-direction position of the light converging point of the AF laser beam L2 is adjusted so as to match the reference position of the laser beam irradiation surface of the wafer W in accordance with the processing depth of the modified region, the output characteristics of the AF signals corresponding to respective processing depths are substantially uniform and show S-shaped curves with the reference position (origin) of the laser beam irradiation surface of the wafer W as a zero cross point, as illustrated in FIG. 29. Therefore, by performing the real-time processing operation by using the AF signal having such output characteristics, displacement of the laser beam irradiation surface of the wafer W can be detected stably and with accuracy without being affected by a change in the processing depth of the modified region.

As described above, in this embodiment, since the height position of the laser beam irradiation surface of the wafer W is detected by using the two AF laser beams L2a and L2b with wavelengths different from each other, the height position of the laser beam irradiation surface of the wafer W can be detected stably and with accuracy without being affected by variation in the thin film formed on the laser beam irradiation surface of the wafer W.

Moreover, in this embodiment, on the optical path of the detection optical system 400 for detecting the reflection light of the AF laser beam L2 reflected by the laser beam irradiation surface of the wafer W, between the half mirror 308 and the dichroic mirror 404, the focus optical system 403 is provided as a light converging point adjustment optical system for adjusting the light converging point of the AF laser beam L2 in the Z-direction (wafer thickness direction). Thus, even if the relative distance between the light converging lens 106 and the wafer W is changed with a change in the processing depth of the modified region, the light converging point of the AF laser beam L2 can be adjusted so as to match the laser beam irradiation surface of the wafer W and thus, the modified region can be formed with accuracy at a predetermined processing depth from the laser beam irradiation surface of the wafer.

Moreover, in this embodiment, it has been found as the result of keen examination by the inventor that, in order to obtain the stable autofocus characteristics (AF characteristics) regardless of the processing depth, an optical distance D0 between the exit pupil of the light converging lens 106 and the focus optical system 403, and the diameter (spot diameter) N of the converged light image of the AF laser beam L2 converged by the light converging lens 106 and emitted to the laser beam irradiation surface of the wafer W are important parameters. Specifically, by setting the optical distance D0 to less than 90 mm (that is D0<90), the stable AF characteristics can be obtained regardless of the processing depth. Moreover, by setting the spot diameter N to larger than 0.002 mm and smaller than 0.2 mm (that is, 0.002<N<0.2), the AF sensitivity can be made high, and the drawing range can be made wide. Therefore, the height position of the laser beam irradiation surface of the wafer W can be detected rapidly, accurately, and stably regardless of the processing depth of the modified region. As a result, even if there is variation in the laser beam irradiation surface of the wafer W, the modified region can be formed with accuracy at a predetermined processing depth from the laser beam irradiation surface of the wafer W.

In this embodiment, the output signal output from one of the first detector 411 and the second detector 413 which receives light with the larger total light receiving amount between is used. However, the embodiment should not be limited to this case. The AF signal may be obtained by performing weighted addition of the light amounts respectively received by the first detector 411 and the second detector 413, in accordance with a standard determined in advance. For example, assuming that the light amount received by the first detector 411 is S1 and the light amount received by the second detector 413 is S2, results obtained by multiplying weighting factors α and β (where α, β>0) with S1 and S2, respectively, are adding the result of the multiplication may be used as the AF signal. Moreover, the results obtained by respectively squaring S1 and S2 and adding the squares (second powers) may be used as the AF signal. Or other weighting methods may be used.

Moreover, in this embodiment, since the two AF laser beams L2a and L2b with wavelengths different from each other are used, the first detector 411 and the second detector 413 are arranged at positions by taking into consideration of color aberration with respect to the respective wavelength regions. However, the embodiment should not be limited to this. The focus optical system 403 may include a bonded lens as color aberration correcting means, for example. In this case, since the focus optical system 403 functions as the color aberration correcting means, position adjustment of the first detector 411 and the second detector 413 is not needed any more, and device configuration of the AF device 110 can be simplified.

Figure 30:
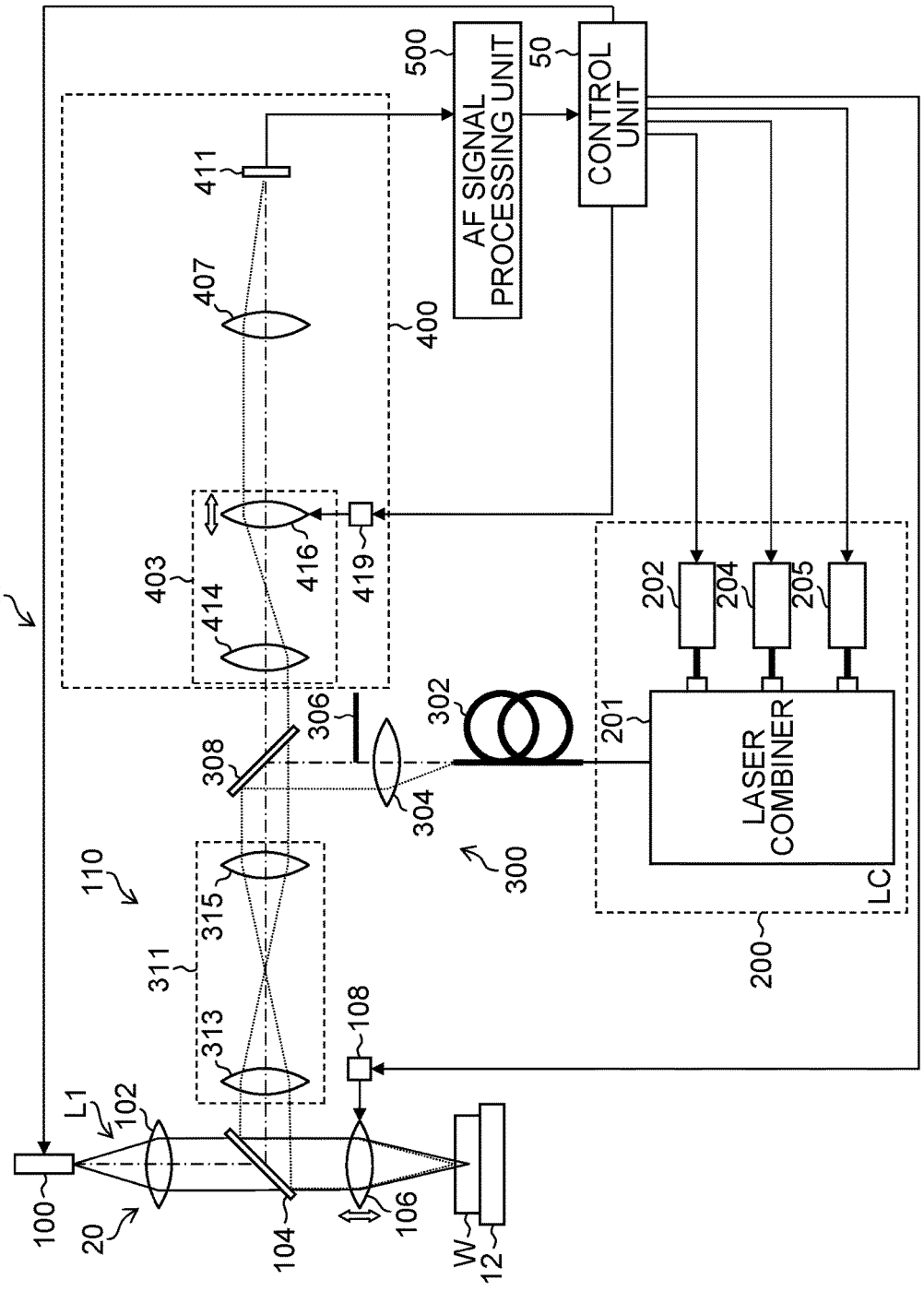
FIG. 30 is a block diagram illustrating an example employing the AF laser beams with three wavelengths in the laser dicing device according to the fifth embodiment.

FIG. 30 is a block diagram illustrating an example in a case where an AF laser beam with three wavelengths is employed in the fifth embodiment. In the example illustrated in FIG. 30, the light source unit 200 combines pigtail type LDs (Laser Diode 202, 204, 205) which emit laser beams with three different types of wavelengths to one fiber through the laser combiner 201. Then, the laser beams output from the LD 202, 204, and 205 are output through the laser combiner 201 so that it is possible to select a wavelength of the laser beam to be output or to output mixture of the laser beams. As a result, in the detection optical system 400, the dichroic mirror 404, the image forming lens 409, and the second detector 413 are not needed any longer.

Moreover, in this embodiment, the case where the height position of the laser beam irradiation surface of the wafer W using the two AF laser beams L2a and L2b with wavelengths different from each other is described. However, the embodiment should not be limited to this. Three or more AF laser beams with wavelengths different from each other may be used.

Moreover, in this embodiment, the example in which the first detector 411 and the second detector 413 are constituted by the bisected photodiode is illustrated. However, the embodiment should not be limited to this. Those capable of measuring a light amount balance (a quadrisected photodiode, a two-dimensional imaging element and the like) may be used.

Moreover, in this embodiment, the optical fiber 302 is used, but if there is no problem in layout of devices or units, a light source image may be directly formed at a front-side focusing position of the collimate lens 304, and the optical fiber 302 may be omitted.

Sixth Embodiment

Subsequently, a sixth embodiment of the present invention is described. Hereinafter, description is omitted for portions in common with the fifth embodiment, and mainly feature portions of this embodiment are described.

Figure 31:
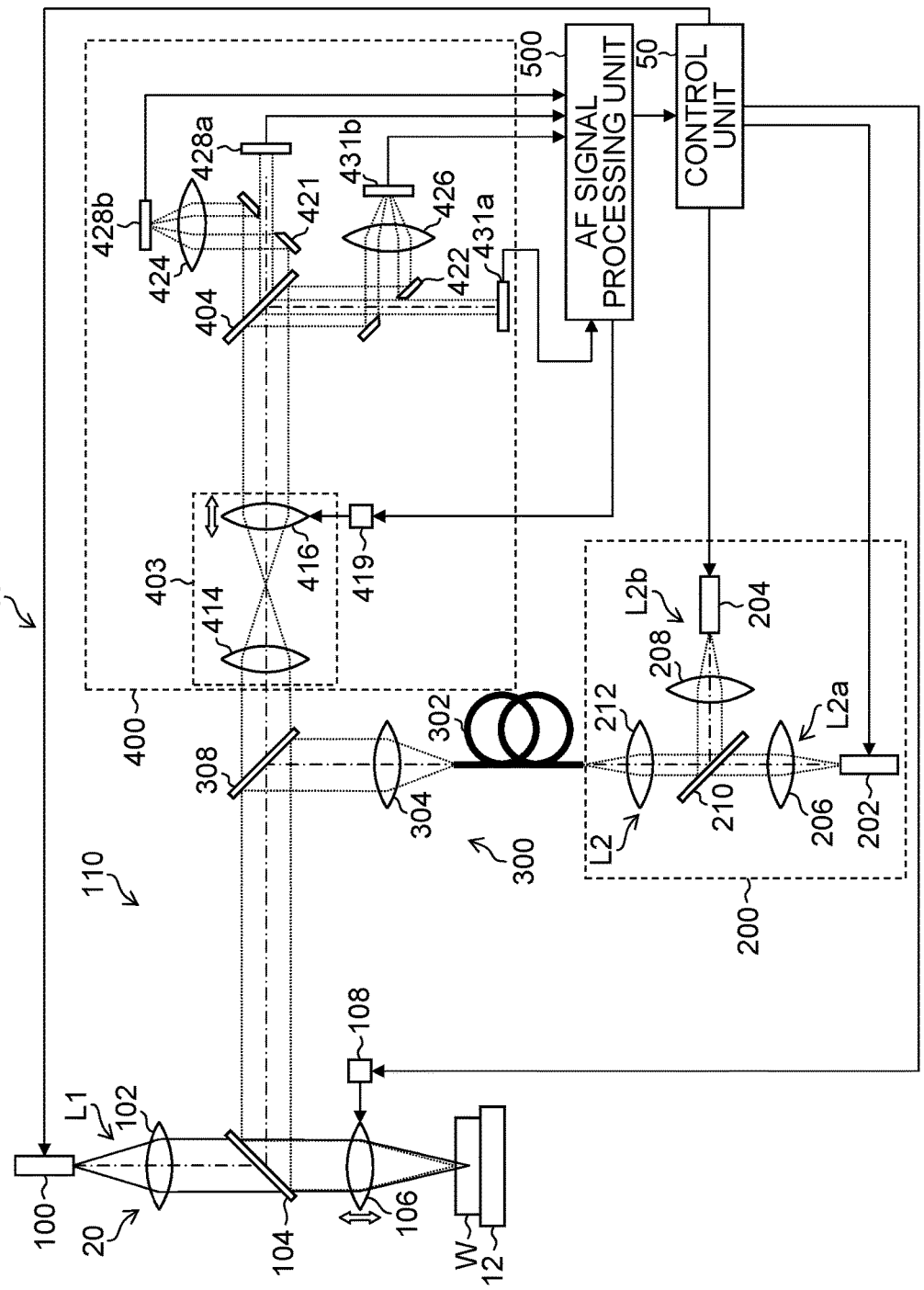
FIG. 31 is a block diagram illustrating an outline of a laser dicing device according to a sixth embodiment.

FIG. 31 is a block diagram illustrating an outline of a laser dicing device according to the sixth embodiment. In FIG. 31, constituent elements in common or similar to those in FIG. 25 are given the same reference numerals, and description thereof is omitted.

The sixth embodiment uses the central intensity method as a method for detecting the height position of the laser beam irradiation surface of the wafer W. The central intensity method is a method in which a part of the reflection light is received by either one of the two detectors, while the whole of or a part of the reflection light is received by the other detector, and the height position of the laser beam irradiation surface of the wafer W is detected by using the light receiving amounts in the respective detectors.

As illustrated in FIG. 31, the AF laser beam L2 output from the light source unit 200 of the AF device 110 goes through the optical fiber 302, is collimated by the collimate lens 304 and is reflected by the half mirror 308 without having a part of the AF laser beam L2 shielded. Moreover, the AF laser beam L2 is reflected by the dichroic mirror 104, is converged by the light converging lens 106, and is emitted to the wafer W. The reflection light of the AF laser beam L2 reflected by the laser beam irradiation surface of the wafer W travels in the same optical path as the AF laser beam L2 in the opposite direction, is transmitted by the half mirror 308 arranged on the optical path, and is guided to the detection optical system 400 provided in the optical path branching from the optical path of the irradiation optical system 300.

The detection optical system 400 includes the focus optical system 403, the dichroic mirror 404, the holed mirrors 421 and 422, image forming lenses 424 and 426, first detectors 428a and 428b, second detectors 431a and 431b and the like.

The dichroic mirror 404 divides the reflection light of the AF laser beam L2 guided to the detection optical system 400 and incident through the focus optical system 403 into light with a specific wavelength and light with a wavelength other than the specific wavelength, similarly to the first embodiment. That is, in the reflection light of the AF laser beam L2, the light with the first wavelength region corresponding to the wavelength of the AF laser beam L2a emitted from the first light source 202 is transmitted by the dichroic mirror 404. Then, a part of the light passes through the opening portion formed at the center part of the holed mirror 421 and is received by the first detector 428a, while the remaining light is reflected by the reflection surface of the peripheral part of the holed mirror 421, is converged by the image forming lens 426 and is received by the first detector 428b. On the other hand, the light with the second wavelength region corresponding to the wavelength of the AF laser beam L2b emitted from the second light source 204 is reflected by the dichroic mirror 404. Then, a part of the light passes through the opening portion formed at the center part of the holed mirror 422 and is received by the second detector 431a, while the remaining light is reflected by the reflection surface of the peripheral part of the holed mirror 422, is converged by the image forming lens 426 and is received by the second detector 431b.

The first detectors 428a and 428b and the second detectors 431a and 431b output output signals according to received light amounts to the AF signal processing unit 500.

The AF signal processing unit 500 generates the AF signal indicating displacement (defocus distance) in the Z-direction from the reference position of the laser beam irradiation surface of the wafer W on the basis of the output signal output from at least either one of the first detectors 428a and 428b and the second detectors 431a and 431b, and outputs the AF signal to the control unit 50.

Here, the detection principle of the displacement of the laser beam irradiation surface of the wafer W is described. Since the detection principle using the first detectors 428a and 428b and the detection principle using the second detectors 431a and 431b are similar, the detection principle using the first detectors 428a and 428b representing them is described.

In the reflection light having been transmitted by the dichroic mirror 404, a part of the light passes through the opening portion of the holed mirror 421 and is received by the first detector 428a, while the remaining light is reflected by the reflection surface of the peripheral part of the holed mirror 421, is converged by the image forming lens 424, and is received by the first detector 428b. Thus, a sum of the light amounts (total light receiving amount) of the reflection light received by the first detectors 428a and 428b is constant at all times regardless of the height position of the laser beam irradiation surface of the wafer W, and the sum of outputs of the first detectors 428a and 428b becomes constant. On the other hand, the reflection light received by the first detector 428a has a light receiving region which is limited to the center part by the opening portion of the holed mirror 421 and thus, the light receiving amount is changed by the distance from the light converging lens 106 to the laser beam irradiation surface of the wafer W, that is, by the height position (Z-direction position) of the laser beam irradiation surface of the wafer W. Thus, the output of the first detector 428a is changed by the height position of the laser beam irradiation surface of the wafer W irradiated with the AF laser beam L2. Therefore, displacement of the laser beam irradiation surface of the wafer W can be detected by using such properties.

In the AF signal processing unit 500, assuming that the output signals output from the first detectors 428a and 428b are Pa and Pb, respectively, and the output signals output from the second detectors 431a and 431b are Qa and Qb, respectively, if the sum (Pa+Pb) of the output signals in the first detectors 428a and 428b is equal to or larger than the sum (Qa+Qb) of the output signals in the second detectors 431a and 431b, the AF signal E is acquired in accordance with the following formula (5):

$$E=(Pa+Pb)/Pa \qquad (5)$$

On the other hand, if the sum (Pa+Pb) of the output signals in the first detectors 428a and 428b is less than the sum (Qa+Qb) of the output signals in the second detectors 431a and 431b, the AF signal E is acquired in accordance with the following formula (6):

$$E=(Qa+Qb)/Qa \qquad (6)$$

That is, the AF signal processing unit 500 uses a detector for acquiring the AF signal E by switching to the detector with the larger total light receiving amount in the first detectors 428a and 428b and the second detectors 431a and 431b. As a result, since the AF signal E is generated by using the light with the wavelength with high reflectance at all times, even if the reflectance of the AF laser beam L2 emitted to the laser beam irradiation surface of the wafer W is changed by the wavelength, it is possible to detect the height position of the laser beam irradiation surface of the wafer W accurately and stably without being affected by the variation in the thin film formed on the laser beam irradiation surface of the wafer W.

According to the configuration described above, since the control unit 50 can control driving of the first actuator 108 and the second actuator 419 similarly to the aforementioned first embodiment on the basis of the AF signal output from the AF signal processing unit 500, the light converging point of the processing laser beam L1 can be controlled with high accuracy so as to follow displacement of the laser beam irradiation surface of the wafer W without being affected by the change in the processing depth of the modified region, and the modified region can be formed with high accuracy at a desired position inside the wafer W.

Figure 32:
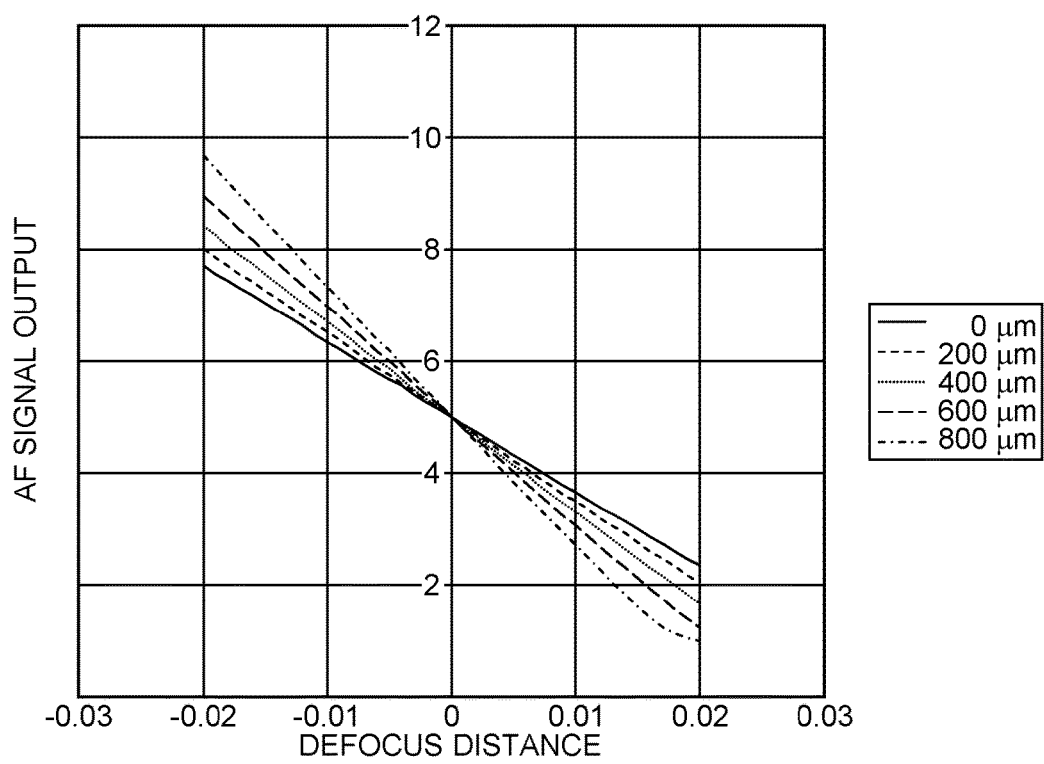
FIG. 32 is a view illustrating an output characteristic of an AF signal in the sixth embodiment.

FIG. 32 is a view illustrating the output characteristics of the AF signal in the sixth embodiment. As illustrated in FIG. 32, in the sixth embodiment, similarly to the fifth embodiment, the output characteristics of the AF signals corresponding to respective processing depths are substantially uniform, and they show substantially linear characteristics indicating constant output values at the reference position (origin) of the laser beam irradiation surface of the wafer W. Therefore, by performing the real-time processing operation by using the AF signal having such output characteristics, displacement of the laser beam irradiation surface of the wafer W can be detected stably and with high accuracy without being affected by a change in the processing depth of the modified region.

As described above, in the sixth embodiment, too, the effect similar to that of the fifth embodiment is obtained. Moreover, in the sixth embodiment, it is preferable that an optical distance between the light converging lens 106 and the holed mirrors 421 and 422 (light receiving region regulating means) is 20 mm or more and 160 mm or less and the optical distance between the light converging lens 106 and the fixed lens 414 of the focus optical system 403 is 120 mm or less. By setting these optical distances within the aforementioned range, it is possible to obtain high AF sensitivity, a wide drawing range, and stable AF characteristics regardless of the processing depth.

In the sixth embodiment, the holed mirrors 421 and 422 which are light receiving region regulating means are used, but the light receiving region regulating means should not be limited to the holed mirrors. A split mirror may be used, for example. In this case, the reflection light of the AF laser beam L2 divided for each wavelength in the dichroic mirror 404 is split into two paths by the split mirror, and each of the divided reflection lights is detected by the first detectors 428a and 428b and the second detectors 431a and 431b, respectively. As a result, the AF signal can be acquired similarly to the case where the holed mirrors 421 and 422 are used, and the height position of the laser beam irradiation surface of the wafer W can be detected.

Moreover, in the sixth embodiment, as the configuration of the detection optical system 400 for detecting the AF laser beam L2, the configuration using the first detectors 428a and 428b and the second detectors 431a and 431b is described as an example, but the configuration is not necessarily limited to such configuration. As the configuration of the detection optical system 400 for detecting the AF laser beam L2, a configuration as illustrated in FIG. 33, for example, can be also employed.

Figure 33:
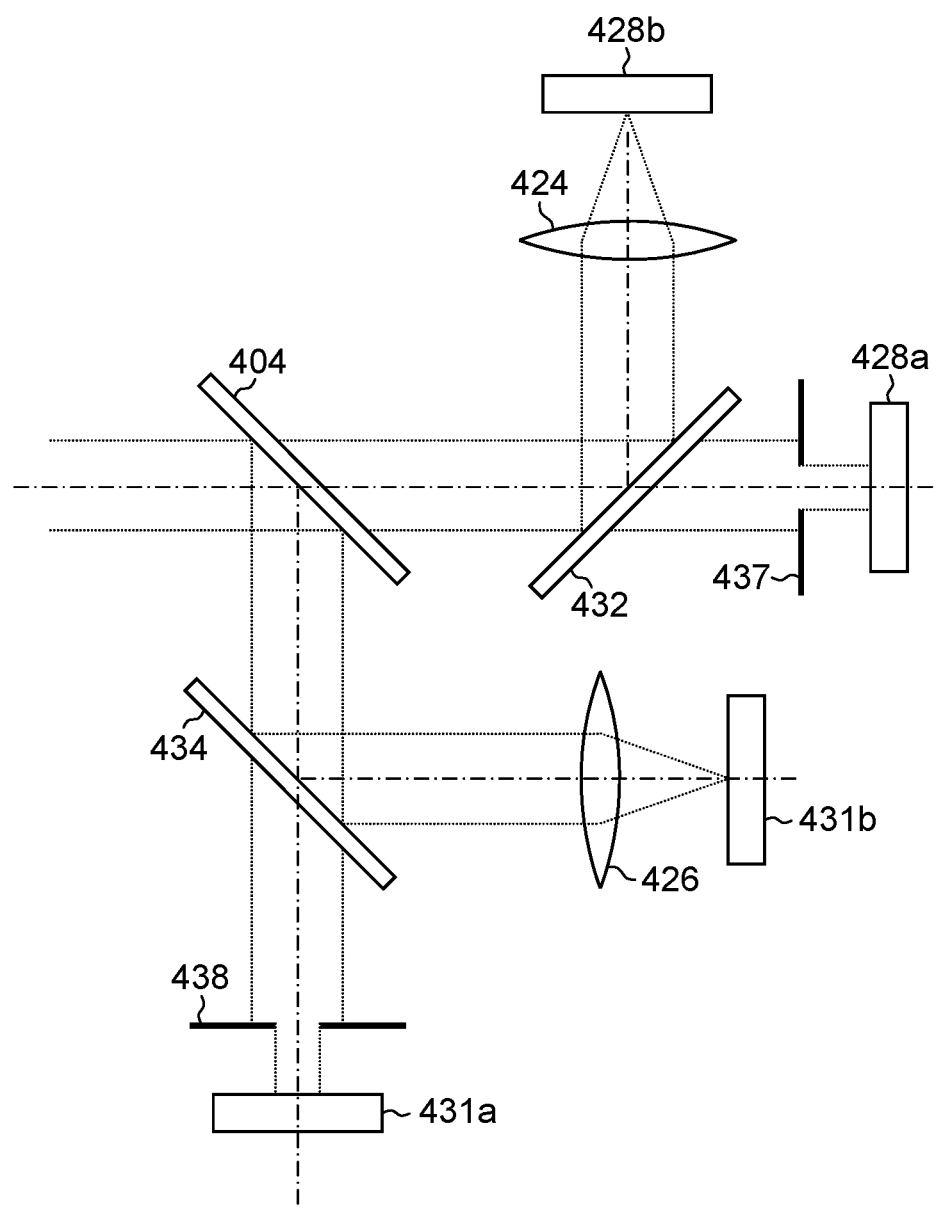
FIG. 33 is a block diagram of an essential part illustrating another configuration example of the dicing device according to the sixth embodiment.

FIG. 33 is a block diagram illustrating an essential part of another configuration example of the dicing device according to the sixth embodiment. In the configuration example illustrated in FIG. 33, half mirrors 432 and 434 and masks 437 and 438 are provided instead of the holed mirrors 421 and 422 illustrated in FIG. 31.

According to this configuration example, in the reflection light of the AF laser beam L2 guided by the dichroic mirror 404, a part of the light with the first wavelength region having been transmitted by the dichroic mirror 404 is transmitted by the half mirror 432 and is received by the first detector 428a through the mask 437 having a central opening on the optical path, while the remaining light is reflected by the half mirror 432 and is received by the first detector 428b totally (in 100%) using the image forming lens 424 in. On the other hand, a part of the light with the second wavelength region reflected by the dichroic mirror 404 is transmitted by the half mirror 434 and is received by the second detector 431a through the mask 438 having a central opening on the optical path, while the remaining light is reflected by the half mirror 434 and is received by the second detector 431b totally (in 100%) using the image forming lens 426. Though the light amounts of the reflection lights received by the first detector 428b and the second detector 431b are constant, the light amounts of the reflection lights received by the first detector 428a and the second detector 431a are changed depending on the height position of the laser beam irradiation surface of the wafer W. The height position of the laser beam irradiation surface of the wafer W can be detected similarly to the second embodiment by using such properties.

That is, in the AF signal processing unit 500, assuming that the output signals output from the first detectors 428a and 428b are Pa and Pb, and the output signals output from the second detectors 431a and 431b are Qa and Qb, respectively, if the output signal Pb in the first detector 428b is equal to or larger than the output signal Qb in the second detector 431b, the AF signal E is acquired in accordance with the following formula (7):

$$E=Pb/Pa \quad (7)$$

On the other hand, when the output signal Pb in the first detector 428b is less than the output signal Qb in the second detector 431b, the AF signal E is acquired in accordance with the following formula (8):

$$E=Qb/Qa \quad (8)$$

According to such configuration, similarly to the aforementioned fifth embodiment, the control unit 50 can control the light converging point of the processing laser beam L1 with high accuracy so as to follow the displacement of the laser beam irradiation surface of the wafer W without being affected by the change in the processing depth of the modified region by controlling the driving of the first actuator 108 or the second actuator 419 on the basis of the AF signal output from the AF signal processing unit 500 and can form the modified region at a desired position inside the wafer W with high accuracy.

Figure 34:
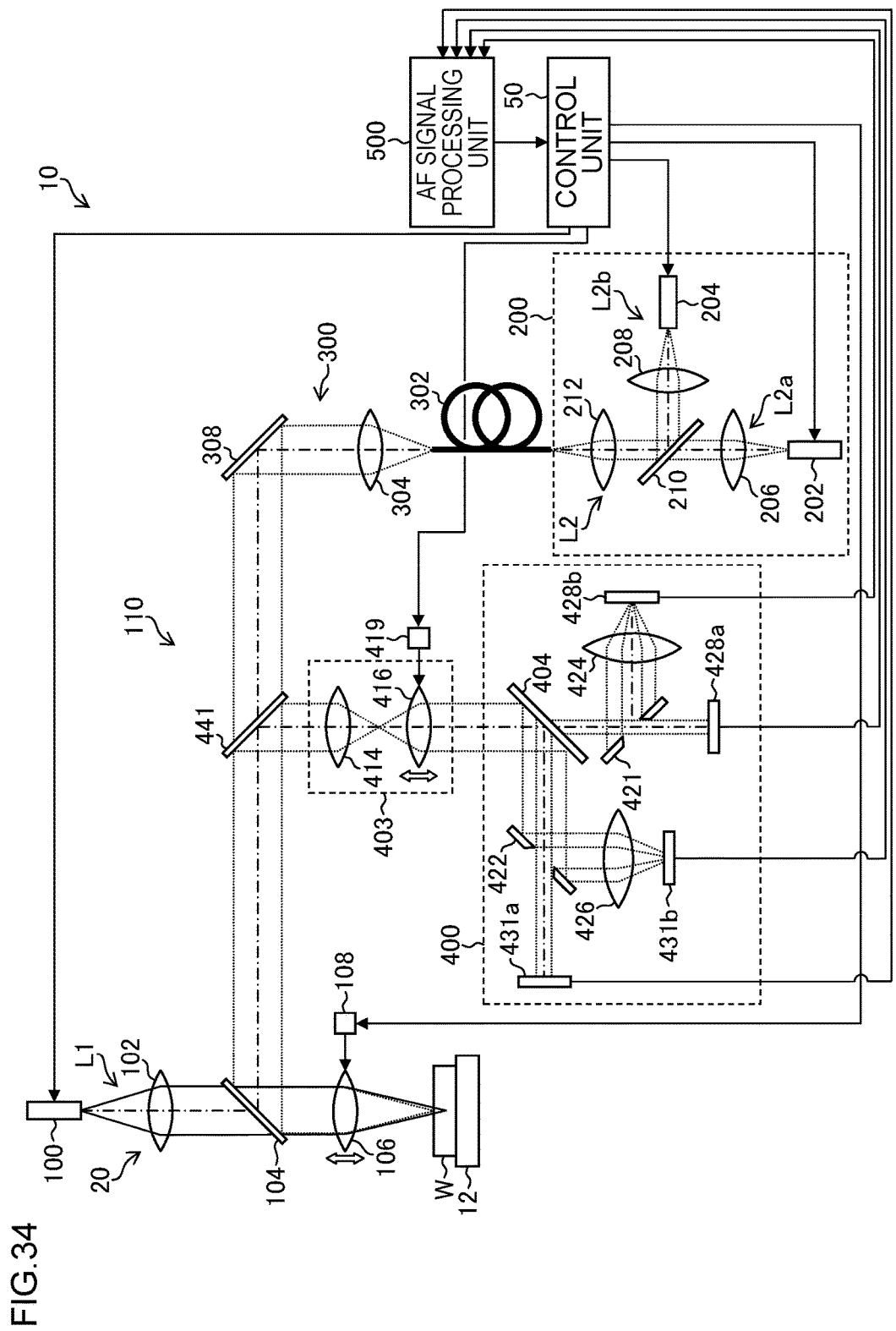
FIG. 34 is a block diagram of an essential part illustrating another configuration example of the laser dicing device according to the sixth embodiment.

Moreover, in the sixth embodiment, the configuration as illustrated in FIG. 34 can be also employed. That is, a half mirror 441 is arranged between the dichroic mirror 104 and the half mirror 308. The half mirror 441 is an example of the optical path branching means. The half mirror 441 is disposed in the optical path of the irradiation optical system 300 and branches a part of the reflection light of the AF laser beam L2 reflected by the laser beam irradiation surface of the wafer W, from the optical path of the irradiation optical system 300 to the optical path of the detection optical system 400.

The AF laser beam L2 which has been output from the light source unit 200 of the AF device 110 goes through the optical path of the irradiation optical system 300, is guided to the light converging lens 106, is converged by the light converging lens 106 and is emitted to the wafer W. The reflection light of the AF laser beam L2 reflected by the laser beam irradiation surface of the wafer W travels the same optical path as the AF laser beam L2 in the opposite direction, is reflected by the half mirror 441 arranged on the optical path and is guided to the detection optical system 400 provided on the optical path branching from the optical path of the irradiation optical system 300.

The reflection light of the AF laser beam L2 guided to the detection optical system 400 goes through the focus optical system 403 and is divided by the dichroic mirror 404 into each of the wavelengths, similarly to the sixth embodiment. That is, in the reflection light of the AF laser beam L2 led by the dichroic mirror 404, a part of the light with the first wavelength region having been transmitted by the dichroic mirror 404 passes through the opening portion formed at the center part of the holed mirror 421 and is received by the first detector 428a, while the remaining light is reflected by the reflection surface of the peripheral part of the holed mirror 421, is converged by the image forming lens 424 and is received by the first detector 428b. Similarly, a part of the light with the second wavelength region reflected by the dichroic mirror 404 passes through the opening portion formed at the center part of the holed mirror 422 and is received by the second detector 431a, while the remaining light is reflected by the reflection surface of the peripheral part of the holed mirror 422, is converged by the image forming lens 426 and is received by the second detector 431b.

In such configuration, too, since the height position of the laser beam irradiation surface of the wafer W can be detected similarly to the aforementioned sixth embodiment, the height position of the laser beam irradiation surface of the wafer W can be detected accurately without being affected by the variation in the thin film formed on the laser beam irradiation surface of the wafer W. Therefore, the modified region can be formed with accuracy at the predetermined processing depth from the laser beam irradiation surface of the wafer.

Seventh Embodiment

Subsequently, a seventh embodiment of the present invention is described. Hereinafter, description is omitted for portions in common with the fifth embodiment, and mainly feature portions of this embodiment are described.

Figure 35:
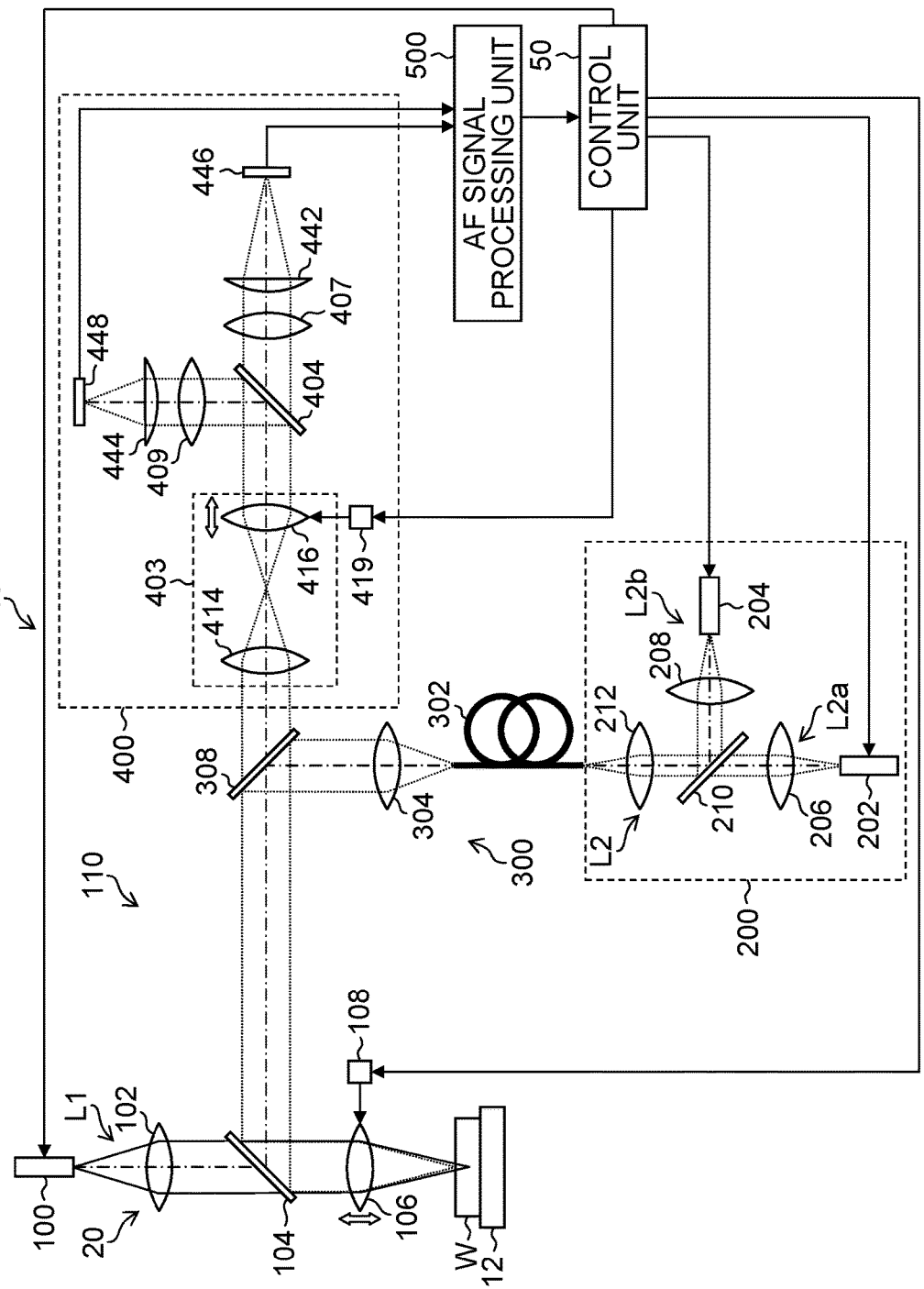
FIG. 35 is a block diagram illustrating an outline of a laser dicing device according to a seventh embodiment.

FIG. 35 is a block diagram illustrating an outline of a laser dicing device according to the seventh embodiment. In FIG. 35, constituent elements in common or similar to those in FIG. 25 are given the same reference numerals, and description thereof is omitted.

The seventh embodiment uses the astigmatism method as a method for detecting a height position of a laser beam irradiation surface of a wafer W.

As illustrated in FIG. 35, the AF laser beam L2 output from the light source unit 200 of the AF device 110 goes through the optical path of the irradiation optical system 300 having the configuration similar to that of the sixth embodiment, is guided to the light converging lens 106 and is converged by the light converging lens 106 and is emitted to the wafer W. The reflection light of the AF laser beam L2 reflected by the laser beam irradiation surface of the wafer W travels in the same optical path as the AF laser beam L2 in the opposite direction, is transmitted by the half mirror 308 arranged on the optical path, and is guided to the detection optical system 400 provided in an optical path branching from the optical path of the irradiation optical system 300.

The detection optical system 400 includes the focus optical system 403, the dichroic mirror 404, the image forming lenses 407 and 409, cylindrical lenses 442 and 444, a first detector 446, a second detector 448 and the like.

The dichroic mirror 404 divides the reflection light of the AF laser beam L2 led to the detection optical system 400 and incident through the focus optical system 403 into light with a specific wavelength and light with a wavelength other than the specific wavelength, similarly to the fifth embodiment. That is, in the reflection light of the AF laser beam L2, the light with the first wavelength region corresponding to the wavelength of the AF laser beam L2a emitted from the first light source 202 is transmitted by the dichroic mirror 404, goes through the image forming lens 407 and the cylindrical lens 442, and is received by the first detector 446. On the other hand, light with the second wavelength region corresponding to the wavelength of the AF laser beam L2b emitted from the second light source 204 is reflected by the dichroic mirror 404, goes through the image forming lens 409 and the cylindrical lens 444, and is received by the second detector 448. The cylindrical lenses 442 and 444 are the astigmatism imparting means for imparting astigmatism to the light divided by the dichroic mirror 404 for each wavelength region, respectively.

The first detector 446 and the second detector 448 are made of quadrisected photodiode having quadrisected light receiving elements, receive converged light images of light in division with the respective wavelength regions and output output signals according to the respective light amounts to the AF signal processing unit 500.

Since the detection principle of displacement of the laser beam irradiation surface of the wafer W by the astigmatism method is well known (see Japanese Patent Application Laid-Open No. 2009-152288, for example), detailed description is omitted here, but briefly explaining, the converged light image of the reflection light of the AF laser beam L2 formed on the light receiving surface of the quadrisected photodiode constituting the detector (corresponding to the first detector 446 and the second detector 448) becomes a true circle when the laser beam irradiation surface of the wafer W matches the light converging point of the AF laser beam L2. On the other hand, if the laser beam irradiation surface of the wafer W deviates from the light converging point of the AF laser beam L2, the converged light image becomes an oval extended in the vertical direction or in the lateral direction in accordance with the displacement direction of the laser beam irradiation surface of the wafer W, and the size of the converged light image depends on the displacement amount of the laser beam irradiation surface of the wafer W. Therefore, the displacement of the laser beam irradiation surface of the wafer W can be detected by using such properties.

Similarly to the example illustrated in FIG. 18, the quadrisected photodiode 602 has four light receiving elements (photoelectric conversion elements) 602A to 602D, and each of the light receiving elements 602A to 602D receives and divides the converged light image of the reflection light of the AF laser beam L2 and outputs output signals (electric signals) according to respective light amounts to the AF signal processing unit 500.

Assuming that the output signals output from the light receiving elements 602A to 602D of the quadrisected photodiode 602 constituting the first detector 446 are A1 to D1, respectively, and the output signals output from the light receiving elements 602A to 602D of the quadrisected photodiode 602 constituting the second detector 448 are A2 to D2, respectively, when a sum (A1+B1+C1+D1) of the output signals in the first detector 446 is equal to or larger than a sum (A2+B2+C2+D2) of the output signals in the second detector 448, the AF signal processing unit 500 acquires the AF signal E in accordance with the following formula (3):

$$E=\{(A1+C1)-(B1+D1)\}/\{(A1+C1)+(B1+D1)\} \quad (3)$$

On the other hand, when the sum (A1+B1+C1+D1) of the output signals in the first detector 446 is less than the sum (A2+B2+C2+D2) of the output signals in the second detector 448, the AF signal E is acquired in accordance with the following formula (4):

$$E=\{(A2+C2)-(B2+D2)\}/\{(A2+C2)+(B2+D2)\} \quad (4)$$

According to such configuration, since the control unit 50 can control driving of the first actuator 108 or the second actuator 419 on the basis of the AF signal output from the AF signal processing unit 500, similarly to the fifth embodiment described above, the light converging point of the processing laser beam L1 can be controlled with high accuracy so as to follow displacement of the laser beam irradiation surface of the wafer W without being affected by a change in the processing depth of the modified region, and the modified region can be formed with high accuracy at a desired position inside the wafer W.

The first detector 446 and the second detector 448 are not limited to the quadrisected photodiodes. The first detector 446 and the second detector 448 only need to be those capable of measuring a light amount balance. A two-dimensional imaging element or the like may be used as the first detector 446 and the second detector 448, for example.

Figure 36:
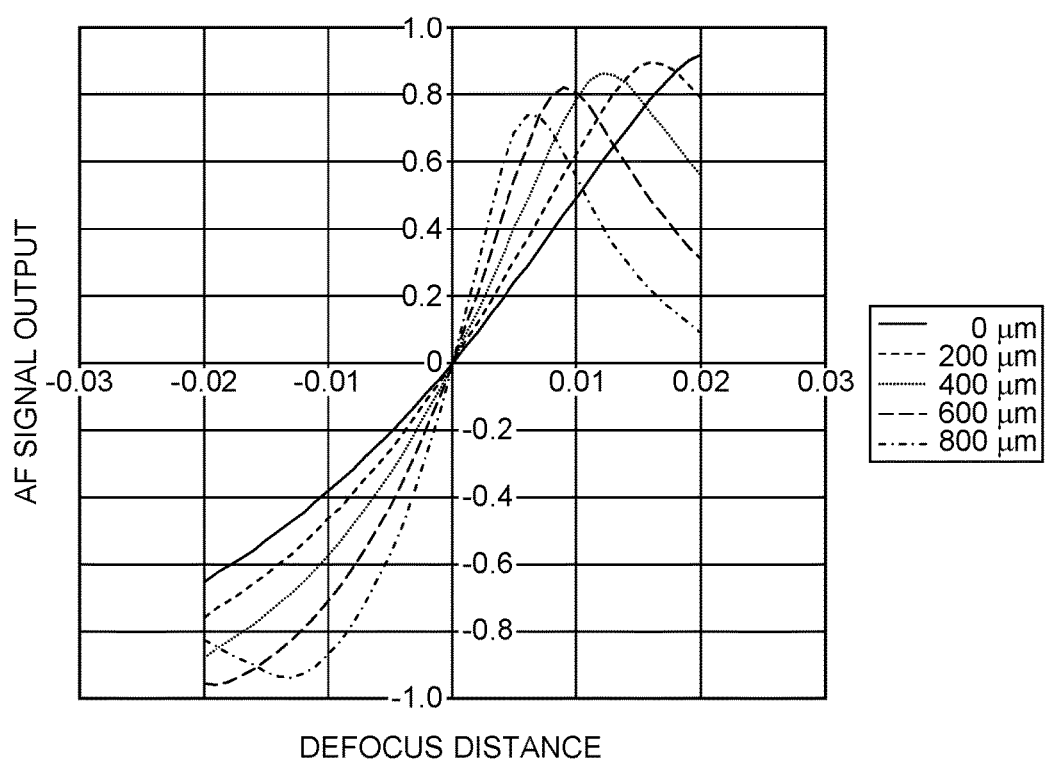
FIG. 36 is a view illustrating an output characteristic of an AF signal in the seventh embodiment.

FIG. 36 is a view illustrating the output characteristics of the AF signal in the seventh embodiment. As illustrated in FIG. 36, variation for each processing depth is larger in the seventh embodiment as compared with the output characteristics of the AF signal in the fifth embodiment (see FIG. 29), but the variation as a whole is smaller. Moreover, the focus drawing range is relatively wide, inclination (inclination of the substantially linear portion showing a proportional relationship centered on the focusing position) of the curve of the output characteristic of the AF signal is also large, and focus sensitivity is high. Therefore, the height position of the laser beam irradiation surface of the wafer W can be detected stably.

As described above, in the seventh embodiment, too, the effect similar to that of the fifth embodiment is obtained. Moreover, in the seventh embodiment, an optical distance between the exit pupil of the light converging lens 106 and the fixed lens 414 of the focus optical system 403 is preferably 50 mm or less. By setting this optical distance within the aforementioned range, it is possible to obtain the stable AF characteristics with high AF sensitivity and wide drawing range regardless of the processing depth.

Eighth Embodiment

Subsequently, an eighth embodiment of the present invention is described. Hereinafter, description is omitted for portions in common with the fifth embodiment, and mainly feature portions of this embodiment are described.

Figure 37:
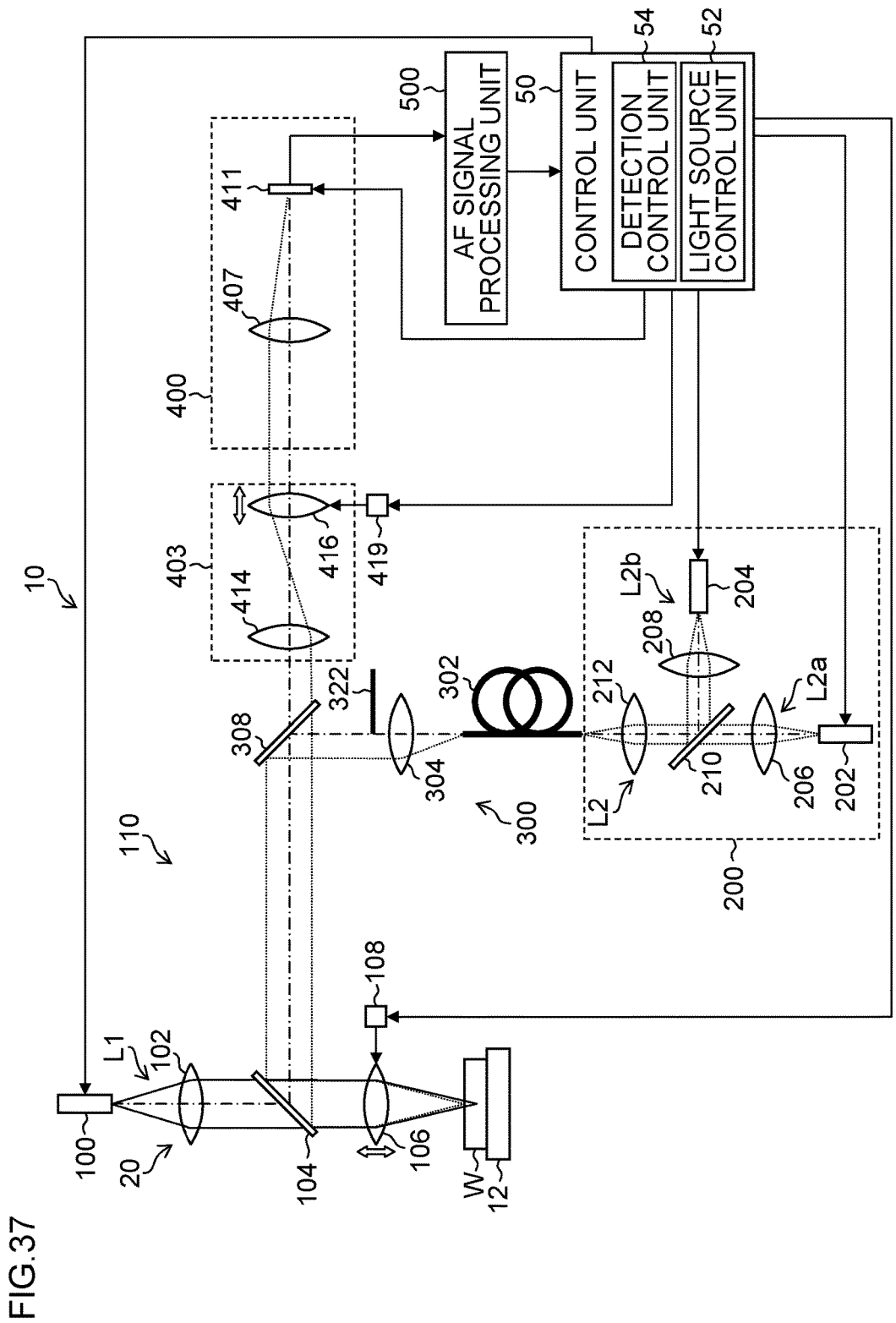
FIG. 37 is a block diagram illustrating an outline of a laser dicing device according to an eighth embodiment.

FIG. 37 is a block diagram illustrating an outline of a laser dicing device according to the eighth embodiment. In FIG. 37, constituent elements in common or similar to those in FIG. 25 are given the same reference numerals, and description thereof is omitted.

In the fifth embodiment, the AF device 110 detects the reflection lights of the two AF laser beams L2a and L2b with different wavelengths at the same time (simultaneously) by using the two detectors 411 and 413. On the other hand, in the eighth embodiment, the two AF laser beams L2a and L2b with different wavelengths are emitted alternately in terms of time (temporally) so that the reflection lights of the AF laser beams L2a and L2b reflected by the laser beam incident surface of the wafer W are detected alternately in a time-division manner for each wavelength region.

That is, the AF device 110 is configured to switch ON/OFF of the first light source 202 and the second light source 204 in the time-division manner so that the reflection lights of the AF laser beams L2a and L2b can be detected by the one detector 411 in the time-division manner for each wavelength region in synchronization with its switching timing. The light source unit 200 is an example of time-division output means. Moreover, the detector 411 is one example of time-division detecting means.

The control unit 50 includes the light source control unit 52 and the detection control unit 54. The light source control unit 52 controls switching between ON/OFF of the first light source 202 and the second light source 204. The detection control unit 54 controls the detection operation (light receiving operation) by the detector 411 in synchronization with the switching timing by the light source control unit 52.

By means of the configuration as described above, in the eighth embodiment, too, since the output signals corresponding to the light amounts of the reflection lights of the AF laser beams L2a and L2b are alternately output from the detector 411 in the time-division manner, the effect similar to that of the fifth embodiment can be obtained. Further, in the eighth embodiment, since a plurality of detectors does not have to be provided in order to detect the plurality of AF laser beams with different wavelengths, the device configuration can be simplified.

In the fourth and eighth embodiments, the case where the knife edge method is applied as a method of detecting the height position of the laser beam irradiation surface of the wafer W is described as an example, but it is not necessarily limited to such configuration. As the method of detecting the height position of the laser beam irradiation surface of the wafer W, the astigmatism method or the central intensity method can be employed as in the aforementioned second, third, sixth and seventh embodiments.

The embodiments of the present invention have been described above. However, it is needless to say that the present invention is not limited to the aforementioned examples but various improvements or variations may be made within a range not departing from the gist of the present invention.

REFERENCE SIGNS LIST

10: laser dicing device, 12: stage, 20: laser head, 50: control unit, 100: processing laser light source, 102: collimate lens, 104: dichroic mirror, 106: light converging lens, 108: first actuator, 110: AF device, 200: light source unit, 202: first light source, 204: second light source, 205: third light source, 210: dichroic mirror, 300: irradiation optical system, 302: optical fiber, 304: collimate lens, 308: half mirror, 310: focus optical system, 311: 4f optical system, 400: detection optical system, 404: dichroic mirror, 411: first detector, 413: second detector, 500: AF signal processing unit, L1: processing laser beam, L2: AF laser beam, LC: laser combiner

What is claimed is:

1. A position detecting device comprising:
   a light converging lens configured to converge a plurality of detection laser beams having wavelengths different from each other, toward a laser beam irradiation surface of a workpiece;
   a light detector configured to detect reflection lights of the plurality of detection laser beams reflected on the laser beam irradiation surface of the workpiece, for each wavelength; and
   a position detector configured to detect a position of the laser beam irradiation surface of the workpiece in an optical axis direction of the light converging lens based on the reflection lights of the plurality of the detection laser beams detected for each wavelength by the light detector.

2. The position detecting device according to claim 1, wherein
   the position detector detects a position of the laser beam irradiation surface of the workpiece based on a detection laser beam having a strongest light intensity of the plurality of detection laser beams detected for each wavelength by the light detector.

3. The position detecting device according to claim 1, wherein
   the position detector detects a position of the laser beam irradiation surface of the workpiece by performing weighted addition of light intensities of the plurality of detection laser beams detected for each wavelength by the light detector.

4. The position detecting device according to claim 1, further comprising
   a light converging point adjustor configured to move a light converging point of the plurality of detection laser beams converged by the light converging lens in the optical axis direction, without changing a distance between the light converging lens and the workpiece.

5. The position detecting device according to claim 4, wherein
   the light converging point adjustor includes a color aberration correcting unit configured to correct color aberration of the reflection lights of the plurality of detection laser beams, in each wavelength.

6. The position detecting device according to claim 1, further comprising
   a distance adjustor configured to change a distance between the light converging lens and the workpiece based on the position of the laser beam irradiation surface of the workpiece detected by the position detector.

7. The position detecting device according to claim 1, wherein the light detector includes a first detector configured for detecting light with a first wavelength region and a second detector configured for detecting light with a second wavelength region.

8. The position detecting device according to claim 1, wherein the position detector includes a microprocessor and a memory.

9. A laser processing device comprising:
   a position detecting device that includes:

a light converging lens configured to converge a plurality of detection laser beams having wavelengths different from each other, toward a laser beam irradiation surface of a workpiece;
a light detector configured to detect reflection lights of the plurality of detection laser beams reflected on the laser beam irradiation surface of the workpiece, for each wavelength; and
a position detector configured to detect a position of the laser beam irradiation surface of the workpiece in an optical axis direction of the light converging lens based on the reflection lights of the plurality of the detection laser beams detected for each wavelength by the light detector,
the laser processing device configured to converge a processing laser beam inside the workpiece through the light converging lens to form modified regions inside the workpiece.

* * * * *